United States Patent
Ikushima et al.

(10) Patent No.: US 7,550,726 B2
(45) Date of Patent: Jun. 23, 2009

(54) ELECTRONIC DEVICE AND METHOD FOR FABRICATING THE SAME

(75) Inventors: Kimiya Ikushima, Osaka (JP); Asako Baba, Tokyo (JP)

(73) Assignee: Panasonic Corporation, Kadoma (JP)

(*) Notice: Subject to any disclaimer, the term of this patent is extended or adjusted under 35 U.S.C. 154(b) by 0 days.

(21) Appl. No.: 11/872,934

(22) Filed: Oct. 16, 2007

(65) Prior Publication Data

US 2008/0179525 A1 Jul. 31, 2008

Related U.S. Application Data

(63) Continuation of application No. PCT/JP2006/311113, filed on Jun. 2, 2006.

(30) Foreign Application Priority Data

Jun. 6, 2005 (JP) ............................. 2005-165560

(51) Int. Cl.
*G01J 5/02* (2006.01)
(52) U.S. Cl. .................. 250/338.1; 374/E1.021
(58) Field of Classification Search ............. 250/338.1; 257/49; 347/E1.021
See application file for complete search history.

(56) References Cited

U.S. PATENT DOCUMENTS

| 6,211,520 | B1 * | 4/2001 | Ishikawa et al. | ......... 250/338.1 |
|---|---|---|---|---|
| 2003/0062480 | A1 | 4/2003 | Kanzaki | |
| 2005/0133721 | A1 | 6/2005 | Kim et al. | |

FOREIGN PATENT DOCUMENTS

| JP | 08-122161 | 5/1996 |
|---|---|---|
| JP | 10-122971 | 5/1998 |
| JP | 2000-295528 | 10/2000 |
| JP | 2002-148111 | 5/2002 |
| JP | 2003-106895 | 4/2003 |
| JP | 2003-106896 | 4/2003 |
| JP | 2005-181308 | 7/2005 |

OTHER PUBLICATIONS

PCT/ISA/237 for International Application No. PCT/JP2006/311113 (partial English translation provided).
International Search Report for corresponding Application No. PCT/JP2006/311113 dated Sep. 5, 2006.

* cited by examiner

*Primary Examiner*—David P Porta
*Assistant Examiner*—Mark R Gaworecki
(74) *Attorney, Agent, or Firm*—Renner, Otto, Boisselle & Sklar, LLP

(57) ABSTRACT

An electronic device according to the present invention includes: at least one heat sensing section (13), which includes a first contact portion (24) and of which a physical property varies responsive to an incoming infrared ray; a detector circuit section, which includes a second contact portion (42) and which senses the variation in the physical property of the heat sensing section (13); and a driving section (112), which is able to change a first state, in which the first and second contact portions (24, 42) are in contact with each other and electrically connected to each other, into a second state, in which the first and second contact portions (24, 42) are out of contact with each other and electrically disconnected from each other, and vice versa.

32 Claims, 52 Drawing Sheets

(a)

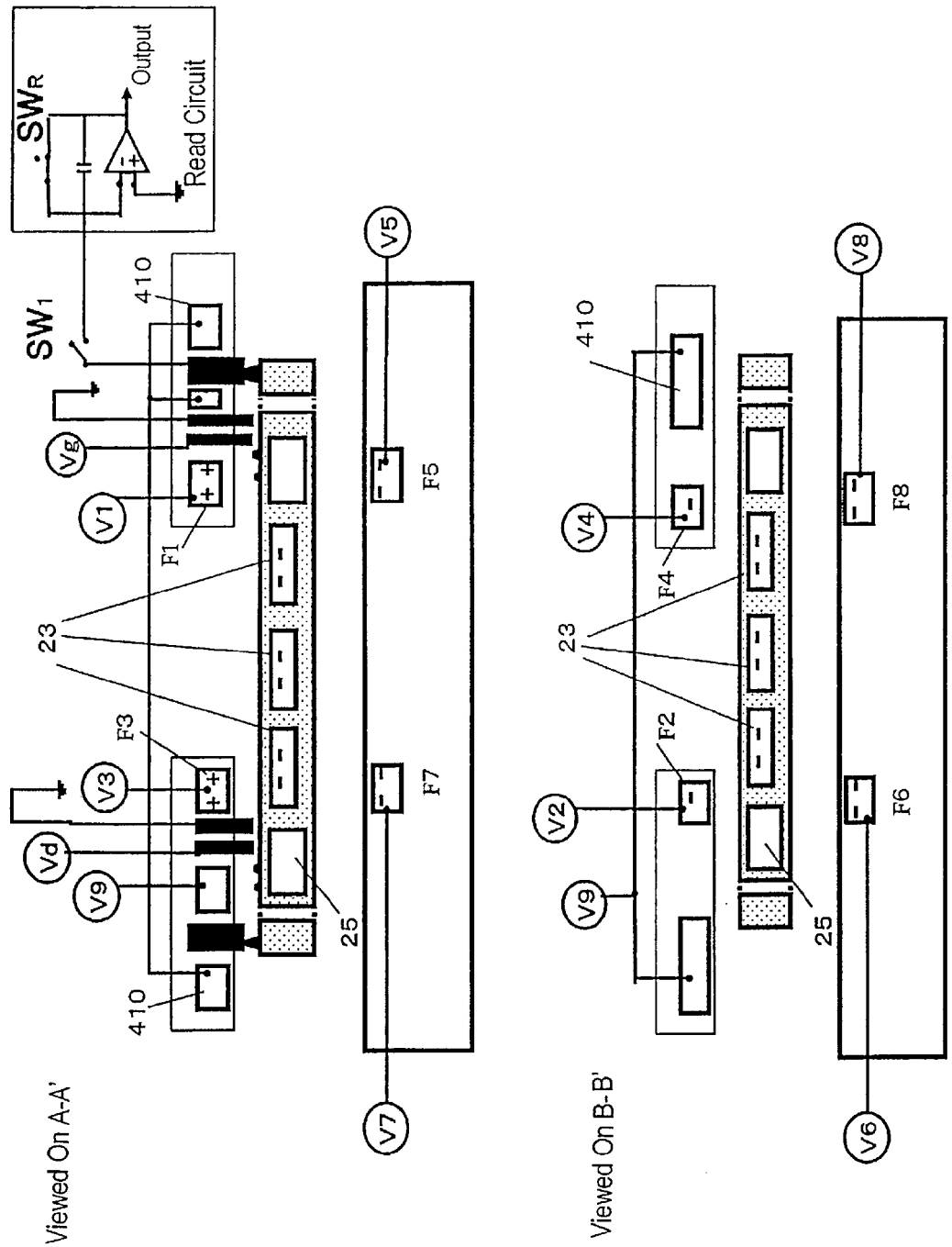

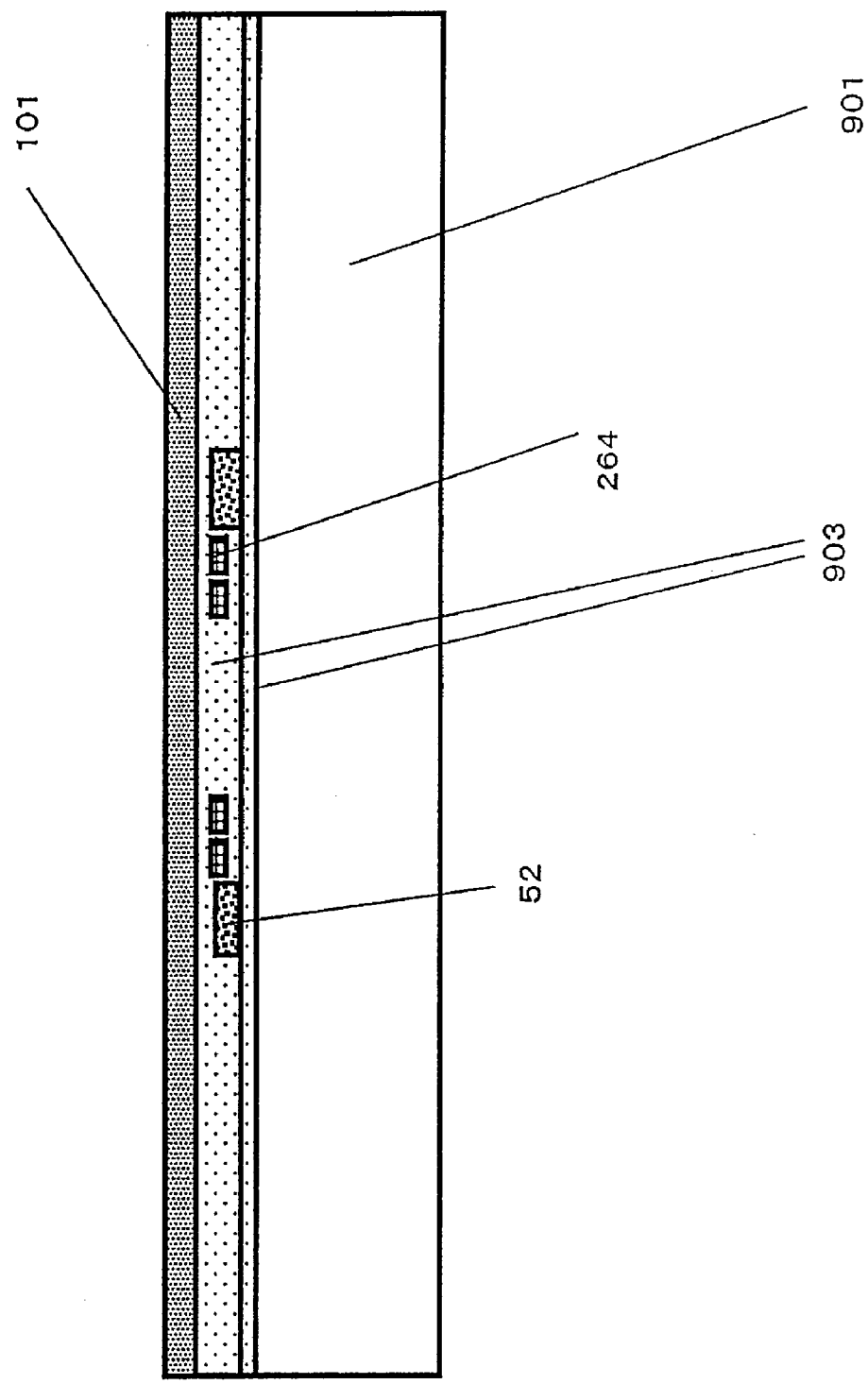

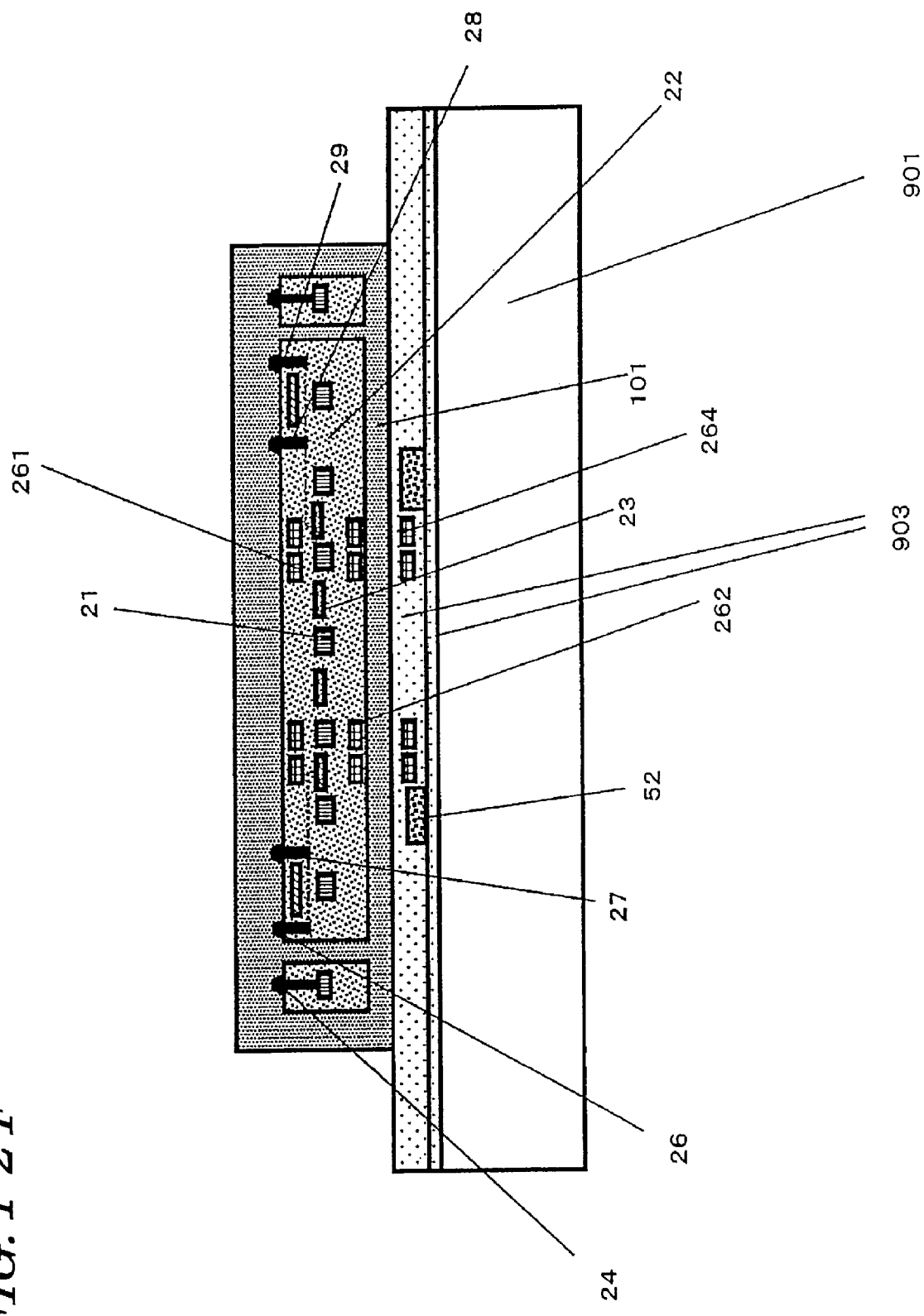

ELECTRONIC DEVICE AND METHOD FOR FABRICATING THE SAME

This is a continuation of International Application No. PCT/JP2006/311113, with an international filing date of Jun. 2, 2006, which claims priority of Japanese Patent Application No. 2005-165560, filed on Jun. 6, 2005, the contents of which are hereby incorporated by reference.

BACKGROUND OF THE INVENTION

1. Field of the Invention

The present invention relates to an electronic device and a method for fabricating an electronic device, and more particularly relates to a thermal infrared sensor and a thermal infrared image sensor.

2. Description of the Related Art

An infrared sensor for detecting an electromagnetic wave (or an infrared ray) with a wavelength of 3 μm to 10 μm has been used as a heat sensing sensor in crime prevention, measuring, remote sensing and various other fields of applications. An infrared image sensor, in which such sensors are arranged as a two-dimensional array, can obtain an even greater amount of information as a thermal image, and has been used extensively in those fields of applications.

Infrared sensors are roughly classified into quantum sensors and thermal sensors. A quantum sensor is a sensor that is made of compound semiconductors and that operates by utilizing the band-to-band transition. Such a quantum sensor has higher sensitivity and higher response speed than a thermal sensor but operates at relatively low temperatures, thus requiring a cooling mechanism. That is why it is difficult to reduce the size or manufacturing cost of such a quantum sensor and it is not easy to apply it to cars, crime prevention tools and various other consumer electronic products.

On the other hand, a thermal sensor has lower sensitivity than a quantum sensor but needs no cooling mechanism. For that reason, it is relatively easy to reduce the size and price of such a sensor, and therefore, it has been used extensively in various consumer electronic products. The thermal sensors include thermopile types, bolometer types and pyroelectric types.

A thermopile type includes a portion in which a lot of thermocouples are connected in series together as a thermal sensing portion. The thermal sensor may includes a resistor that is made of a material, of which the electrical resistance has significant temperature dependence. By detecting a variation in the amount of current flowing through that resistor, the thermal sensor can measure the temperature. Meanwhile, a pyroelectric type detects charge to be produced on the surface of a tourmaline crystal, for example, as the temperature varies, thereby sensing the temperature variation.

A thermal sensor of any of these types has a heat insulation structure to prevent the heat from escaping from its infrared sensing portion, thereby maintaining the sensitivity of the sensor reasonably high. An exemplary heat insulation structure for such an infrared sensor is disclosed in Japanese Patent Application Laid-Open Publication No. 2003-106896 (hereinafter "Patent Document No. 1"), for example.

Hereinafter, the structure of a thermal infrared sensor as disclosed in Patent Document No. 1 will be described with reference to FIG. 27, in which FIG. 27(b) is a plan view illustrating main portions of this infrared sensor and FIG. 27(a) is a cross-sectional view of the sensor as viewed on the plane 27b-27b.

The infrared sensor shown in FIG. 27 includes a substrate 240 of silicon, for example, and a photosensitive section 241 that is supported on the substrate 240. The photosensitive section 241 includes a bolometer portion 242, of which the electrical resistance has temperature dependence, and wiring 243 for measuring the electrical resistance of the bolometer portion 242. And the photosensitive section 241 functions as a heat sensing section for the infrared sensor.

On the upper surface of the substrate 240 that is opposed to the bolometer portion 242, a recess has been cut so as to leave a gap between the photosensitive section 241 and the substrate 240. Such a recess may be formed by selectively removing a predetermined region of the substrate 240 by either a wet etching process or a dry etching process.

The photosensitive section 241 contacts with the substrate 240 at contact portions 245. Both ends 244 of the wiring 243 extend over the contact portions 245 and are connected to a read circuit (not shown).

Hereinafter, it will be described how the infrared sensor shown in FIG. 27 operates.

When the photosensitive section 241 absorbs an infrared ray, the temperature at the bolometer portion 242 rises. As a result of the rise in temperature, the resistance of the bolometer portion 242 changes. In such a state, current is supplied to the bolometer portion 242 through the wiring 243 and a variation in voltage, caused by the change of resistance, is detected. And based on the magnitude of this voltage variation, the energy of the infrared ray that has been incident on the photosensitive section 241 can be calculated.

The photosensitive section 241 preferably has a structure that can prevent the thermal energy, produced upon the exposure to the infrared ray, from escaping to the outside. In the example illustrated in FIG. 27, the area of contact between the body of the photosensitive section 241 and the substrate 240 is minimized to increase the heat insulation property. Also, the portions including both ends 244 of the wiring 243 are elongated portions extending from the body of the photosensitive section 241 to reduce the conduction of the heat to the substrate 240.

As can be seen, an infrared sensor is required to further increase its temperature in response to an incoming infrared ray, and eventually exhibit higher infrared sensitivity, by improving its heat insulation property.

Meanwhile, an infrared sensor, in which electrical switches such as transistors are arranged between the photosensitive section and an infrared detector circuit, is disclosed in Japanese Patent Application Laid-Open Publication No. 2002-148111 (hereinafter "Patent Document No. 2"), for example. In the infrared sensor disclosed in Patent Document No. 2, a plurality of pixels that are arranged as a two-dimensional array (will be referred to herein as a "heat sensing section") and horizontal and vertical scanning circuits and other circuits for performing infrared image sensing by driving these pixels (which will be referred to herein as a "detector circuit section") are integrated together on the same semiconductor substrate.

In such an infrared sensor, electrical switches for sequentially selecting one of those pixels of the heat sensing section after another are arranged on the semiconductor substrate and the heat sensing section and the detector circuit section are electrically connected or disconnected to/from each other by opening and closing those electrical switches.

In the infrared sensor shown in FIG. 27, the contact portions 245 are interposed between the photosensitive section 241 and the substrate 240, and therefore, it is difficult to prevent a lot of heat from escaping from the photosensitive section 241 toward the substrate 240 by way of these contact portions 245. Nevertheless, if the contact portions 245 had an even smaller size, then the resultant rigidity would be too low to support the photosensitive section 245 and the sensor could be broken more easily.

Meanwhile, in the infrared sensor disclosed in Patent Document No. 2, the heat sensing section and the detector circuit section are electrically connected or disconnected by turning the electrical switches. However, since this switching is done electrically, the heat sensing section and the detector circuit section are always connected together in terms of heat conduction. That is to say, those electrical switches cannot interrupt the transfer of heat between the heat sensing section and the detector circuit section.

In order to overcome the problems described above, an object of the present invention is to provide an electronic device with improved heat insulation properties.

SUMMARY OF THE INVENTION

An electronic device according to the present invention includes: at least one heat sensing section, which includes a first contact portion and of which a physical property varies responsive to an incoming infrared ray; a detector circuit section, which includes a second contact portion and which senses the variation in the physical property of the heat sensing section; and a driving section, which is able to change a first state, in which the first and second contact portions are in contact with each other and electrically connected to each other, into a second state, in which the first and second contact portions are out of contact with each other and electrically disconnected from each other, and vice versa.

In one preferred embodiment, the electronic device includes: a cavity wall portion that defines a cavity housing the heat sensing section inside; and a substrate portion for supporting the cavity wall portion thereon. The driving section changes the positions of the heat sensing section inside the cavity.

In another preferred embodiment, the electronic device includes a substrate portion including at least a part of the detector circuit section. The detector circuit section includes a contact supporting member that is fixed on the substrate portion. The second contact portion is arranged on the surface of the contact supporting member. In the first state, the second contact portion on the contact supporting member is in contact with the first contact portion of the heat sensing section. In the second state, the second contact portion on the contact supporting member is out of contact with the first contact portion of the heat sensing section.

In still another preferred embodiment, the second contact portion is arranged on an inner wall of the cavity wall portion. In the first state, the second contact portion on the cavity wall portion is in contact with the first contact portion of the heat sensing section. In the second state, the second contact portion on the cavity wall portion is out of contact with the first contact portion of the heat sensing section.

In yet another preferred embodiment, the electronic device includes a substrate portion including at least a part of the detector circuit section. The second contact portion is arranged on the surface of the substrate portion. In the first state, the second contact portion on the substrate portion is in contact with the first contact portion of the heat sensing section. In the second state, the second contact portion on the substrate portion is out of contact with the first contact portion of the heat sensing section.

In yet another preferred embodiment, at least a part of the contact supporting member changes its positions between the first and second states.

In yet another preferred embodiment, at least a part of the heat sensing section changes its positions between the first and second states.

In yet another preferred embodiment, in the second state, the driving section moves the heat sensing section to a region where the heat sensing section makes no contact with any other portion of the electronic device.

In yet another preferred embodiment, in the second state, the heat sensing section is floating in the cavity.

In yet another preferred embodiment, the electronic device includes a substrate portion. The heat sensing section includes a heat sensor supporting portion. In both of the first and second states, the heat sensing section is connected to the substrate portion with the heat sensor supporting portion.

In this particular preferred embodiment, the heat sensor supporting portion has no wiring portion for electrically connecting the heat sensing section to the detector circuit section. The first contact portion includes a plurality of contacts that are arranged on the surface of the heat sensing section.

In a specific preferred embodiment, the second contact portion includes a plurality of contacts that are arranged on the surface of the substrate portion. In the first state, the contacts on the substrate portion are in contact with the contacts on the heat sensing section. In the second state, the contacts on the substrate portion are out of contact with the contacts on the heat sensing section.

In another specific preferred embodiment, the electronic device includes a contact supporting member on the substrate portion. The second contact portion includes a plurality of contacts that are arranged on the surface of the contact supporting member. In the first state, the contacts of the contact supporting member are in contact with the contacts on the heat sensing section. In the second state, the contacts of the contact supporting member are out of contact with the contacts on the heat sensing section.

In yet another preferred embodiment, the electronic device includes a cavity wall portion, which is supported on the substrate portion and which defines a cavity housing the heat sensing section inside. The second contact portion includes a plurality of contacts that are arranged on an inner wall of the cavity wall portion. In the first state, the contacts on the cavity wall portion are in contact with the contacts on the heat sensing section. In the second state, the contacts on the cavity wall portion are out of contact with the contacts on the heat sensing section.

In yet another preferred embodiment, the heat sensing section includes an infrared sensing portion, of which the electrical resistance has temperature dependence.

In this particular preferred embodiment, when electrically connected to the infrared sensing portion of the heat sensing section, the detector circuit section detects the intensity of the incoming infrared ray based on the electrical resistance of the infrared sensing portion.

In yet another preferred embodiment, the heat sensing section includes an infrared sensing portion that is made of a material with a thermoelectric effect.

In an alternative preferred embodiment, the heat sensing section includes an infrared sensing portion that is made of a material with a pyroelectric effect.

In another alternative preferred embodiment, the heat sensing section includes an infrared sensing portion, of which the dielectric constant changes with temperatures.

In yet another preferred embodiment, the driving section includes an electrode or a coil, which is arranged on the substrate portion, the cavity wall portion or the contact supporting member, and is able to exert non-contact force on the heat sensing section.

In a specific preferred embodiment, the non-contact force is electrostatic force.

In this particular preferred embodiment, the electronic device includes means for producing electric charge in the heat sensing section by electrostatic induction.

In an alternative preferred embodiment, the heat sensing section includes a charge storage portion to store the electric charge.

In a specific preferred embodiment, the driving section drives the heat sensing section, which is negatively charged, by repulsive force.

In yet another preferred embodiment, the heat sensing section includes a ferroelectric material. The electrostatic force between the electric charge that has been produced in the substrate, the cavity wall portion or the contact supporting member and polarized charge produced in the ferroelectric material is the non-contact force.

In yet another preferred embodiment, the non-contact force is electromagnetic force.

In yet another preferred embodiment, there is a gap between the heat sensing section and the substrate even in the first state.

In yet another preferred embodiment, environment surrounding the heat sensing section is shut off from the air and is either a vacuum or a reduced-pressure atmosphere.

A method for fabricating an electronic device according to the present invention includes the steps of: providing a substrate; forming a heat sensing section, of which a physical property varies responsive to an incoming infrared ray and which is still covered with a sacrificial layer, on the substrate; forming a cavity wall, which surrounds the heat sensing section with the sacrificial layer interposed between them, on the substrate; and etching the sacrificial layer away to separate the heat sensing section from the cavity wall.

An electronic device driving method according to the present invention is a method for driving an electronic device according to any of the preferred embodiments of the present invention described above. The method includes the steps of: (A) irradiating the heat sensing section with an infrared ray; (B) connecting the heat sensing section to the detector circuit section in the first state to detect a variation in a physical property of the heat sensing section; and (C) changing the positions of the heat sensing section to switch its states from the first state into the second state.

In one preferred embodiment, the method includes the step of repeatedly performing the steps (A), (B) and (C) periodically.

In another preferred embodiment, the at least one heat sensing section includes a plurality of heat sensing sections that are arranged in columns and rows, and the steps (A), (B) and (C) are performed at different timings on either a row-by-row basis or a column-by-column basis.

In still another preferred embodiment, the heat sensing section is connected in the first state to the detector circuit section for a duration of 1 μsec to 10 msec.

The electronic device of the present invention can connect the heat sensing section to the detector circuit section only when necessary by bringing the first contact portion of the heat sensing section and the second contact portion of the detector circuit section into, or out of, contact with each other. If the heat sensing section were always connected to the detector circuit section as in the conventional infrared sensor, it would be impossible to keep the heat from escaping from the heat sensing section. The present invention, however, can minimize such an escape of the heat.

According to the present invention, the heat sensing section can have increased heat insulation, and therefore, the escape of the heat from the heat sensing section to the surrounding environment can be reduced and the temperature of the heat sensing section changes more significantly responsive to an incoming infrared ray. Consequently, the present invention realizes increased infrared responsivity.

BRIEF DESCRIPTION OF THE DRAWINGS

FIG. 8F shows how the heat sensing section changes its positions as the electric circuit of the present invention operates.

FIG. 12B is a cross-sectional view illustrating another manufacturing process step to make the electronic device of the present invention.

FIG. 12F is a cross-sectional view illustrating another manufacturing process step to make the electronic device of the present invention.

DETAILED DESCRIPTION OF PREFERRED EMBODIMENTS

Embodiment 1

Hereinafter, a first preferred embodiment of an electronic device according to the present invention will be described with reference to the accompanying drawings. The electronic device of this preferred embodiment is an infrared sensor of a resistance changing type. However, the present invention is in no way limited to this specific preferred embodiment but is also applicable to a pyroelectric infrared sensor, a thermopile type infrared sensor, or any other type of electronic device. The same statement will apply to any of the other preferred embodiments of the present invention to be described later.

First, a schematic configuration for an electronic device according to this preferred embodiment will be described with reference to FIG. 1A, of which portion (a) is a perspective view illustrating a first preferred embodiment of the present invention and portion (b) is a cross-sectional view thereof as viewed on the plane 1b-1b shown in portion (a) of FIG. 1A.

Figure 1A:
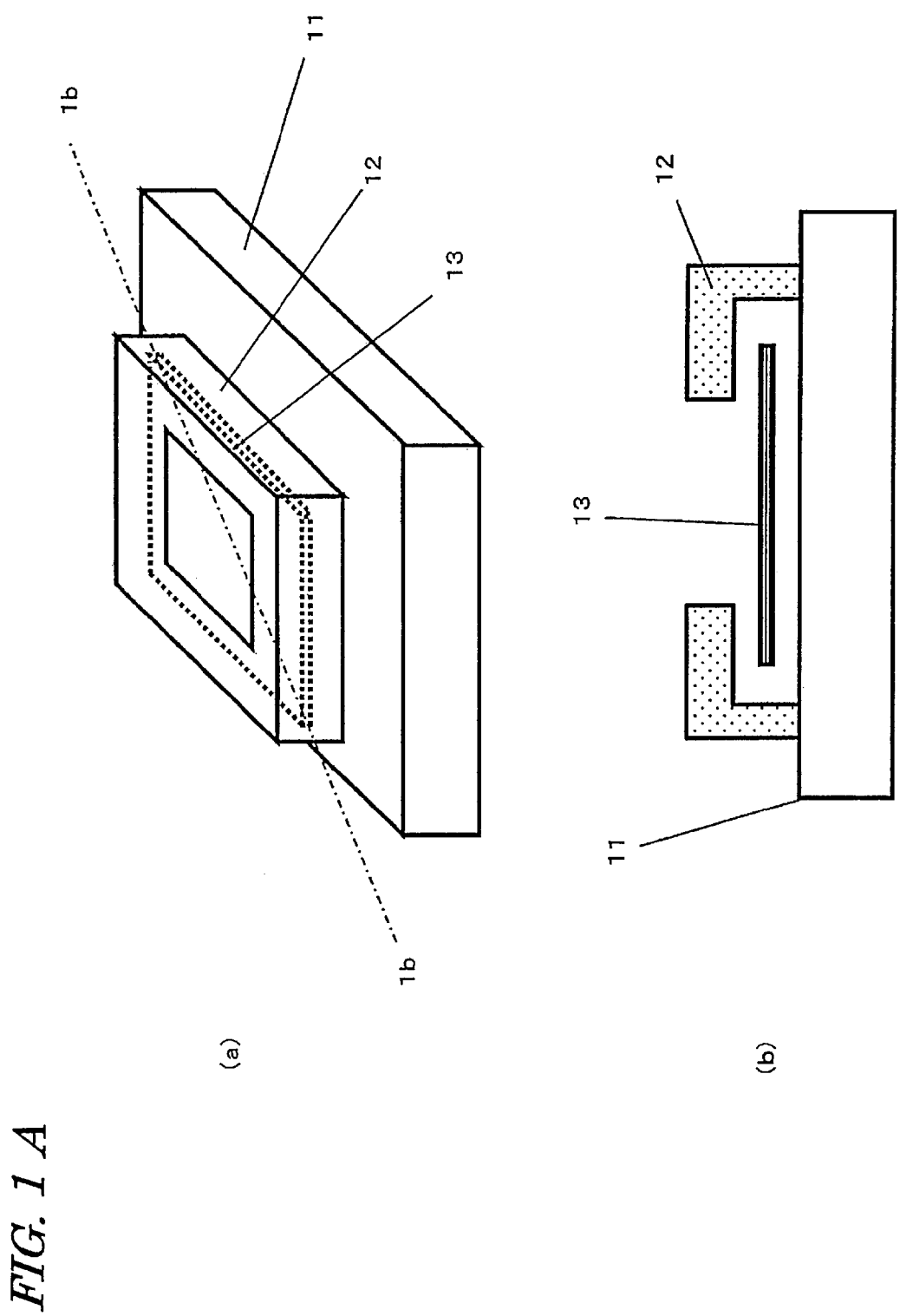
FIG. 1A illustrates a schematic configuration for an electronic device according to the present invention.

As shown in FIG. 1A, the electronic device of this preferred embodiment includes a substrate portion 11, a cavity wall portion 12 arranged on the upper surface of the substrate portion 11, and a heat sensing section 13 housed inside the cavity wall portion 12. The substrate portion 11 and/or the cavity wall portion 12 includes an electrode for driving the heat sensing section 13 and a portion (i.e., electric lines) of a detector circuit section. A driving section according to the present invention controls the position of the heat sensing section 13. An infrared detector senses a variation in a physical property (such as a variation in electrical resistance) of the heat sensing section 13. To exert non-contact force on the heat sensing section 13, the driving section includes an electric or magnetic circuit component such as an electrode or a coil, which is arranged on the substrate portion 11 and/or the cavity wall portion 12, as one of its elements.

As used herein, the "heat sensing section" is defined as a section that absorbs an infrared ray that has been incident on the electronic device of the present invention and changes its temperatures. According to the present invention, the intensity of the incident infrared ray can be detected based on the variation in the temperature of this heat sensing section. An exemplary temperature variation of the heat sensing section will be described in detail later. Also, a portion of the heat sensing section, of which a physical property changes in response to the variation in the temperature of the heat sensing section upon the exposure to the infrared ray, will be referred to herein as an "infrared detecting portion".

As shown in portion (b) of FIG. 1A, the heat sensing section 13 of this preferred embodiment can float inside the cavity defined by the cavity wall portion 12. The heat sensing section 13 can be floated by using electrostatic force, for example. While out of contact with the cavity wall portion 12 and the substrate portion 11, the heat sensing section 13 has a very high heat insulation property. To further improve this heat insulation property, the space inside the cavity may have either a reduced pressure or a vacuum.

According to this preferred embodiment, the heat sensing section 13 is not always floated, but when it is necessary to sense a variation in the physical property of that portion of the heat sensing section 13 functioning as an infrared detecting portion, the heat sensing section 13 is moved to make contact with an electrical contact portion of the cavity wall portion 12. As a result of this contact, the infrared detector can read data (i.e., can make electrical measurement).

The infrared detecting portion may be made of a material, of which the electrical resistance has temperature dependence. Such a material, of which the electrical resistance changes with the temperature, may be a semiconductor such as silicon. An alternative material for the infrared detecting portion may be a material with a thermoelectric effect. Examples of such materials with the thermoelectric effect include BaTe and PbTe. Another material for the infrared detecting portion may be a material with a pyroelectric effect. As such a material with a pyroelectric effect, tourmaline, which is a cyclosilicate mineral including boron, has been known. Examples of other materials with the pyroelectric effect include inorganic materials such as lead titanate and lithium tantalate and organic materials such as triglycine-sulfate (TGS) and polyvinylidenefloride (PVDF). Still another material for the infrared detecting portion could be a material, of which the dielectric constant changes with the temperature and which may be BTZ (i.e., $Ba(Ti, Zr)O_3$), for example.

In FIG. 1A, the heat sensing section 13 is illustrated in a simplified form as if it were a flat plate. The heat sensing section 13 actually has a bolometer portion and a contact portion as will be described in detail later.

The heat sensing section 13 preferably has planar dimensions of at most several mm square, and may have a rectangular shape of 30 μm square, for example. Also, the heat sensing section 13 has a thickness of at most 1 mm, e.g., about 2 μm in this preferred embodiment. To change the positions of the heat sensing section 13 at high speeds with non-contact force such as electrostatic force, the weight of the heat sensing section 13 is preferably reduced.

For example, even if a small heat sensing section 13 having a thin plate shape with a thickness of 2 μm, a length of 30 μm and a width of 30 μm is used, a sufficient amount of infrared rays can be made to impinge on the heat sensing section 13 by using an appropriate lens. While the heat sensing section 13 is floating, the distance between the heat sensing section 13 and the substrate portion 11 and the distance between the heat sensing section 13 and the cavity wall portion 12 may be within the range of 0.5 μm to 5 μm, e.g., about 2 μm. If the gap left there has such a dimension, the heat sensing section 13 floating can be sufficiently insulated thermally from its surrounding members. As a result, the infrared sensitivity increases.

Figure 1B:
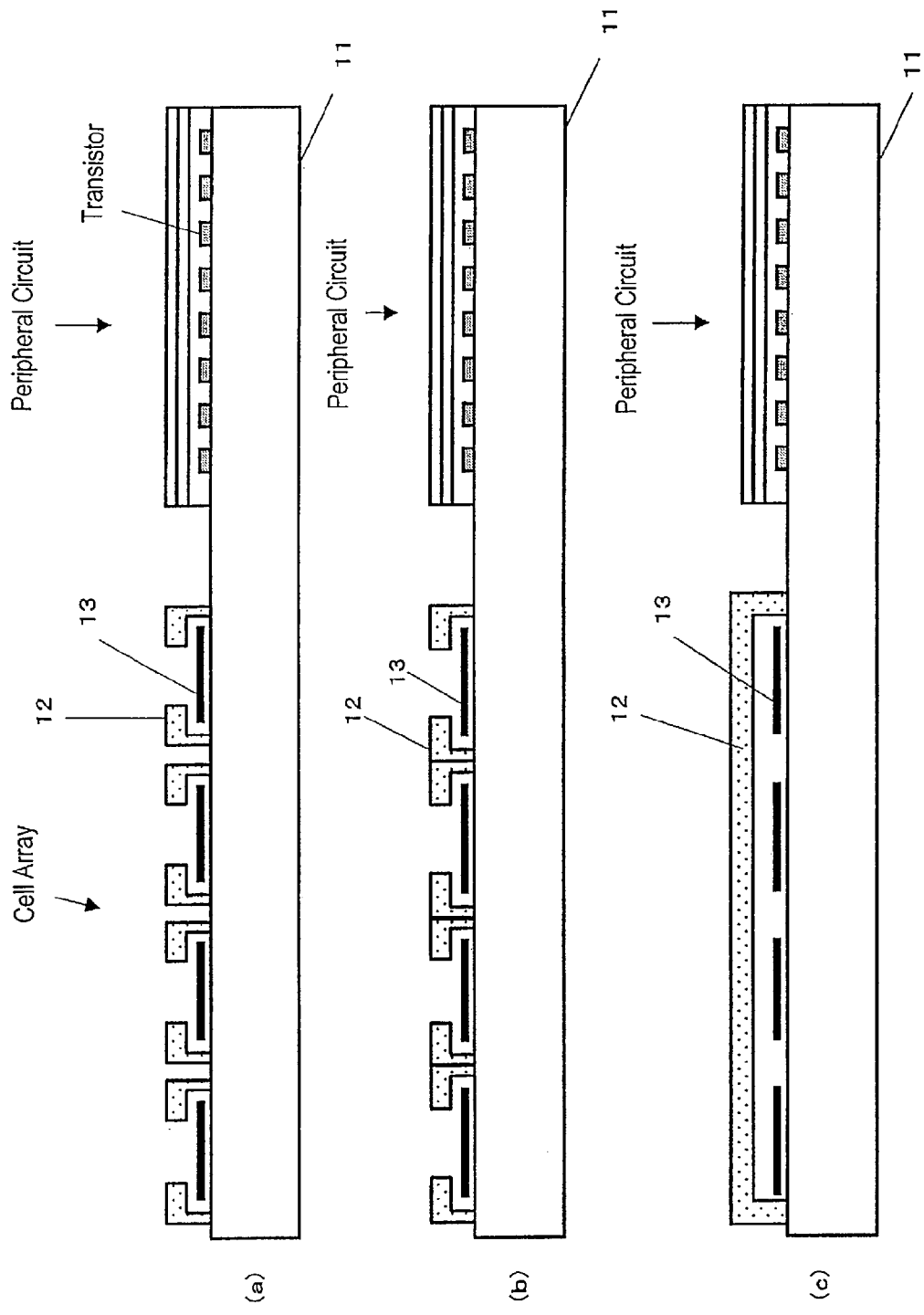
FIG. 1B illustrates an alternative configuration for an electronic device according to the present invention.

FIG. 1B schematically illustrates respective cross sections of electronic devices, in each of which a number of cavities are defined on the same substrate portion 11 and the heat sensing section 13 shown in FIG. 1A is arranged in each of those cavities.

Specifically, in the example shown in portion (a) of FIG. 1B, a one- or two-dimensional array of cells (which will be simply referred to herein as a "cell array"), each having the basic configuration shown in FIG. 1A, is formed on the same substrate portion 11. Such an array of cells can form an infrared image sensor. On the substrate portion 11, arranged is a peripheral circuit including circuit components such as transistors as its elements. This peripheral circuit further includes an infrared detector (i.e., a data reading circuit) and a driver for controlling the drive mode of the heat sensing section 13. The heat sensing section 13 and the peripheral circuit can be electrically connected together by way of a contact portion (not shown in FIG. 1A) that is arranged on the cavity wall portion 12. The contact portion is connected to the peripheral circuit through electric lines (not shown).

If the cells are arranged in columns and rows so as to form a matrix pattern, the peripheral circuit reads data on either a row-by-row basis or a column-by-column basis. In reading data on a row-by-row basis, for example, data is sequentially read from the $N^{th}$ row of cells (where N is a natural number) and then from the $(N+1)^{th}$ row of cells in the same way. By repeatedly performing this operation, data can be obtained from the cell array with the two-dimensional arrangement and an infrared image sensor can be provided.

Portion (b) of FIG. 1B shows an example in which the cavity wall portions 12 of respective cells are not separated from each other. And portion (c) of FIG. 1B shows an example in which a number of heat sensing sections 13 are arranged inside a big cavity. As can be seen, the respective heat sensing sections 13 (corresponding to pixels) need to be separated from each other on a cell-by-cell basis, but the cavity portion 12 does not always have to be split into respective cells.

Next, the configuration of the heat sensing section 13 will be described in detail with reference to FIGS. 2A and 2B.

Figure 2A:
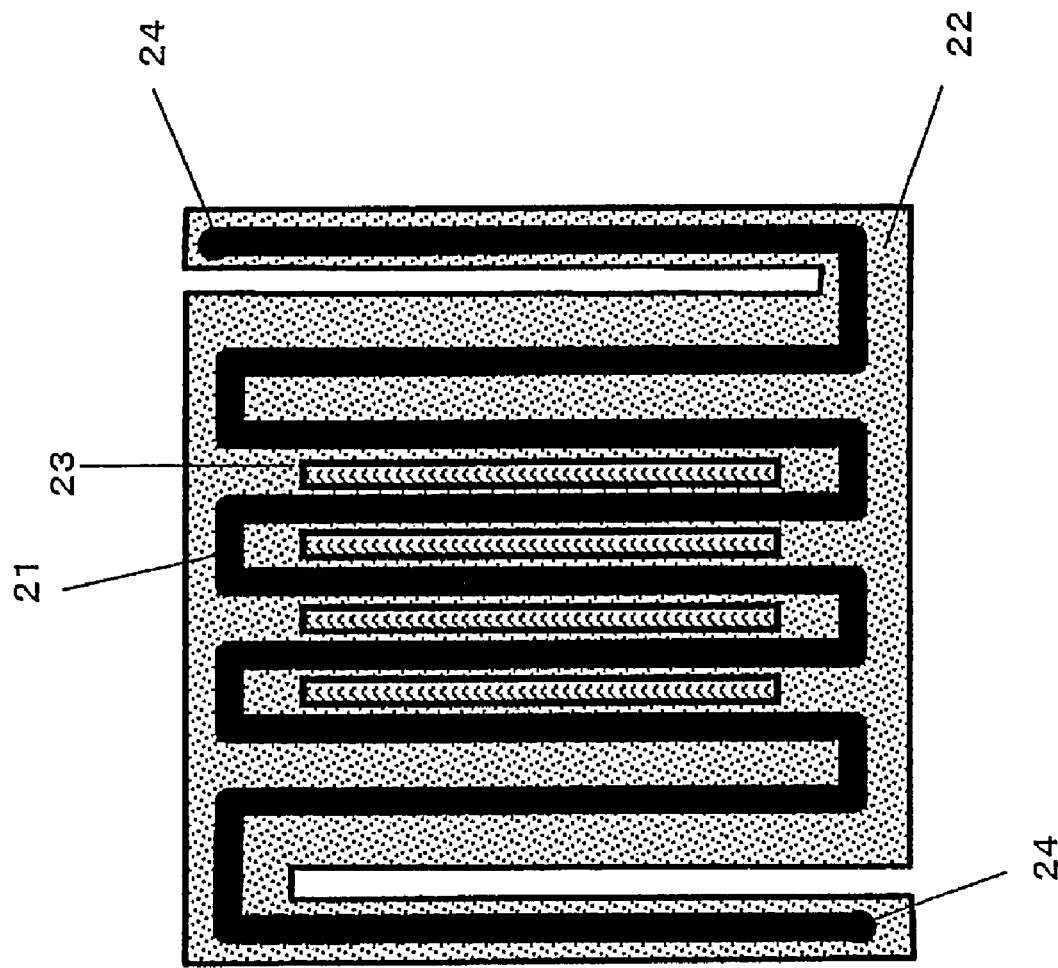
FIG. 2A illustrates a configuration for a heat sensing section according to a first preferred embodiment of the present invention.

First, look at FIG. 2A, which illustrates a planar layout for the bolometer portion 21 of the heat sensing section 13. The bolometer portion 21 is made of a material, of which the resistivity depends heavily on the temperature and which may be polysilicon, titanium or vanadium oxide, for example, and has a winding pattern. Both ends of the bolometer portion 21 are connected to bolometer contact portions 24 to be described later.

When the temperature of the bolometer portion 21 rises responsive to an incoming infrared ray, its electrical resistance varies. This variation is sensed by a read circuit section (i.e., the infrared detector section) (not shown). More specifically, the electric lines of the read circuit are electrically connected to the bolometer portion 21 by way of the bolometer contact portions 24 to detect the variation in the resistance of the bolometer portion 21 electrically. As a result, the intensity of the infrared ray that has been incident on the bolometer portion 21 can be calculated. If such heat sensing sections 13 are arranged in columns and rows on the same substrate portion 11 and if the variations in the electrical resistance of the respective bolometer portions 21 of those heat sensing sections 13 are detected independently of each other, the in-plane distribution of the intensities of the infrared rays can be detected. As a result, an infrared image can be obtained.

The heat sensing section 13 includes a bolometer protective coating 22 to protect the bolometer portion 21. The bolometer protective coating 22 may be made of an electrically insulating material such as silicon dioxide. The heat sensing section 13 of this preferred embodiment further includes charge storage portions 23 to store electric charge therein. When storing electric charge, each of these charge storage portions 23 is negatively charged and can generate electrostatic force between the substrate portion 11 and the electrode arranged on the inner wall of the cavity wall portion 12. As will be described in detail later, according to this preferred embodiment, the position of the heat sensing section 13 is controlled using this electrostatic force.

By using this electrostatic force, the position of the heat sensing section 13 can be controlled and the states of the heat sensing section 13 can be alternately changed from a first state in which the heat sensing section 13 is in contact with the read circuit section into a second state in which the heat sensing section 13 is out of contact with the read circuit section, and vice versa.

To thermally insulate the heat sensing section 13 from the other members of the electronic device as perfectly as possible, the heat sensing section 13 in the second state in which the heat sensing section 13 is out of contact with the read circuit section is preferably moved to a region where the heat sensing section 13 makes no contact with any other member of the electronic device.

The bolometer contact portions 24 of the heat sensing section 13 function as points of contact with the electric lines of the cavity wall portion 12 when current is supplied to the bolometer portion 21. As will be described later, bolometer line contact portions 42 to make contact with the bolometer contact portions 24 are arranged on the upper part of the cavity wall portion 12. As the heat sensing section 13 moves, the bolometer contact portions 24 contact with the bolometer line contact portions 42 on the cavity wall portion 12, thus supplying current from the cavity wall portion 12 to the bolometer portion 21.

Figure 2B:
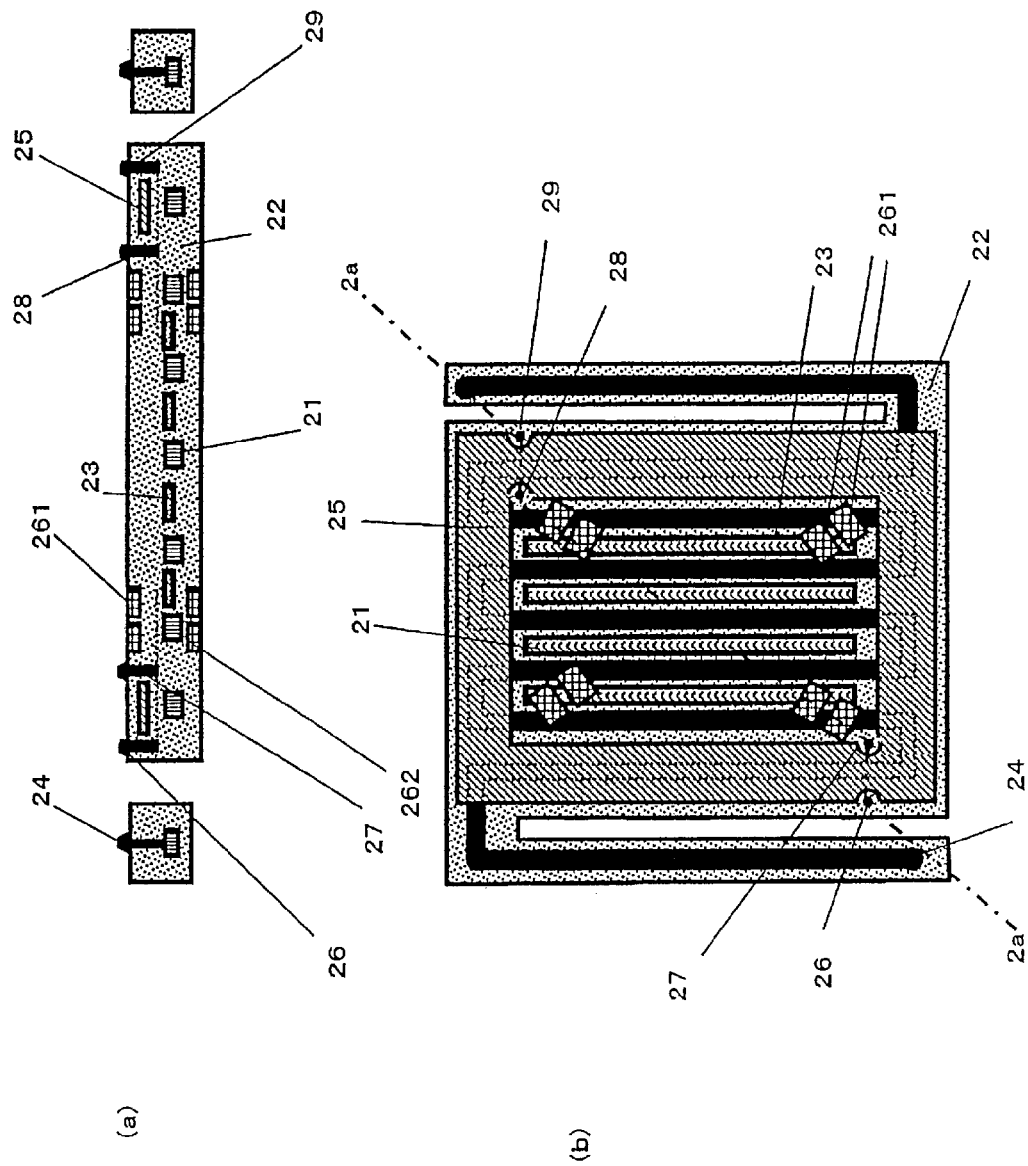
FIG. 2B illustrates an alternative configuration for a heat sensing section according to the first preferred embodiment of the present invention.

Now look at FIG. 2B, of which portion (a) illustrates a detailed cross section of the heat sensing section 13 as viewed on the plane 1b-1b shown in FIG. 1A and portion (b) illustrates the upper surface of the heat sensing section 13. A plane 2a-2a corresponding to the plane 1b-1b is also shown in portion (b) of FIG. 2B just for reference.

As shown in portion (a) of FIG. 2B, the bolometer portion 21 is coated with the bolometer protective coating 22. The upper and lower surfaces of the bolometer protective coating 22 have been substantially flattened and the bolometer protective coating 22 has a roughly thin plate shape. On the upper surface of the bolometer protective coating 22, eight separated upper position detecting electrode portions 261, a source contact portion 26, a drain contact portion 27, a gate contact portion 28 and a channel contact portion 29 are arranged as shown in portion (b) of FIG. 2B. These contact portions 26, 27, 28 and 19 have something to do with the operation of the charge storage portions 23 as will be described in detail later.

An electrostatic induction electrode portion 25 is arranged in a region of the bolometer protective coating 22 near the upper surface thereof. As shown in portion (b) of FIG. 2B, the electrostatic induction electrode portion 25 has a band shape surrounding the center region in which the charge storage portions 23 are arranged. The electrostatic induction electrode portion 25 may be made of polysilicon that has been heavily doped with dopant ions, for example.

On the lower surface of the bolometer protective coating 22, arranged are lower position detecting electrode portions 262 as shown in portion (a) of FIG. 2B. The structure and arrangement of the lower position detecting electrode portions 262 correspond to those of the upper position detecting electrode portions 261.

On a plan view, the heat sensing section 13 is roughly rectangular. However, the bolometer contact portions 24 are provided as elongated branch portions extending from the body of the heat sensing section 13. Such a branch structure is adopted in order to minimize the outflow of the heat from the heat sensing section 13 toward the cavity wall portion 12 when the bolometer contact portions 24 are in contact with the cavity wall portion 12 by decreasing the thermal conductivity. Nonetheless, such a branch structure is not indispensable.

Figure 3:
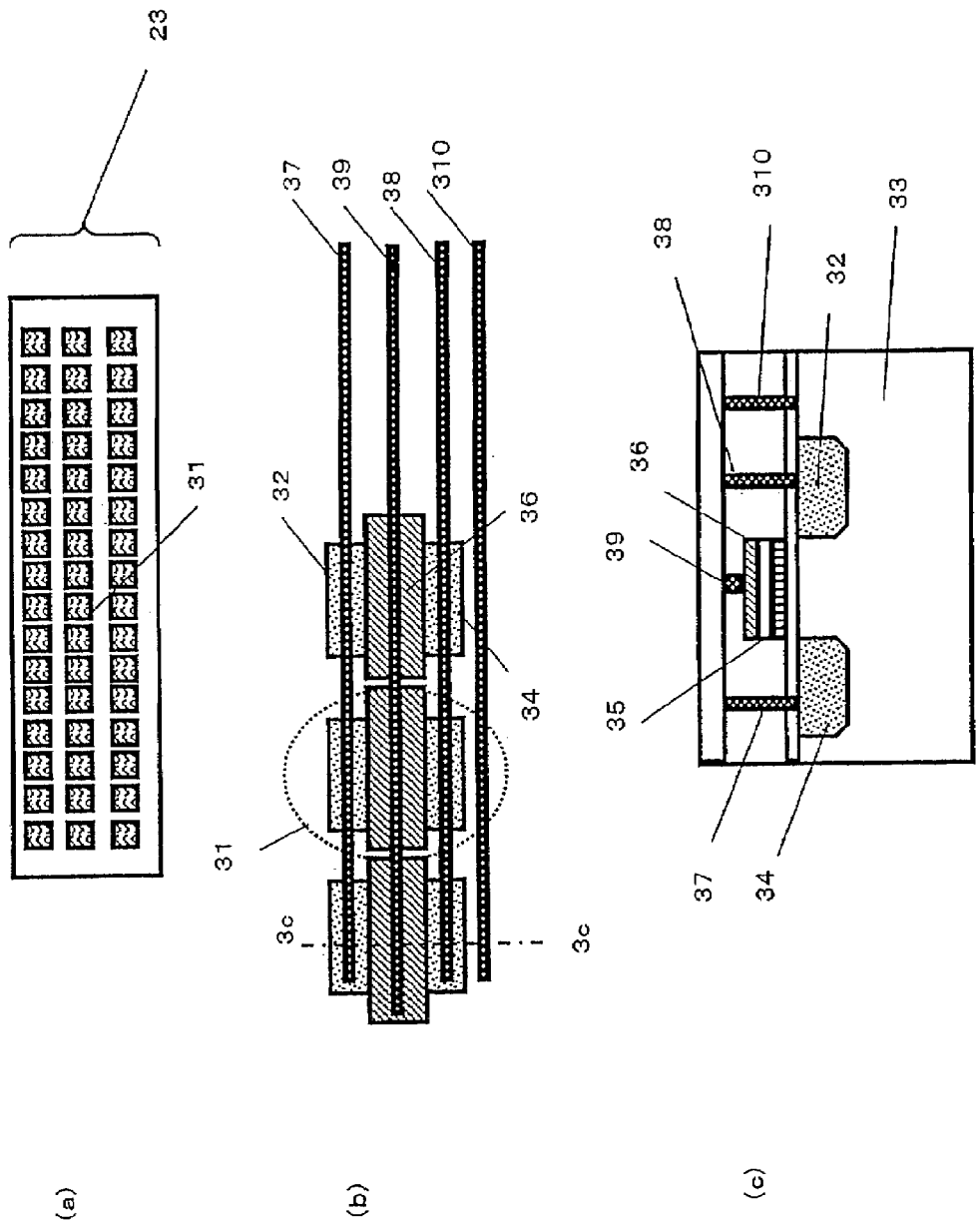
FIG. 3 illustrates a configuration for a charge storage portion according to the first preferred embodiment of the present invention.

Next, the charge storage portions 23 of the heat sensing section 13 will be described in detail with reference to FIG. 3. Specifically, FIG. 3(a) is a partially enlarged top view of the charge storage portion 23. FIG. 3(b) is a further enlarged top view illustrating some of a huge number of charge storage elements 31 included in the charge storage portion 23. And FIG. 3(c) is a cross-sectional view of the charge storage element as viewed on the plane 3c-3c shown in FIG. 3(b).

As shown in FIG. 3(a), the charge storage portion 23 of this preferred embodiment has a configuration in which a number of charge storage elements 31 are arranged in columns and rows to form a matrix array. Each of these charge storage elements 31 has an MOS structure as shown in FIG. 3(b), and includes a source region 32, a drain region 34 and a channel region 33 that have been defined in a semiconductor layer of polysilicon, for example. The channel region 33 has been doped with dopant ions such as B (boron) ions relatively lightly. On the other hand, the source and drain regions 32 and 34 have been doped with dopant ions such as As (arsenic) ions relatively heavily.

The charge storage portion 23 includes a floating gate electrode 35 that has been formed so as to cover the channel region 33 with a gate insulating film interposed between them and a control gate electrode 36 that has been stacked over the floating gate electrode 35 with an insulating film sandwiched between them.

The floating gate electrode 35 may be made of polysilicon and may have been heavily doped with dopant ions such as As (arsenic) ions, for example. The floating gate electrode 35 is electrically isolated from the other portions and stores electric charge therein in the same way as EPROM's write operation.

The charge storage portion 23 further includes a drain contact portion 37 and a source contact portion 38 that are connected to the drain region 34 and the source region 23, respectively, a channel contact portion 310 connected to the channel region 33, and a gate contact portion 39 connected to the control gate electrode 39.

The drain contact portion 37, the source contact portion 38, the gate contact portion 39 and the channel contact portion 310 may be made of aluminum (Al), for example, and function as terminals for electrically connecting the drain region 34, the source region 32, the control gate electrode 36 and the channel region 33 to external circuits, respectively.

Next, it will be described how electric charge is stored in the floating gate electrode 35.

To store electric charge in the floating gate electrode 35, the source contact portion 38 and the channel contact portion 310 are electrically grounded, while a high voltage of 10 V, for example, is applied to the drain contact portion 37, the drain contact portion 37 and the gate contact portion 39 (i.e., a write operation is performed). Then, electrons move through the channel region 33 from the source region 32 toward the drain region 34 and get high kinetic energy in the vicinity of the drain region 34 to be hot electrons, some of which penetrate the insulating film under the floating gate electrode 35 and are injected into the floating gate electrode 35. Those electrons that have been injected into the floating gate electrode 35 in this manner are stored inside the floating gate electrode 35 to charge the floating gate electrode 35 negatively.

In performing this write operation, the heat sensing section 13 is moved upward such that the respective contact portions 37, 38, 39 and 310 arranged on the upper surface of the heat sensing section 13 contact with their associated contact portions on the cavity wall portion 12 as will be described later.

Figure 4:
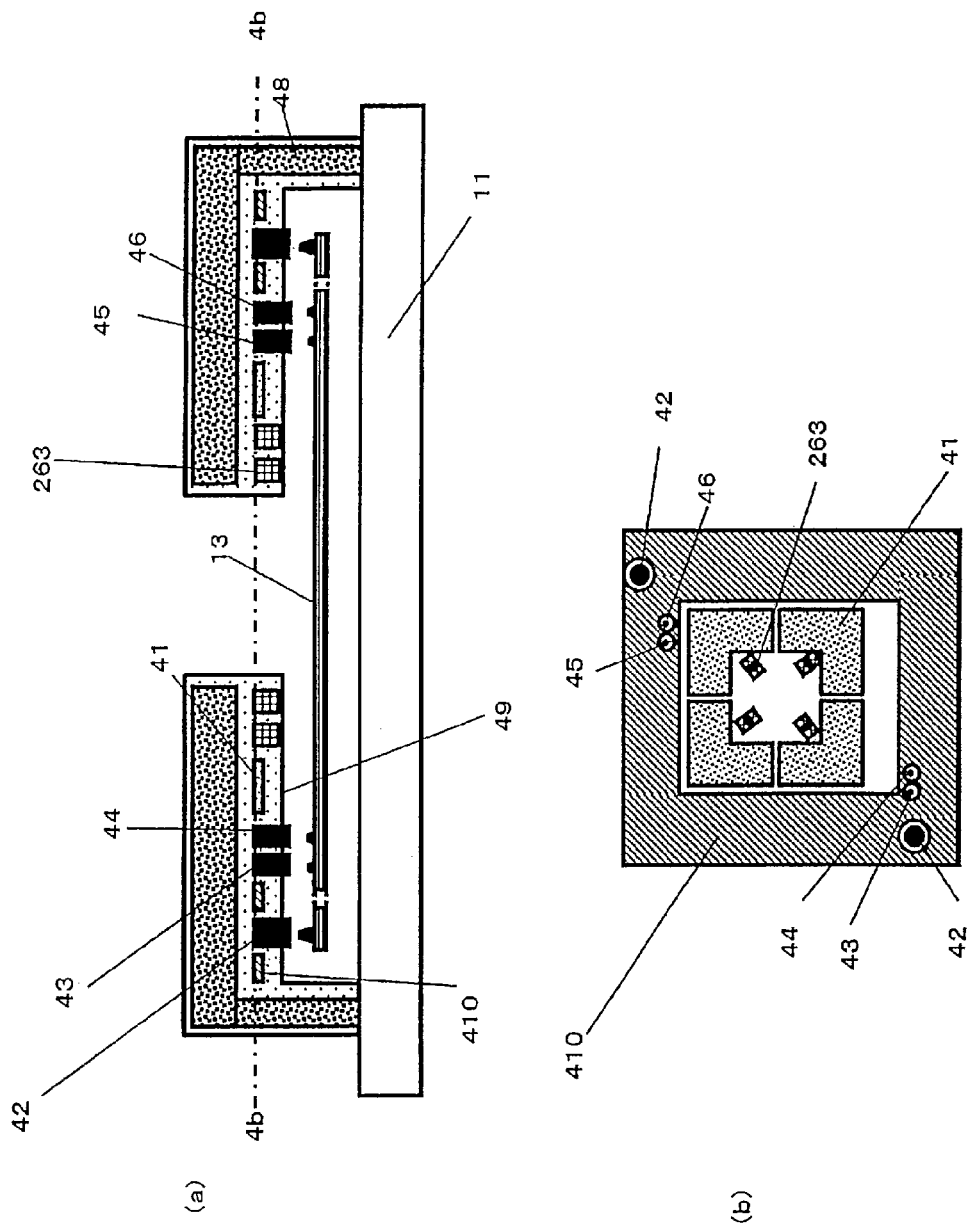
FIG. 4 illustrates a configuration for a cavity wall portion according to the first preferred embodiment of the present invention.

Next, the configuration of the cavity wall portion 12 will be described with reference to FIGS. 4(a) and 4(b). Specifically, FIG. 4(a) is a detailed cross-sectional view of the cavity wall portion 12 as viewed on the plane 1b-1b shown in FIG. 1A, while FIG. 4(b) is a cross-sectional view as viewed on the plane 4b-4b shown in FIG. 4(a). In FIG. 4, the configurations of the heat sensing section 13 and the substrate portion 11 are simplified.

The cavity wall portion 12 of this preferred embodiment includes contact portions, which are arranged so as to contact with their associated contact portions of the heat sensing section 13. Specifically, the cavity wall portion 12 includes bolometer line contact portions 42, a source line contact portion 43, a drain line contact portion 44, a gate line contact portion 45 and a channel line contact portion 46, which respectively contact with the bolometer contact portions 24, the source contact portion 26, the drain contact portion 27, the gate contact portion 28 and the channel contact portion of the heat sensing section 13 shown in FIG. 2B, thereby connecting the bolometer portion 21, the source region 32, the drain region 34, the control gate electrode 36 and the channel region 33 to electric lines that are arranged inside the cavity wall portion 33.

Each of these contact portions 42 to 46 is preferably made of a patterned aluminum film and is connected to its associated electric line that is arranged inside the cavity wall portion 12. In FIG. 4, some of those electric lines are not illustrated. But these electric lines are also preferably made of a patterned aluminum film, for example. The electric lines of the cavity wall portion 12 have the function of electrically connecting the contact portions 42 to 46 to a read circuit, for example.

The cavity wall portion 12 includes a cavity wall silicon portion 48, a cavity wall protective coating 49, an electrostatic induction counter electrode portion 410, and upper position detecting counter electrode portions 263.

The cavity wall silicon portion 48 supports the respective parts of the cavity wall portion 12, and may be made of polysilicon, for example, and transmits an infrared ray. The cavity wall protective coating 49 may be made of silicon dioxide, for example, and protects the respective parts of the cavity wall portion 12.

An upper uplifting electrode portion 41 may be made of polysilicon that has been heavily doped with dopant ions, for example, and is electrically connected to the electric lines described above. When a voltage is applied to the upper uplifting electrode portion 41, repulsive or attractive electrostatic force is produced with respect to the hot electrons that are stored in the charge storage portions 23 of the heat sensing section 13. By adjusting this force, the position of the heat sensing section 13 can be controlled.

As will be described later, if hot electrons are stored in the charge storage portions 23, repulsive or attractive electrostatic force is also produced between the lower uplifting electrode portion 52 of the substrate portion 11 and the charge storage portions 23 of the heat sensing section 13 by applying a voltage to the lower uplifting electrode portion 52. By adjusting this force, too, the position of the heat sensing section 13 can also be controlled. And the magnitudes of the charges produced in the upper and lower uplifting electrode portions 41 and 52 change with those of these forces. That is why by detecting the amount of current flowing into, and out of, the upper and lower uplifting electrode portions 41 and 52, the magnitudes of those forces can be detected. And the position of the heat sensing section 13 can be controlled based on these detected values.

The electrostatic induction counter electrode portion 410 may be made of polysilicon that has been heavily doped with dopant ions, for example, and are electrically connected to the electric lines arranged inside the cavity wall portion 12. When a negative voltage is applied to the electrostatic induction counter electrode portion 410, electric charge is produced on the upper surface portion of the electrostatic induction counter electrode portion 410. As a result, attractive force is produced between the upper uplifting electrode portion 41 and the electrostatic induction counter electrode portion 410. By using this attractive force, the heat sensing section 13 can be moved upward.

Figure 5:
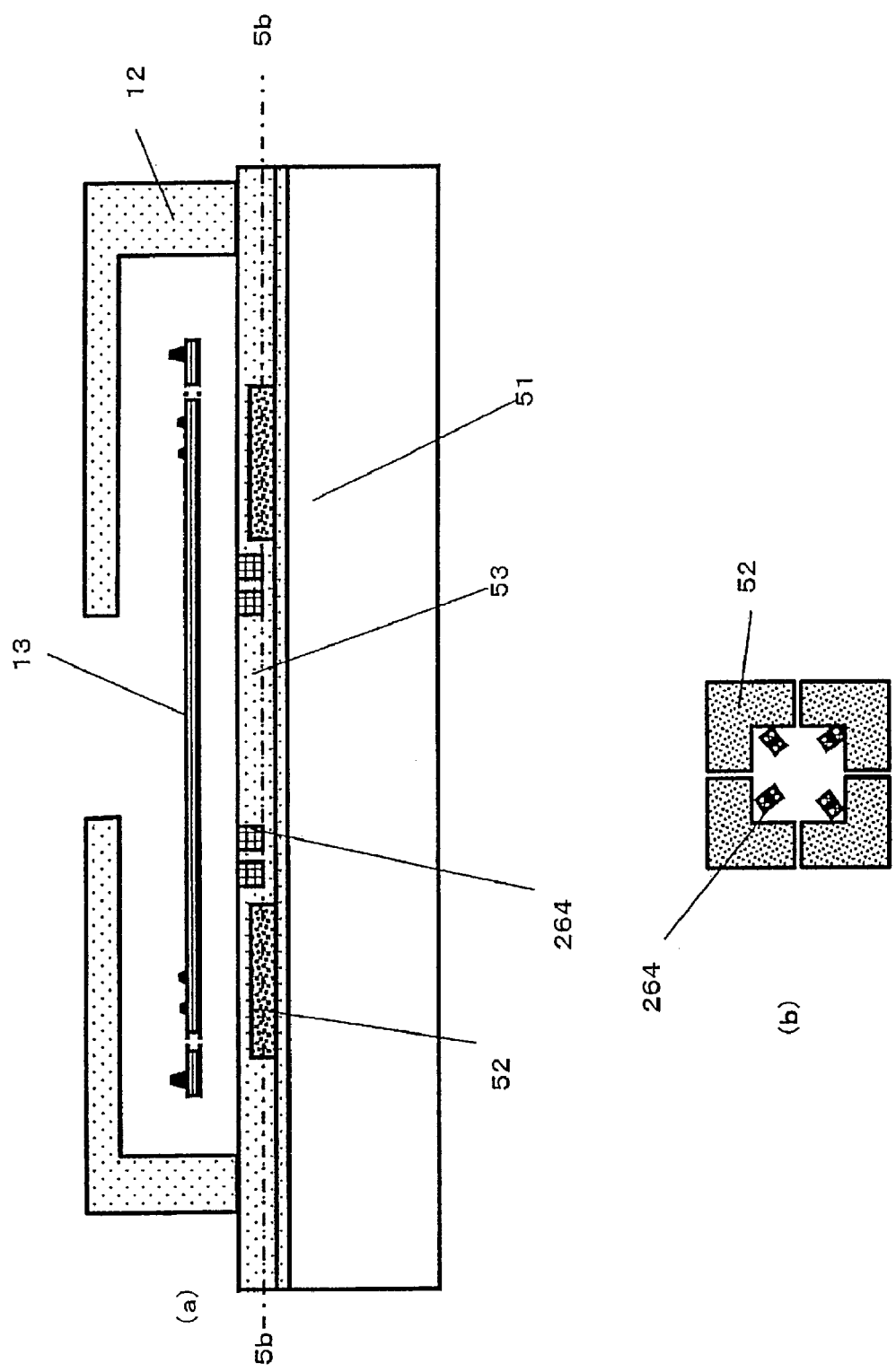
FIG. 5 illustrates a configuration for a substrate portion according to the first preferred embodiment of the present invention.

Next, the configuration of the substrate portion 11 will be described with reference to FIGS. 5(a) and 5(b). Specifically, FIG. 5(a) is a detailed cross-sectional view of the substrate portion 11 as viewed on the plane 1b-1b shown in FIG. 1A, while FIG. 5(b) is a cross-sectional view as viewed on the plane 5b-5b shown in FIG. 5(a). In FIG. 5, the configurations of the cavity wall portion 12 and the heat sensing section 13 are simplified.

The substrate portion 11 includes a silicon substrate portion 51 and the lower uplifting electrode portion 52 and lower position detecting counter electrode portions 264 that are supported on the silicon substrate portion 51. The lower uplifting electrode portion 52 and lower position detecting counter electrode portions 264 have been patterned so as to have the layout shown in FIG. 5(b) and are coated with a substrate protecting coating 53 made of silicon dioxide, for example.

The lower uplifting electrode portion 52 may be made of polysilicon that has been heavily doped with dopant ions, for example, and is electrically connected to the electric lines that are arranged either on or inside the substrate portion 11. These electric lines may be formed by a normal semiconductor device fabricating process and may be made of polysilicon that has been heavily doped with dopant ions, an aluminum alloy or a doped region of a silicon substrate to which dopant ions have been implanted at a high doping level.

If hot electrons are stored in the charge storage portions 23 of the heat sensing section 12, repulsive force is produced between the charge storage portions 23 of the heat sensing section 13 and the lower uplifting electrode portion by applying a negative voltage to the lower uplifting electrode portion 52. By adjusting this repulsive force, the position of the heat sensing section 13 can be controlled.

Figure 6:
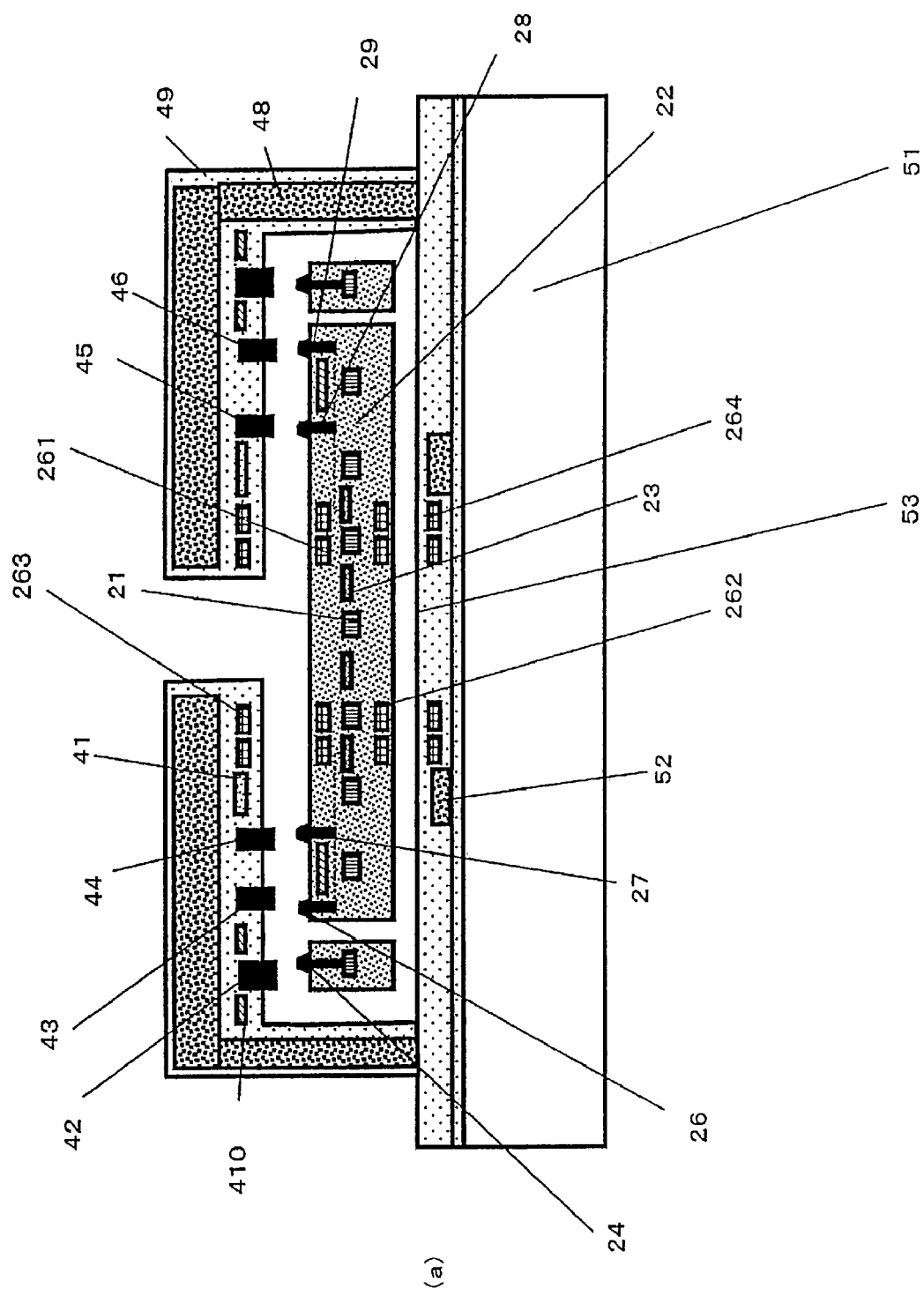
FIG. 6 illustrates an overall configuration for a heat sensing section, a cavity wall portion, and a substrate portion according to the present invention.

FIG. 6 is a cross-sectional view illustrating the overall configuration of the heat sensing section 13, the cavity wall portion 12 and the substrate portion 11 described above.

Next, potentials applied to the respective electrodes and contact portions will be described with reference to FIG. 7.

Figure 7:
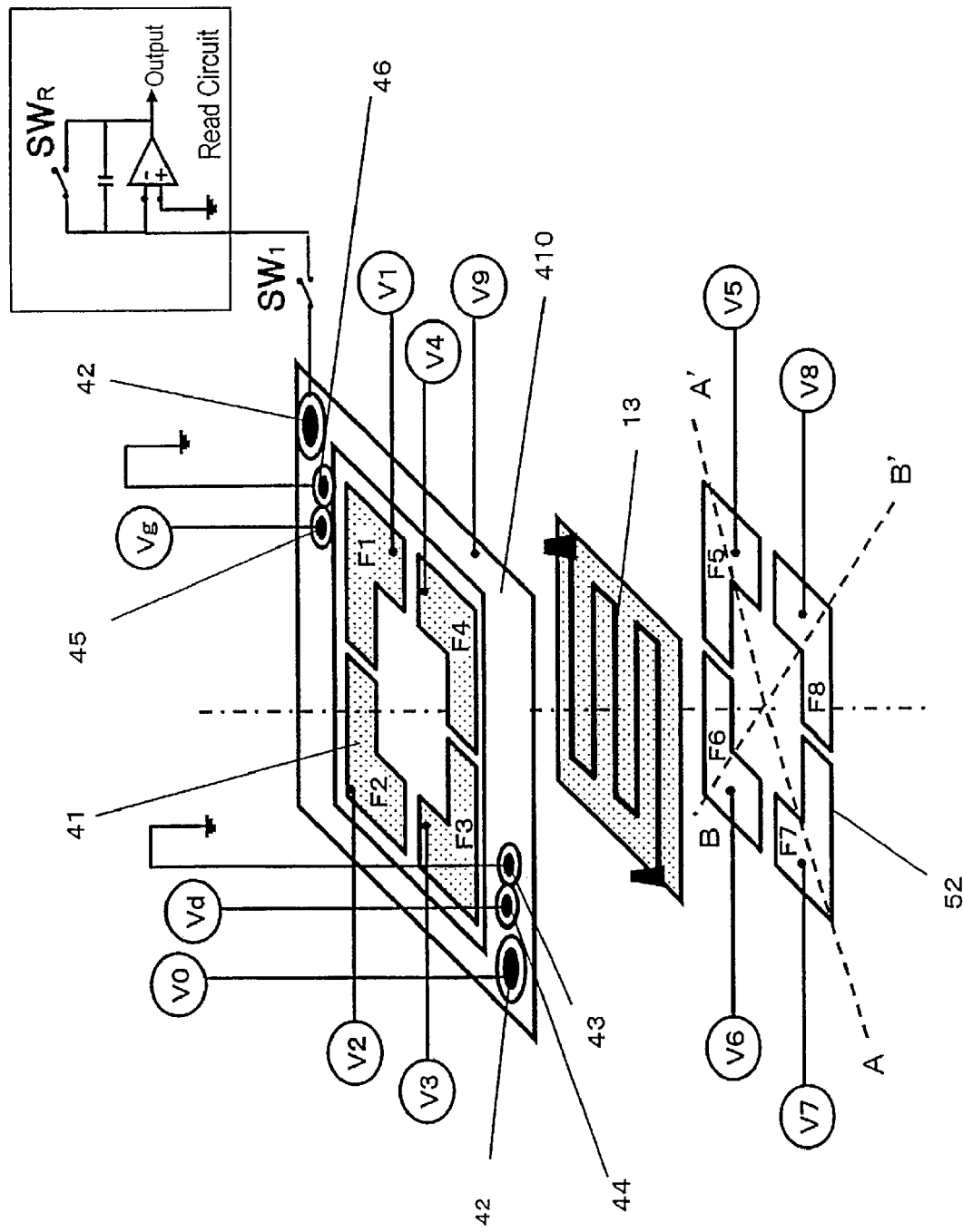
FIG. 7 illustrates an electric circuit configuration according to the present invention.

In FIG. 7, the upper uplifting electrode portion 41 consists of electrodes F1 through F4, while the lower uplifting electrode portion 52 consists of electrodes F5 through F8. Variable power supplies V1 through V8 are connected to the electrodes F1 through F8, respectively. The heat sensing section 13 is located between the upper and lower uplifting electrode portions 41 and 52.

As shown in FIG. 7, another variable voltage supply V9 is connected to the electrostatic induction counter electrode portion 410. Also, the source line contact portion 43 and the channel line contact portion 46 are grounded. Meanwhile, the drain line contact portion 44 is connected to a variable voltage supply Vd and the gate line contact portion 45 is connected to a variable voltage supply Vg.

Next, it will be described with reference to FIGS. 8A through 8F and FIG. 9 how the infrared sensor of this preferred embodiment operates.

FIGS. 8A through 8F are cross-sectional views illustrating how the heat sensing section 13 changes its positions according to the potentials at the respective electrodes. In these drawings, the A-A' and B-B' cross sections are respectively viewed on the planes A-A' and B-B' shown in FIG. 7.

Figure 9:
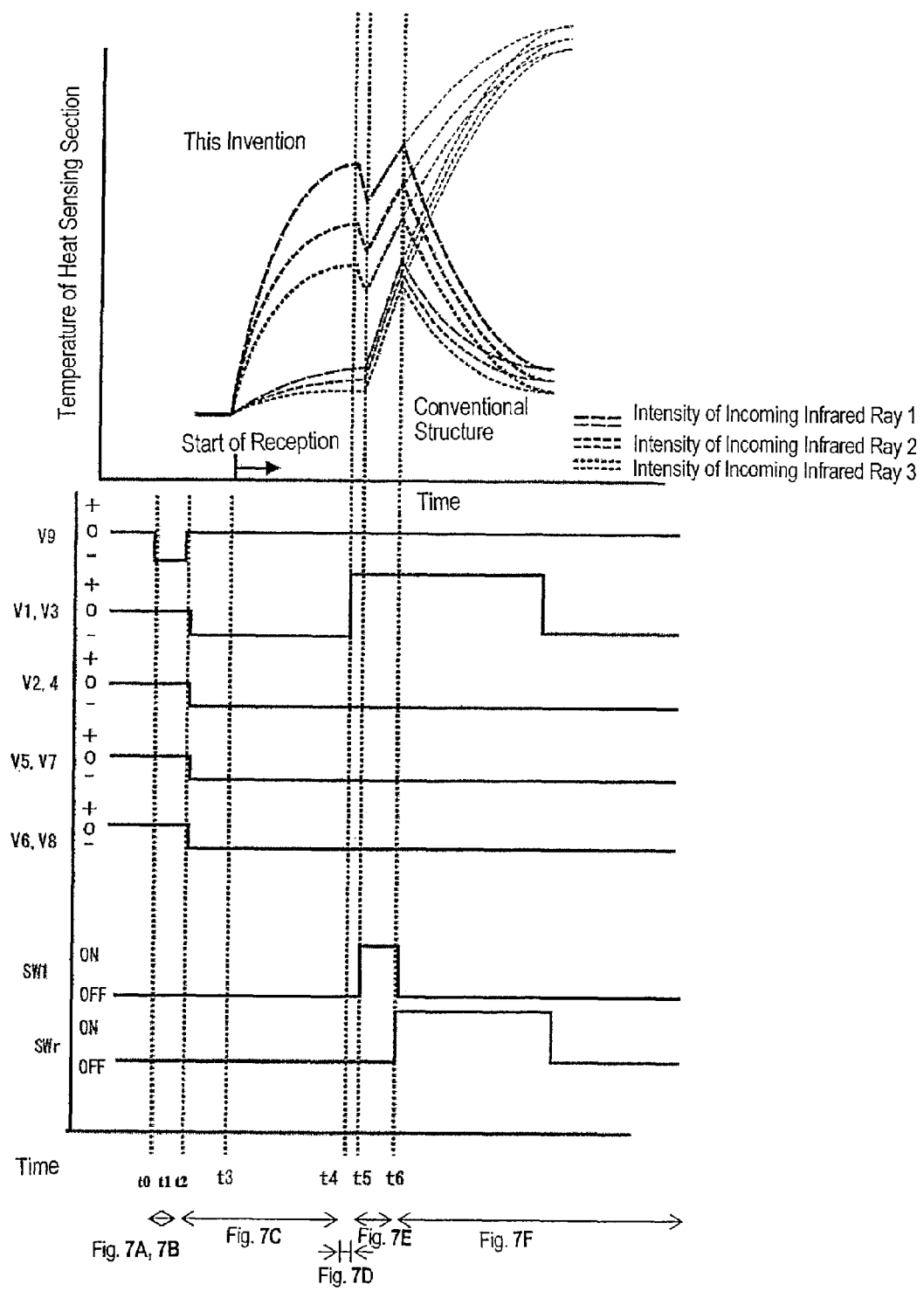
FIG. 9 shows how the temperature of the heat sensing section changes with time in the present invention and in a conventional method.

FIG. 9 shows how the temperature of the heat sensing section 13 varies with the intensity of the incoming infrared ray, which may be one of three different values #1, #2 and #3, for the infrared sensor of this preferred embodiment and a comparative example with the conventional structure. FIG. 9 also shows how the switches of the electric circuit operate and how the variable voltages change its levels with time. The level change of the variable voltage schematically shows a variation in voltage value. As will be described later, the variable voltage has a voltage value that always varies slightly to adjust the position of the heat sensing section 13. However, that small variation is not shown in FIG. 9.

First, the initial state will be described with reference to FIG. 8A.

In the initial state, no hot electrons are stored in the charge storage portions 23. If a negative voltage is applied to the electrostatic induction counter electrode portion 410 by setting the voltage value of the variable voltage supply V9 to a certain negative value at a time t0 in such an initial state, attractive force is produced between the electrostatic induction counter electrode portion 410 and the electrostatic induction electrode portion 25 as described above. As a result, the heat sensing section 13 moves upward, and at a time t1, the source contact portion 38, the drain contact portion 37, the gate contact portion 39, and the channel contact portion 310 contact with the source line contact portion 43, the drain line contact portion 44, the gate line contact portion 45, and the channel line contact portion 46, respectively, as shown in FIG. 8A.

Figure 8A:
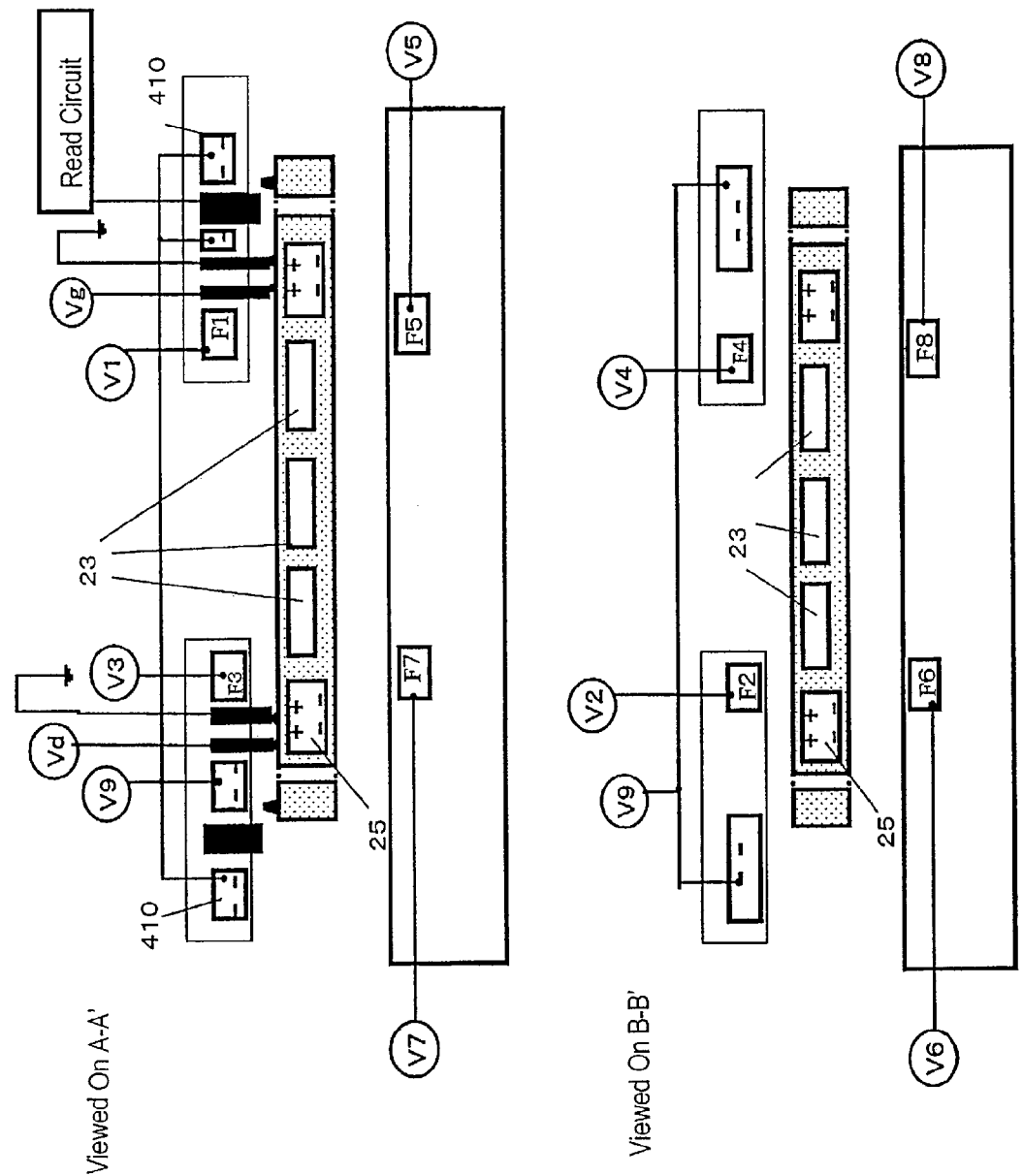
FIG. 8A shows how the heat sensing section changes its positions as the electric circuit of the present invention operates.

Consequently, in the state shown in FIG. 8A, the source contact portion 38 and the channel contact portion 310 are grounded, while the drain contact portion 37 and the gate contact portion 39 are connected to the variable voltage supplies Vd and Vg, respectively (see FIG. 7).

Figure 8B:
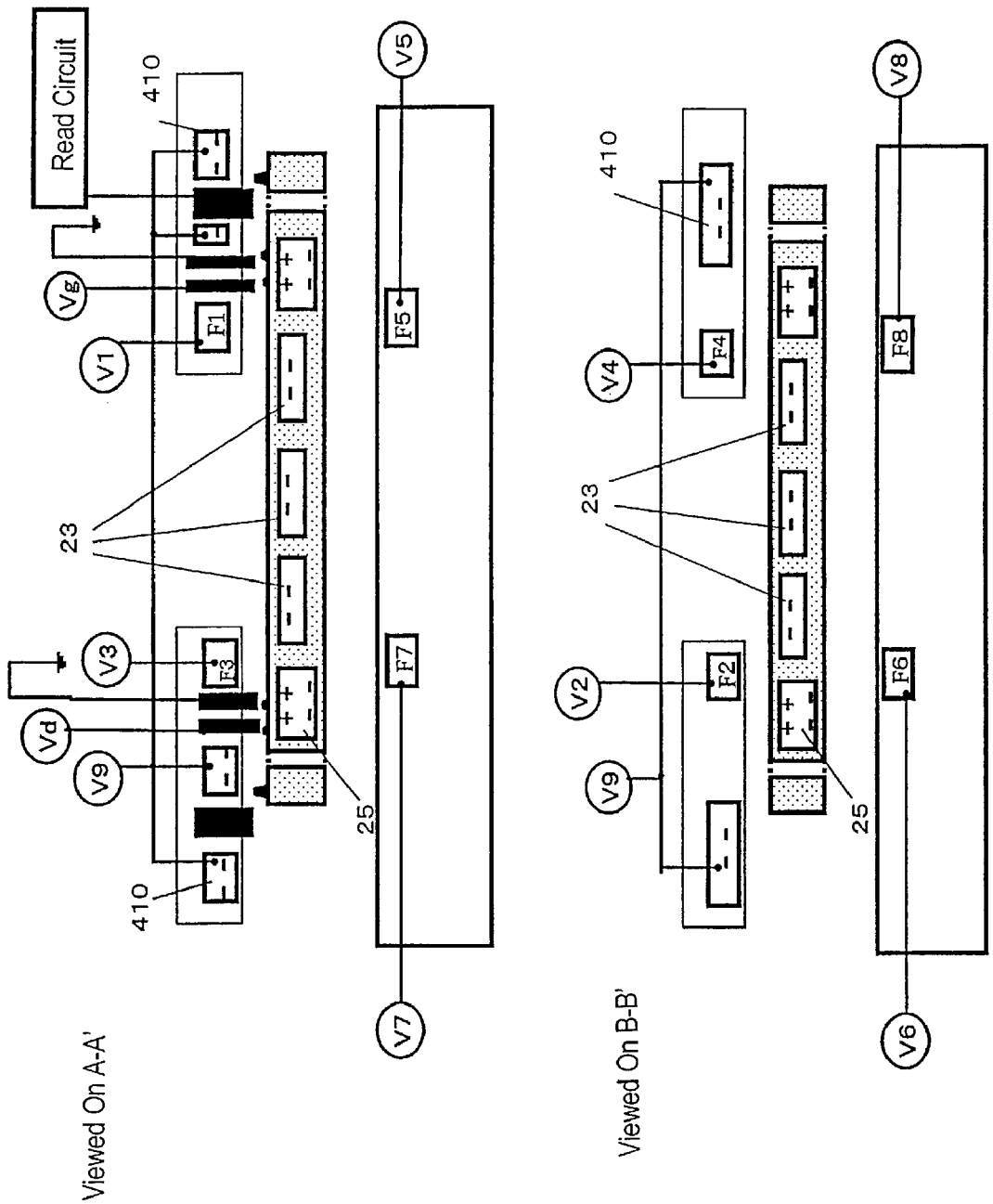
FIG. 8B shows how the heat sensing section changes its positions as the electric circuit of the present invention operates.

When a high voltage is applied to the drain contact portion 37 and the gate contact portion 39 by increasing the voltages Vd and Vg to high level at the time t1, negative charge is stored as hot electrons in the charge storage portions 23 as described above. FIG. 8B shows a state in which electric charge is stored in the charge storage portions 23.

As described above, the variable voltage supplies V1 through V8 are connected to the upper uplifting electrode portion 41 (consisting of the electrodes F1 through F4) and the lower uplifting electrode portion 52 (consisting of the electrodes F5 through F8). At a time t2 when the infrared sensor is in the state shown in FIG. 8B, the negative voltage of the variable voltage supply V9 that is connected to the electrostatic induction counter electrode portion 410 stops being applied and the voltage V9 is set equal to zero. Furthermore, if the voltages of the variable voltage supplies V1 through V8 are changed into negative values, repulsive force is produced between the upper uplifting electrode portion 41 and the charge storage portions 23 of the heat sensing section 13 and between the lower uplifting electrode portion 52 and the charge storage portions 23. As a result, the heat sensing section 13 rises to a location where the heat sensing section 13 is out of contact with the substrate portion 11 and the cavity wall portion 12 as shown in FIG. 8C.

In this preferred embodiment, the position of the heat sensing section 13 can be detected by the method to be described in detail later. If the magnitudes of the voltages applied to the upper and lower uplifting electrode portions 41 and 52 are adjusted, and if the position of the heat sensing section 13 is appropriately controlled, by performing a feedback control based on this detected value, the heat sensing section 13 can be kept raised continuously.

Up to this point in time, no infrared ray has been incident on the heat sensing section 13. And the infrared ray is supposed to start impinging on the heat sensing section 13 at a time t3 when the infrared sensor is in the state shown in FIG. 8C. The graph shown in FIG. 9 was plotted on the supposition that the infrared ray starts impinging on the conventional infrared sensor (representing a comparative example with the conventional structure shown in FIG. 9) at the same time.

Figure 8C:
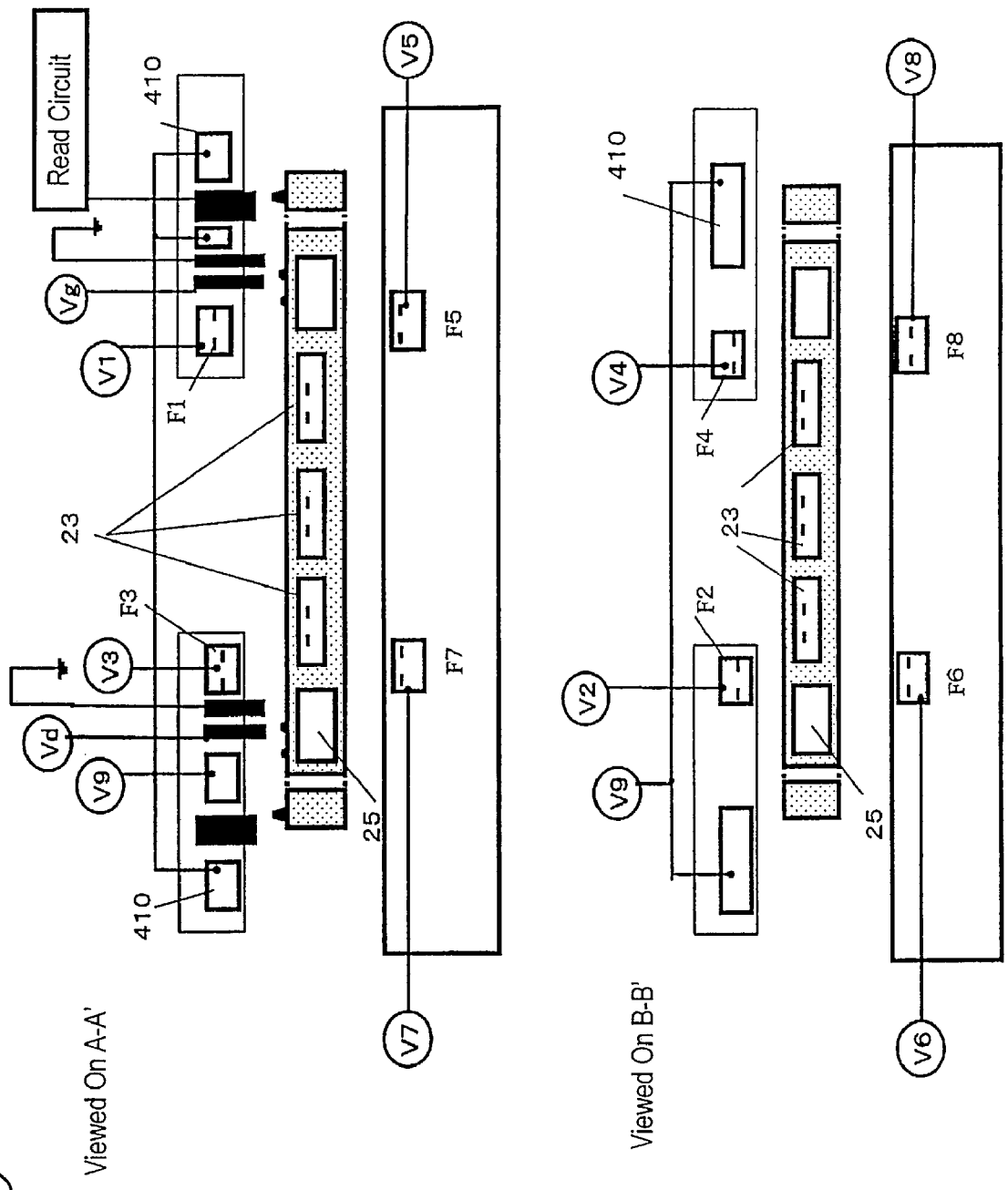
FIG. 8C shows how the heat sensing section changes its positions as the electric circuit of the present invention operates.

At a time t4 when the infrared sensor is in the state shown in FIG. 8C, a large positive voltage is applied to the variable voltage supplies V1 and V3, a negative voltage is applied to the variable voltage supplies V5, V6, V7 and V8, and a small negative voltage is applied to the variable voltage supplies V2 and V4. Then, strong attractive force is produced between the electrodes F1 and F3 of the upper uplifting electrode portion 41 and the charge storage portions 23 of the heat sensing section 13, while repulsive force is produced between the electrode F5, F6, F7 and F8 of the lower uplifting electrode portion 52 and the charge storage portions 23 of the heat sensing section 13. As a result, the heat sensing section 13 moves upward.

Figure 8D:
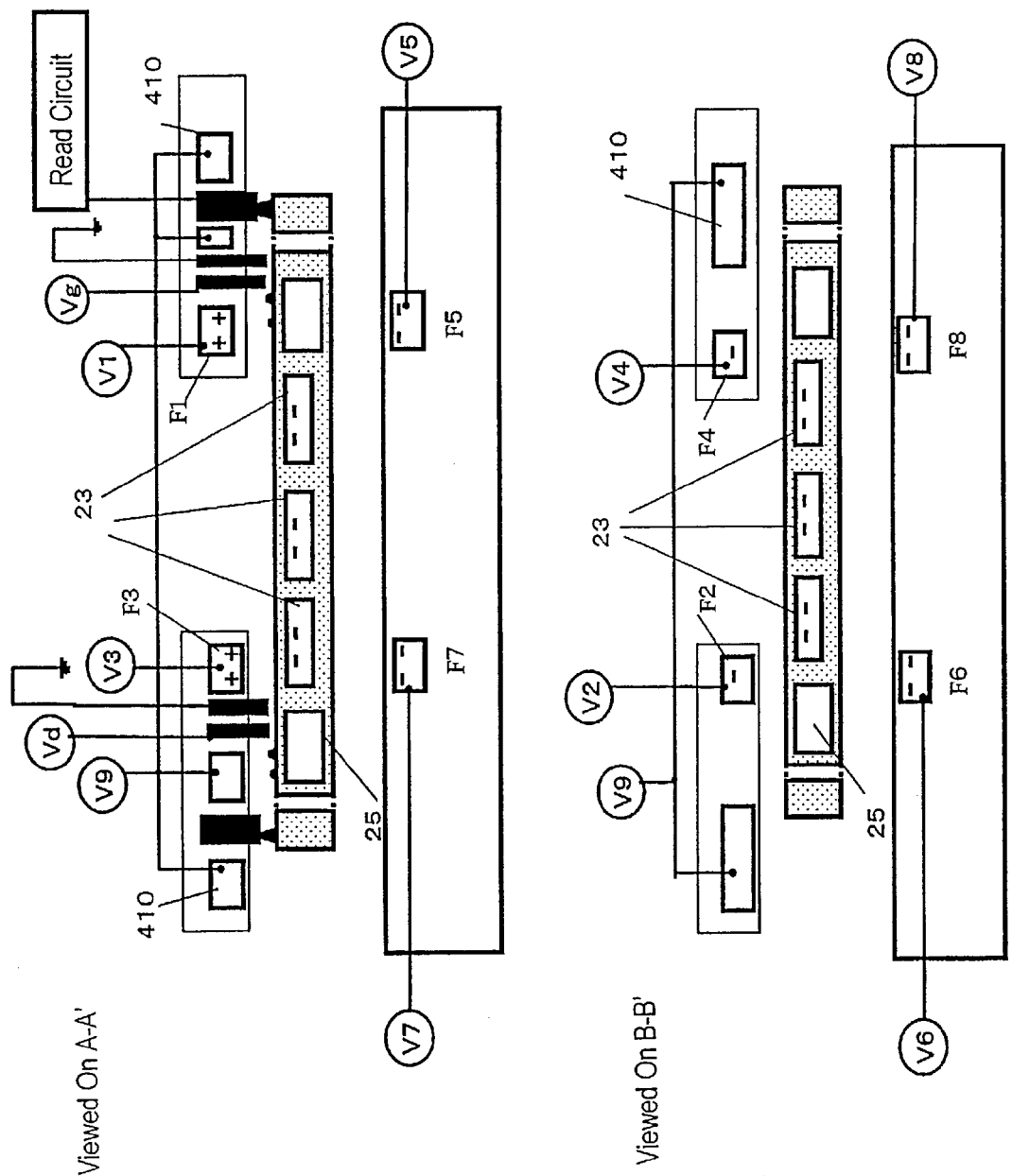
FIG. 8D shows how the heat sensing section changes its positions as the electric circuit of the present invention operates.

Once the position of the heat sensing section 13 has been detected by the method to be described in detail later, the position of the heat sensing section 13 can be adjusted such that the bolometer contact portions 24 contact with the bolometer line contact portions 42 as shown in FIG. 8D by performing a feedback control based on the detected position.

In the state shown in FIG. 8D, a small negative voltage is applied to the variable voltage supplies V2 and V4, and therefore, weak repulsive force is produced between the electrodes F2 and F4 and the charge storage portions 23. Thus, the heat sensing section 13 never contacts with the cavity wall portion 12 in those regions. As a result, the heat sensing section 13 and the cavity wall portion 12 contact with each other only between the bolometer contact portions 24 and the bolometer line contact portions 42.

The heat sensing section 13 in the state shown in FIG. 8D has shifted horizontally compared to the states shown in FIGS. 8A and 8B. In the state shown in FIG. 8D, the source contact portion 38, the drain contact portion 37, the gate contact portion 39 and the channel contact portion 310 do not contact with the source line contact portion 43, the drain line contact portion 44, the gate line contact portion 45 and the channel line contact portion 46, respectively.

The read circuit and the voltage supply V0 are connected to the bolometer line contact portions 42 (see FIG. 7). As shown in FIG. 7, the read circuit includes an integrator and a switch $SW_R$ for resetting the integrator. Another switch $SW_1$ is arranged between the bolometer line contact portions 42 and the integrator. In the initial state, the switch $SW_1$ is in OFF state and the switch $SW_R$ is in ON state. But in the state i3 shown in FIG. 8D, the switches $SW_1$ and $SW_R$ are turned ON and OFF, respectively, at a time t5.

Figure 8E:
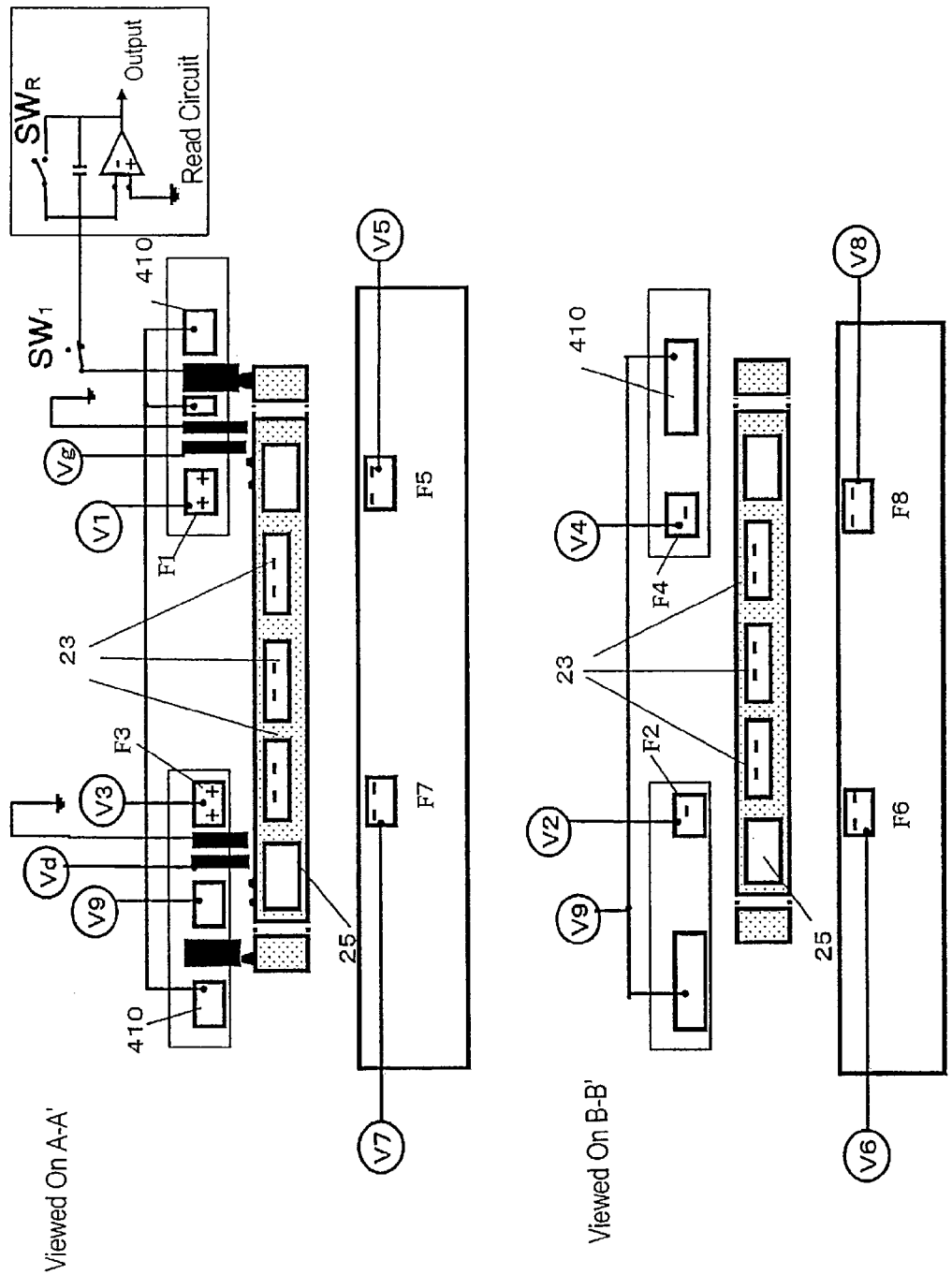
FIG. 8E shows how the heat sensing section changes its positions as the electric circuit of the present invention operates.

As a result, current starts being supplied from the peripheral circuit to the bolometer portion 21 as shown in FIG. 8E. The amount of the current is integrated by the integrator. Since the bolometer portion 21 is made of a material, of which the electrical resistance changes significantly with the temperature, the temperature of the bolometer can be calculated by measuring the amount of current flowing through the bolometer portion 21. The temperature of the bolometer portion 21 also changes with the intensity of the incoming infrared ray, and therefore, the intensity of the incoming infrared ray can also be detected. Even in the infrared sensor of the comparative example shown in FIG. 9, current is also supposed to start being supplied to the bolometer portion and the integrator is also supposed to start integrating at the time t5.

At a time t6 when the infrared sensor is in the state shown in FIG. 8E, the switches $SW_1$ and $SW_R$ are turned OFF and ON, respectively. Then, the current stops being supplied to the bolometer portion 21 and the integrator is reset as shown in FIG. 8F. In the infrared sensor representing the comparative example, the current is also supposed to stop being supplied to the bolometer portion 21 at the time t6. In the interval between the times t5 and t6, the amounts of current flowing through the bolometer portion 21 are integrated and the resultant integral is output. Although not shown, the value of the read circuit is sampled and held just before the time t6 and the intensity of the incoming infrared ray is calculated based on that value.

Next, the variation in the temperature of the heat sensing section 13 will be described with reference to FIG. 9 again.

In the period from the time t0 through the time t3, no infrared ray has been incident yet and the temperature of the heat sensing section 13 is kept equal to that of the external environment. In the interval between the times t3 and t4, however, the temperature of the heat sensing section 13 increases due to the incidence of an infrared ray. In this preferred embodiment, however, the heat sensing section 13 is out of contact with the cavity wall portion 12 and the substrate portion 11, and therefore, the heat escapes from the heat sensing section 13 as radiated heat and as a gas. That is why the increase in temperature in this preferred embodiment is much greater than in the comparative example and the temperature of the heat sensing section changes significantly with the intensity of the incoming infrared ray.

In the period from the time t4 through the time t5, the bolometer contact portions 24 contact with the bolometer line contact portions 42 and a greater quantity of heat escapes. As a result, the temperature of the heat sensing section 13 decreases. In the comparative example, on the other hand, the temperature of the heat sensing section 13 keeps rising slowly as in the interval between the times t3 and t4.

In the period from the time t5 through the time t6, current is supplied to the bolometer portion 21, and therefore, the temperature of the heat sensing section 13 rises steeply due to the Joule heat generated. The temperature of the heat sensing section 13 changes differently according to the intensity of the incoming infrared ray, and the amount of current flowing through the bolometer portion 21 is determined by the temperature of the heat sensing section 13. That is why the integrated value of the amount of current flowing through the bolometer in the interval between the times t5 and t6 changes with the intensity of the incoming infrared ray. Thus, the variation in the integrated value of the amount of current flowing through the bolometer in the interval between the times t5 and t6 is used as a signal value representing the intensity of the incoming infrared ray.

According to this preferred embodiment, by raising the heat sensing section 13 before current is supplied to the bolometer portion 21, the variation in the temperature of the heat sensing section 13 is increased. As a result, the signal value representing the intensity of the incoming infrared ray also increases, and eventually the infrared sensitivity can be increased.

That is to say, by making the bolometer contact portions 24 and the bolometer line contact portions 42 out of contact with each other before current is supplied to the bolometer portion 21, the quantity of heat escaping from the heat sensing section 13 to the external environment can be reduced. Also, when current starts being supplied to the bolometer portion 21, the bolometer contact portions 24 and the bolometer line contact portions 42 come into contact with each other, thus reading a signal.

By performing the operation described above, the temperature of the heat sensing section 13 varies more significantly in response to an incoming infrared ray, and the infrared sensitivity can be increased as a result.

According to the method disclosed in Patent Document No. 2, a number of electrical switches are turned ON and OFF electrically between the heat sensing section and an external circuit but never perform the operation of repeatedly coming into contact, and getting out of contact, with each other as is done by the contact portions of the present invention. For that reason, the electrical switches disclosed in Patent Document No. 2 cannot achieve the effect of increasing the infrared sensitivity by reducing the quantity of heat escaping from the heat sensing section to the external environment.

From the time t6 on, current is no longer supplied to the bolometer section 21. As a result, the temperature of the heat sensing section 13 drops and hardly varies anymore. After that, the operations that have been performed since the time t3 are repeatedly performed by raising the heat sensing section 13 again. FIG. 9 shows not only how the temperature of the heat sensing section has varied since the time t6 but also how the temperature of the heat sensing section would vary from the time t6 on if current were continuously supplied to the bolometer and integrated together.

The integration time between the times t5 and t6 may be defined as follows. Suppose the thermal conductance from the heat sensing section 13 toward the external environment during the integration is $5 \times 10^{-7}$ W/K and the heat capacity of the heat sensing section 13 is $2.5 \times 10^{-9}$ J/K, for example. In that case, the thermal time constant is 5 msec. That is why even if the integration time were increased to more than 5 msec, the temperature of the heat sensing section 13 would settle at a substantially constant value and the sensitivity could not be increased significantly. On the other hand, to shorten the response time to the incoming infrared ray, the integration time is preferably shortened. Thus, the integration time could be defined to be 5 msec, for example.

The duration in which the heat sensing section 13 stays in contact with the contact portions of the cavity wall portion 12 and connected to the circuit changes according to the size of the heat sensing section 13 and the type of the infrared detecting section, but may be in the range of 1 μsec to 10 msec, for example.

Hereinafter, the method of detecting the position of the heat sensing section 13 will be described. The position of the heat sensing section 13 is detected by the upper and lower position detecting electrode portions 261 and 262 of the heat sensing section 13, the upper position detecting counter electrode portion 263 of the cavity wall portion 12 and the lower position detecting counter electrode portion 264 of the substrate portion 11.

First, the configuration and functions of the upper and lower position detecting electrode portions 261 and 262 will be described with reference to FIG. 10.

Figure 10:
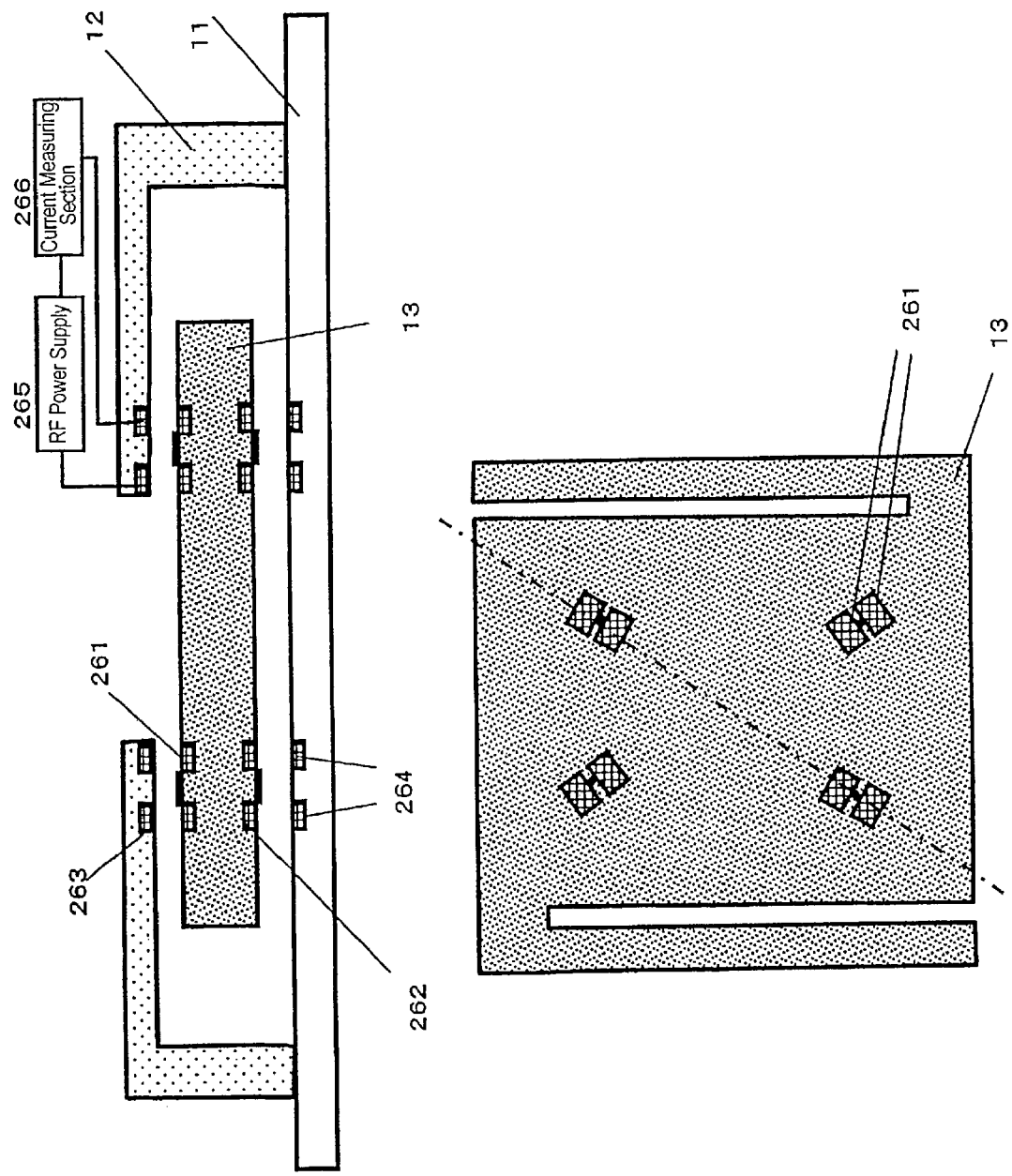
FIG. 10 shows a method for detecting the position of the heat sensing section of the present invention.

As shown in FIG. 10, the upper position detecting electrode portion 261 consists of eight electrodes in total, each of which may be made of polysilicon that has been heavily doped with dopant ions. Two adjacent ones of these eight electrodes are connected together with an electric line and have an equal potential level. The lower position detecting electrode portion 262 has the same configuration as the upper position detecting electrode portion 261.

As shown in FIG. 4(b), the upper position detecting counter electrode portion 263 of the cavity wall portion 12 consists of eight electrodes in total, each of which may be made of polysilicon that has been heavily doped with dopant ions. In the upper position detecting counter electrode portion 263, two adjacent ones of these eight electrodes are connected together with an electric line by way of an RF power supply and a current measuring portion as shown in FIG. 10. The respective electrodes of the upper position detecting counter electrode portion 263 are arranged so as to face their associated electrodes of the upper position detecting electrode portion 261. And these two groups of electrodes form a single capacitor.

Figure 11:
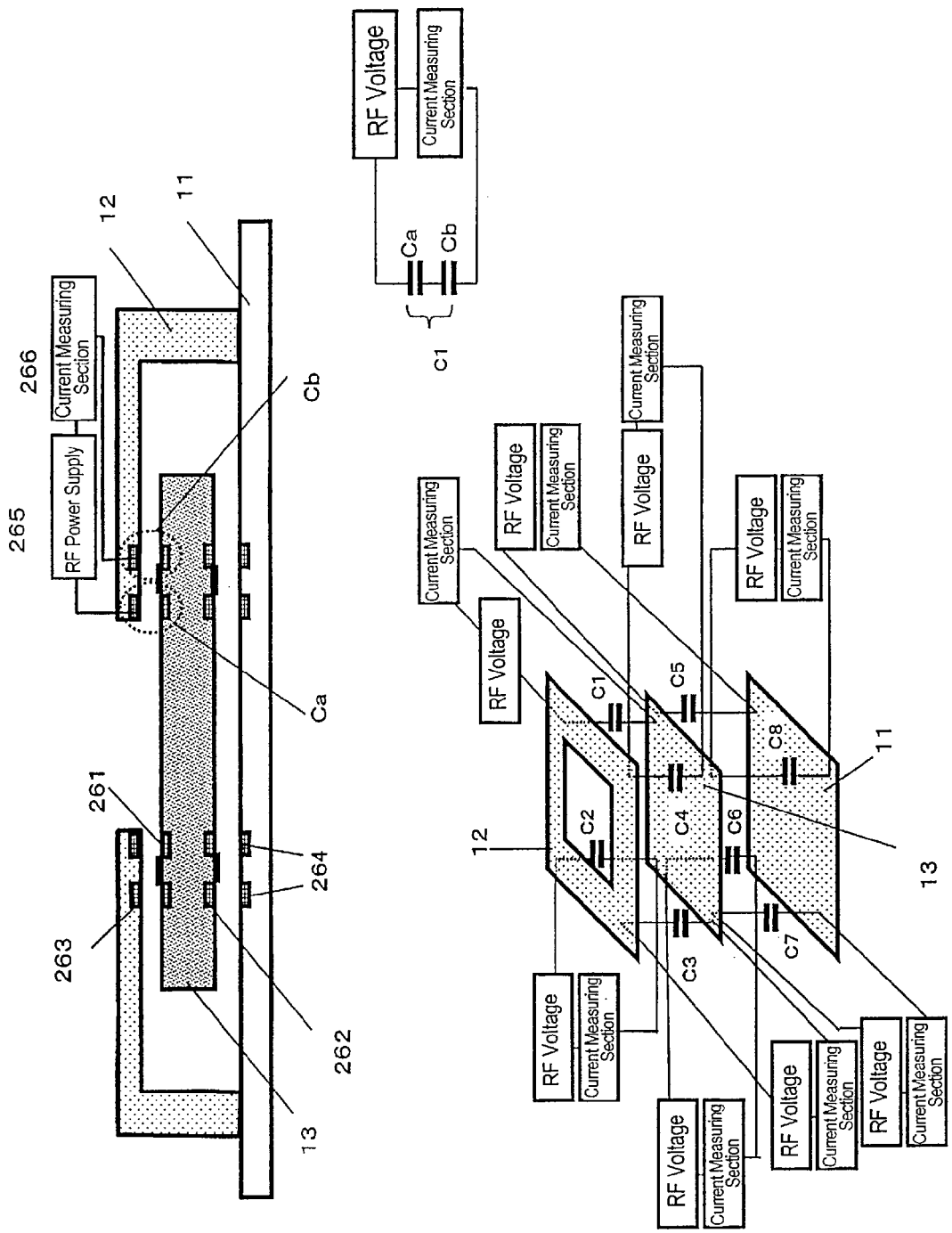
FIG. 11 illustrates an electric circuit including an upper position detecting electrode portion and an upper position detecting counter electrode portion according to the present invention.

A pair of electrodes in the upper position detecting electrode portion 261 and an associated pair of electrodes, an RF power supply and a current detecting section in the upper position detecting counter electrode portion 263 together form the electric circuit shown in FIG. 11. Capacitors Ca and Cb are formed between two pairs of opposed electrodes of the upper position detecting electrode portion 261 and the upper position detecting counter electrode portion 263. An electrostatic capacitance C1 formed by connecting these capacitors Ca and Cb in series together can be calculated by measuring the amount of current flowing through this circuit when an RF voltage is applied thereto.

Referring back to FIG. 10, the capacitors formed between the electrodes of the upper position detecting electrode portion 261 and their associated electrodes of the upper position detecting counter electrode portion 263 define electrostatic capacitances C2, C3 and C4 as well as the electrostatic capacitance C1 described above. And the values of these capacitances C2, C3 and C4 can be measured by the method described above.

The lower position detecting counter electrode portion 264 has the same configuration as the upper position detecting counter electrode portion 263 and the capacitors formed between the electrodes of the lower position detecting electrode portion 262 and their associated electrodes of the lower position detecting counter electrode portion 264 define electrostatic capacitances C5, C6, C7 and C8. And the values of these capacitances C5, C6, C7 and C8 can be measured by the method described above (see FIG. 11).

The electrostatic capacitances C1 through C8 change with the position of the heat sensing section 13. That is to say, each of the electrostatic capacitances C1 through C8 can be represented as a function of six variables representing the displacement and angle of rotation of the heat sensing section. If these functions are calculated in advance, then the position of the heat sensing section 13 can be sensed by detecting the values of the electrostatic capacitances C1 through C8.

Optionally, if the voltages applied to the upper and lower position detecting counter electrode portions 263 and 264 had a high frequency that is equal to or greater than a certain value, the displacement of the heat sensing section 13 due to the variation in voltage could be reduced to a negligible level.

It should be noted that according to this preferred embodiment, the heat sensing section 13 is designed so as to be out of contact with any other portion when the bolometer contact portions 24 of the heat sensing section 13 are brought into contact with the bolometer line contact portions 42 (see FIG. 8D). That is to say, the infrared sensor of this preferred embodiment is designed so as to have its overall contact point area minimized.

As shown in FIG. 2A, parts of the heat sensing section 13 that would come close to the bolometer contact portions 24 are elongated portions extending from the body of the heat sensing section 13. That is why when current is supplied to the bolometer portion 21, the escape of the heat can be minimized. As a result, the infrared responsivity can be increased.

According to this preferred embodiment, to prevent an after image of the infrared ray from being produced, when the temperature of the heat sensing section 13 substantially recovers its steady state after a sufficiently long time has passed since the supply of current was stopped, the heat sensing section 13 is raised again.

If the area of contact between the heat sensing section 13 and the cavity wall portion 12 or between the heat sensing section 13 and the substrate portion 11 is increased by controlling the position of the heat sensing section 13 after the time t6, then the temperature of the heat sensing section 13 can recover its steady state in a shorter time. By applying a positive voltage to the variable voltage supply V2, attractive force can be produced between the electrode F2 and the charge storage portions 23 and the heat sensing section 13 can be brought into contact with the cavity wall portion 12 at the electrode F2. Alternatively, that interval can also be shortened by applying negative voltages to the variable voltage supplies V1 through V4 and positive voltages to the variable voltage supplies V5 through V8 to bring the heat sensing section 13 into contact with the substrate portion 11 in a broad area.

Manufacturing Process

Hereinafter, a preferred embodiment of a method for fabricating an electronic device according to the present invention will be described with reference to FIGS. 12A through 12K.

Figure 12A:
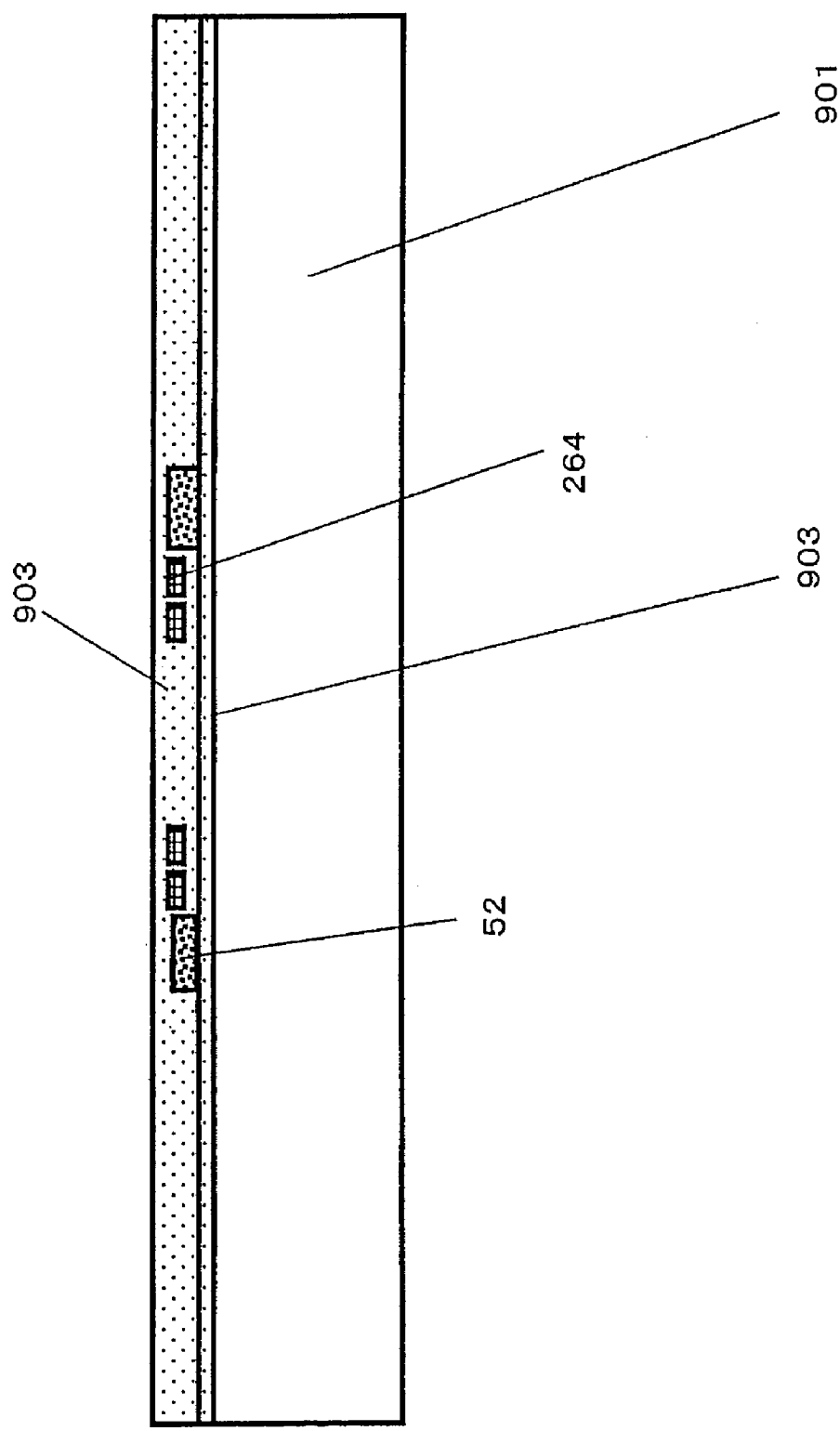
FIG. 12A is a cross-sectional view illustrating a manufacturing process step to make an electronic device according to the present invention.

First, the substrate portion 11 shown in FIG. 12A is prepared. Specifically, first, a silicon substrate 901 is provided and a substrate protective coating 903 of silicon dioxide is deposited on the silicon substrate 901. The substrate protective coating 903 may be deposited by a CVD process, for example.

Next, a lower uplifting electrode portion 52 and lower position detecting counter electrode portions 264 are formed. These electrode portions 52 and 264 can be formed by depositing a polysilicon film and then patterning the polysilicon film by photolithographic and etching processes. The planar layout of the lower uplifting electrode portion 52 and the lower position detecting counter electrode portions 264 is as shown in FIG. 5(b).

Subsequently, a silicon dioxide film is deposited over the silicon substrate 901 so as to cover the lower uplifting electrode portion 52 and the lower position detecting counter electrode portions 264, and then has its surface planarized by a CMP (chemical mechanical polishing) process. The planarized silicon dioxide film and the silicon dioxide film that is already present under the electrode portions 52 and 234 together form the substrate protective coating 903. In this manner, the substrate portion 11 shown in FIG. 12A can be obtained.

Figure 12C:
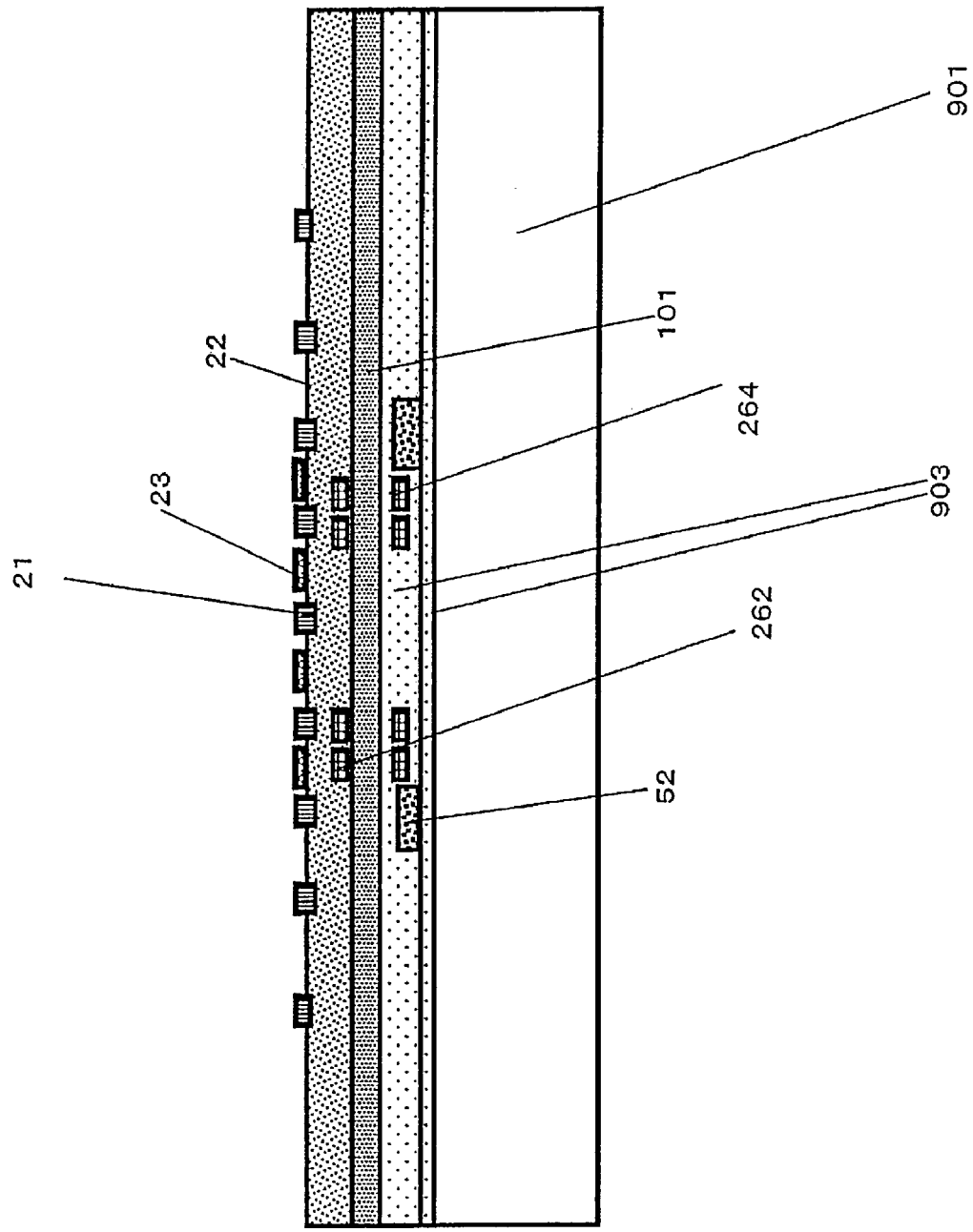
FIG. 12C is a cross-sectional view illustrating another manufacturing process step to make the electronic device of the present invention.

Thereafter, as shown in FIG. 12B, a sacrificial layer 101 of polysilicon is formed over the substrate portion 11. Subsequently, as shown in FIG. 12C, a bolometer protective coating 22 of silicon dioxide is deposited on the sacrificial layer 101. Specifically, after lower position detecting electrode portions 262 have been formed, a silicon dioxide film is deposited so as to cover the electrode portions 262. Thereafter, a bolometer portion 21 and charge storage portions 23 are formed. The bolometer portion 21 and the charge storage portions 23 may have the planar layout shown in FIG. 2A.

Figure 12D:
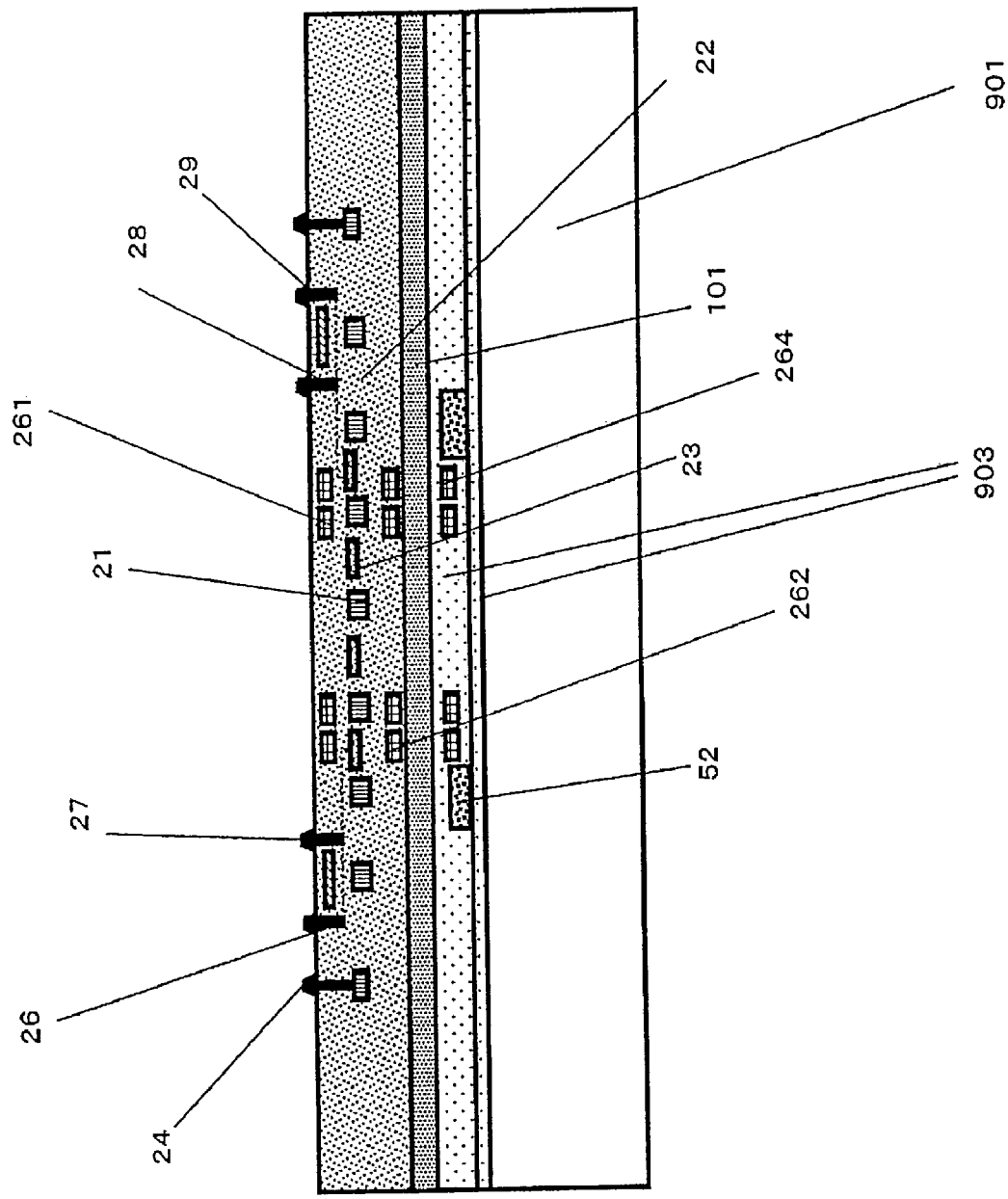
FIG. 12D is a cross-sectional view illustrating another manufacturing process step to make the electronic device of the present invention.

Then, as shown in FIG. 12D, these portions are covered with a silicon dioxide film, and an electrostatic induction electrode portion 25 and upper position detecting electrode portions 261 are formed thereon and then covered with a silicon dioxide film. The electrostatic induction electrode portion 25 and upper position detecting electrode portions 261 may have the planar layout shown in portion (b) of FIG. 2B. Thereafter, as shown in FIG. 12D, a bolometer contact portion 24, a source contact portion 26, a drain contact portion 27, a gate contact portion 28 and a channel contact portion 29 are formed at the respective positions shown in portion (b) of FIG. 2B.

Figure 12E:
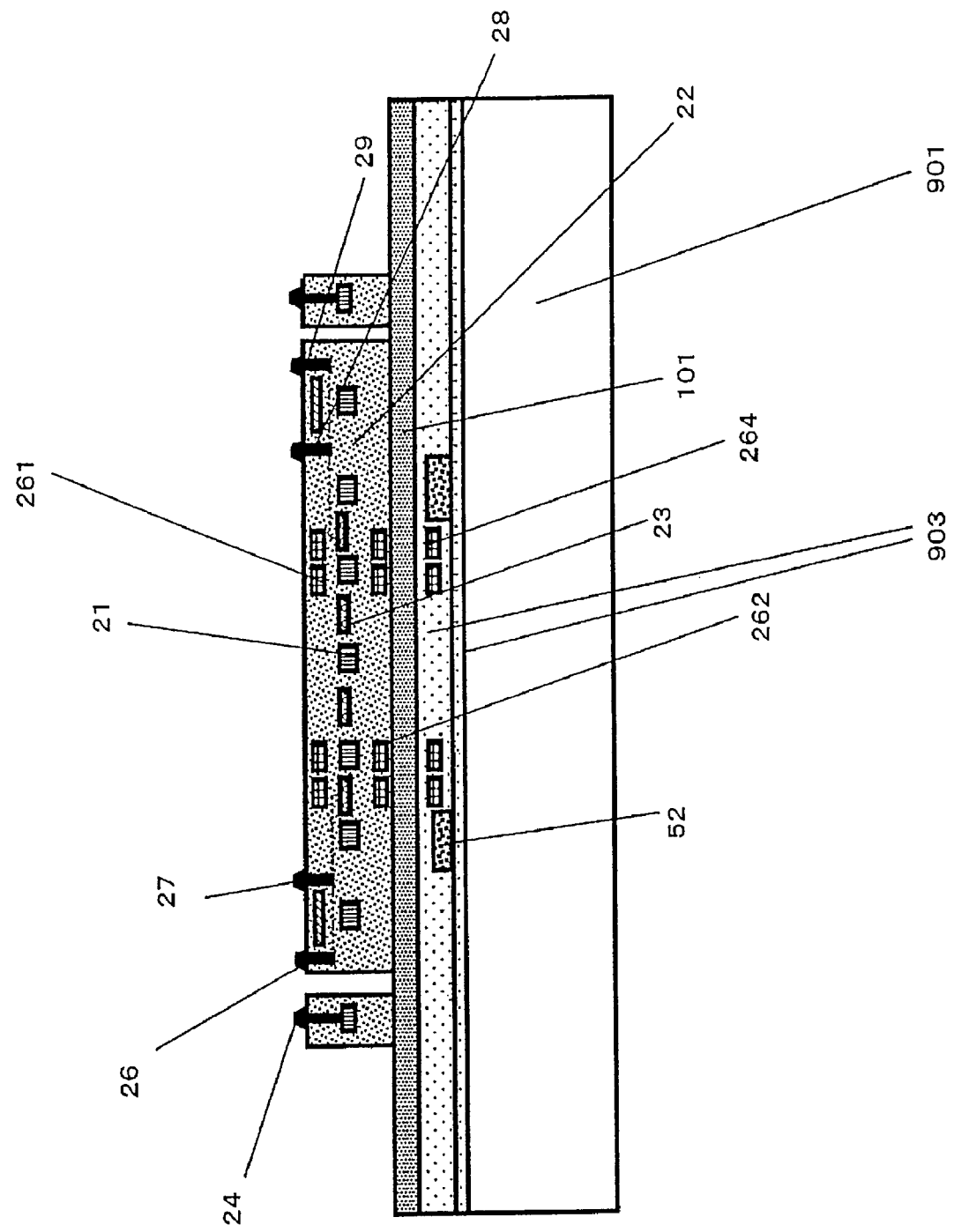
FIG. 12E is a cross-sectional view illustrating another manufacturing process step to make the electronic device of the present invention.

Next, the silicon dioxide film is patterned to obtain the structure shown in FIG. 12E. Although a method for forming a single heat sensing section 13 has been described with reference to these drawings, a lot of heat sensing sections 13 may be arranged on the same substrate portion 11 and each of the heat sensing sections 13 may be surrounded with the cavity wall portion 12. In that case, the same structures as that shown in FIG. 12E are formed in the regions that are not shown in FIG. 12E.

Subsequently, a sacrificial layer of polysilicon is deposited so as to cover all of these portions and then patterned to obtain the structure shown in FIG. 12F. In any of the process steps described above, a CMP process for planarizing the surface of a film deposited may be performed as needed.

Figure 12G:
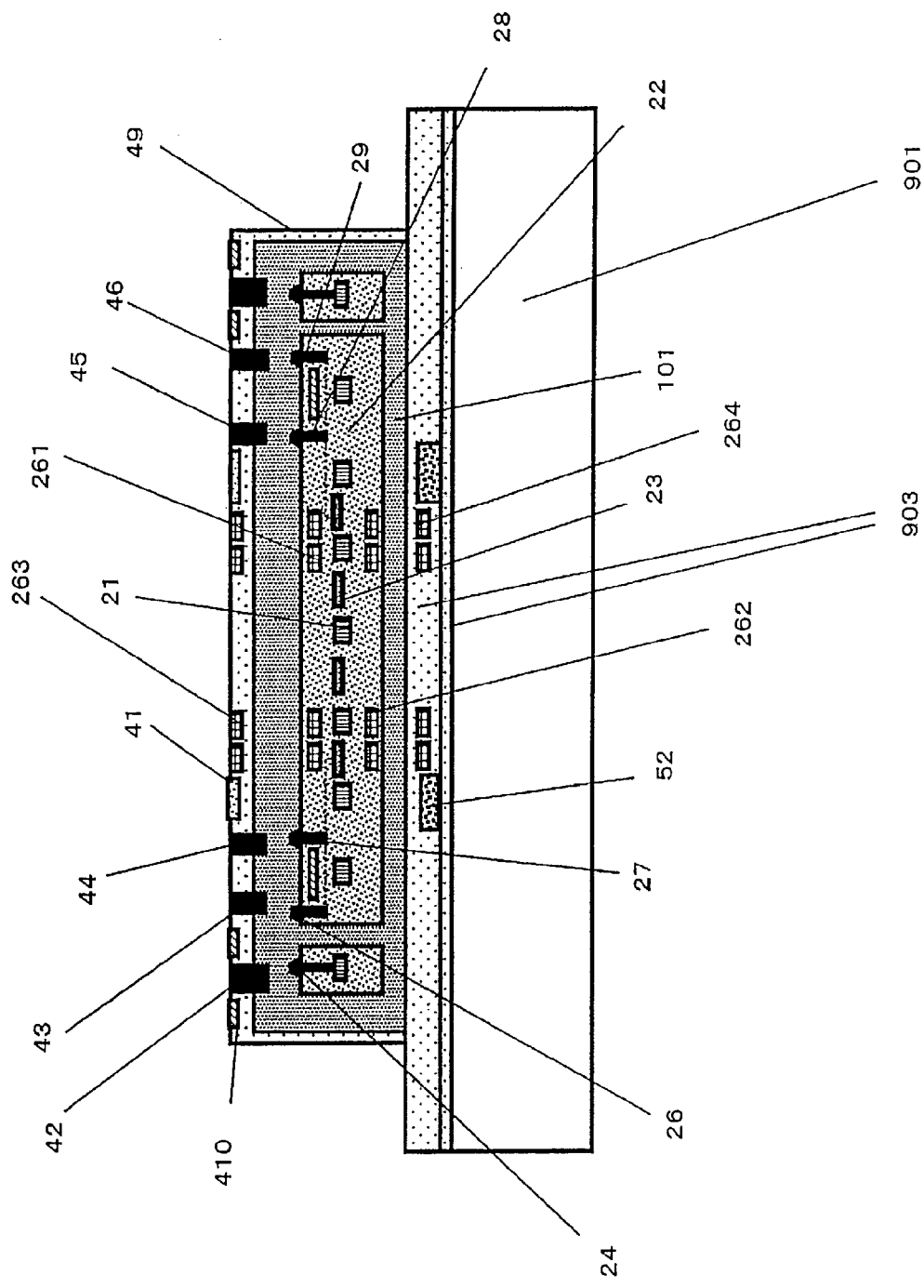
FIG. 12G is a cross-sectional view illustrating another manufacturing process step to make the electronic device of the present invention.

Next, to form a cavity wall portion 12 that covers the sacrificial layer 101 as shown in FIG. 12G, a cavity wall protective coating 49 of silicon dioxide is deposited first. Thereafter, an electrostatic induction counter electrode portion 410, an upper uplifting electrode portion 41, upper position detecting counter electrode portions 263, bolometer line contact portions 42, a source line contact portion 43, a drain line contact portion 44, a gate line contact portion 45 and a channel line contact portion 46 are formed. These electrode portions and contact portions are designed so as to be aligned with their associated electrode portions and contact portions in the heat sensing section 12.

Figure 12H:
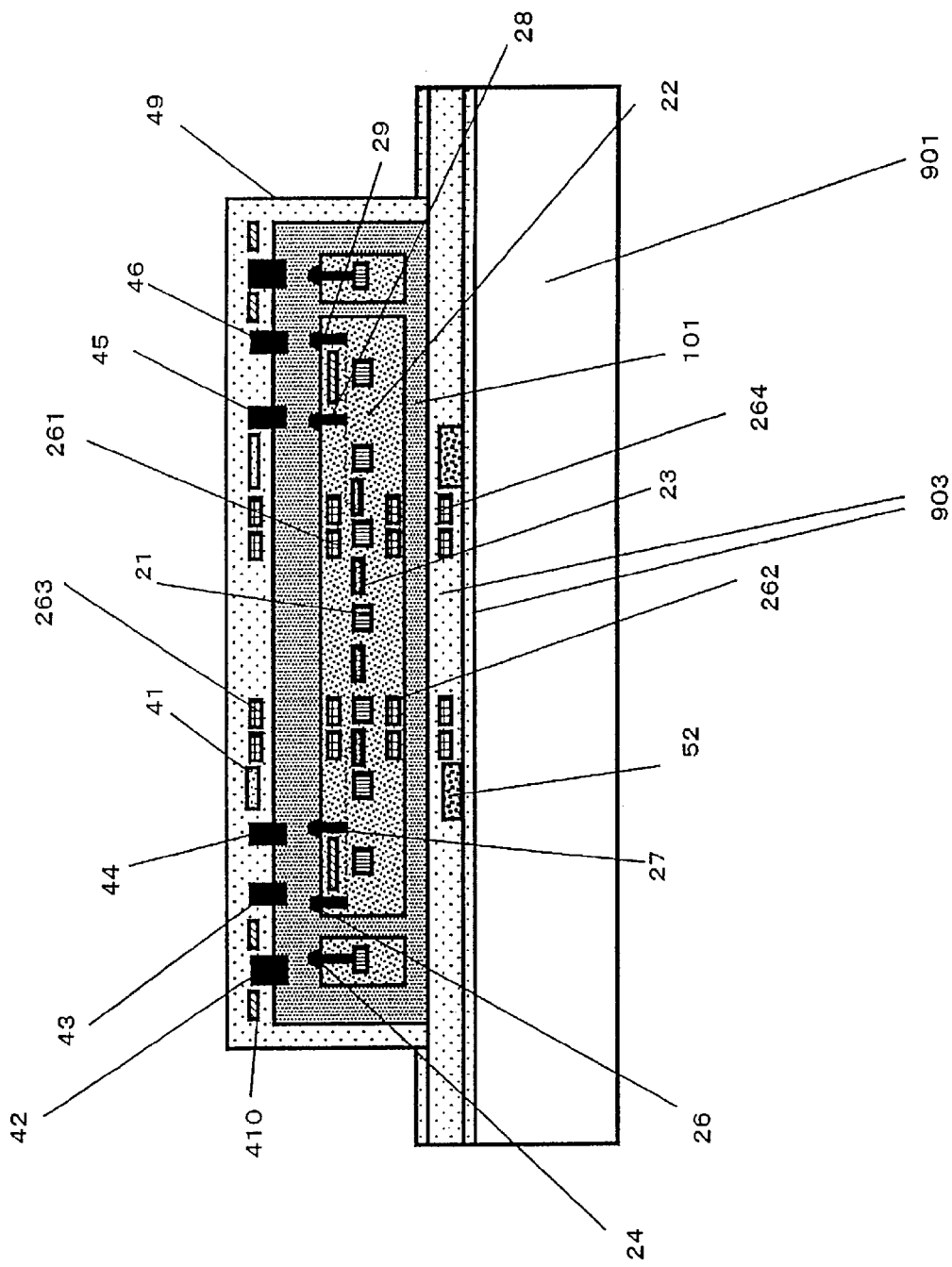
FIG. 12H is a cross-sectional view illustrating another manufacturing process step to make the electronic device of the present invention.
Figure 12I:
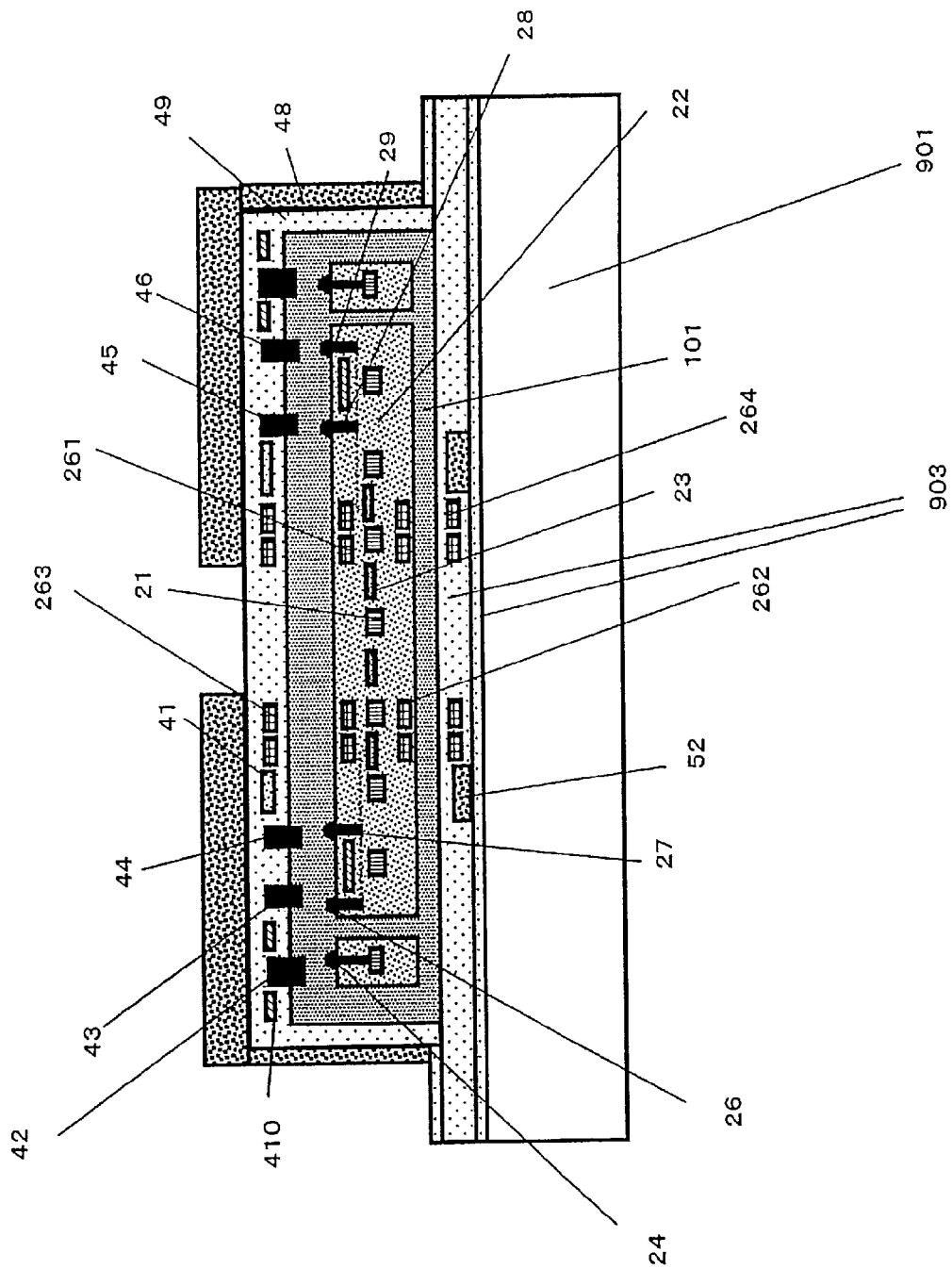
FIG. 12I is a cross-sectional view illustrating another manufacturing process step to make the electronic device of the present invention.
Figure 12J:
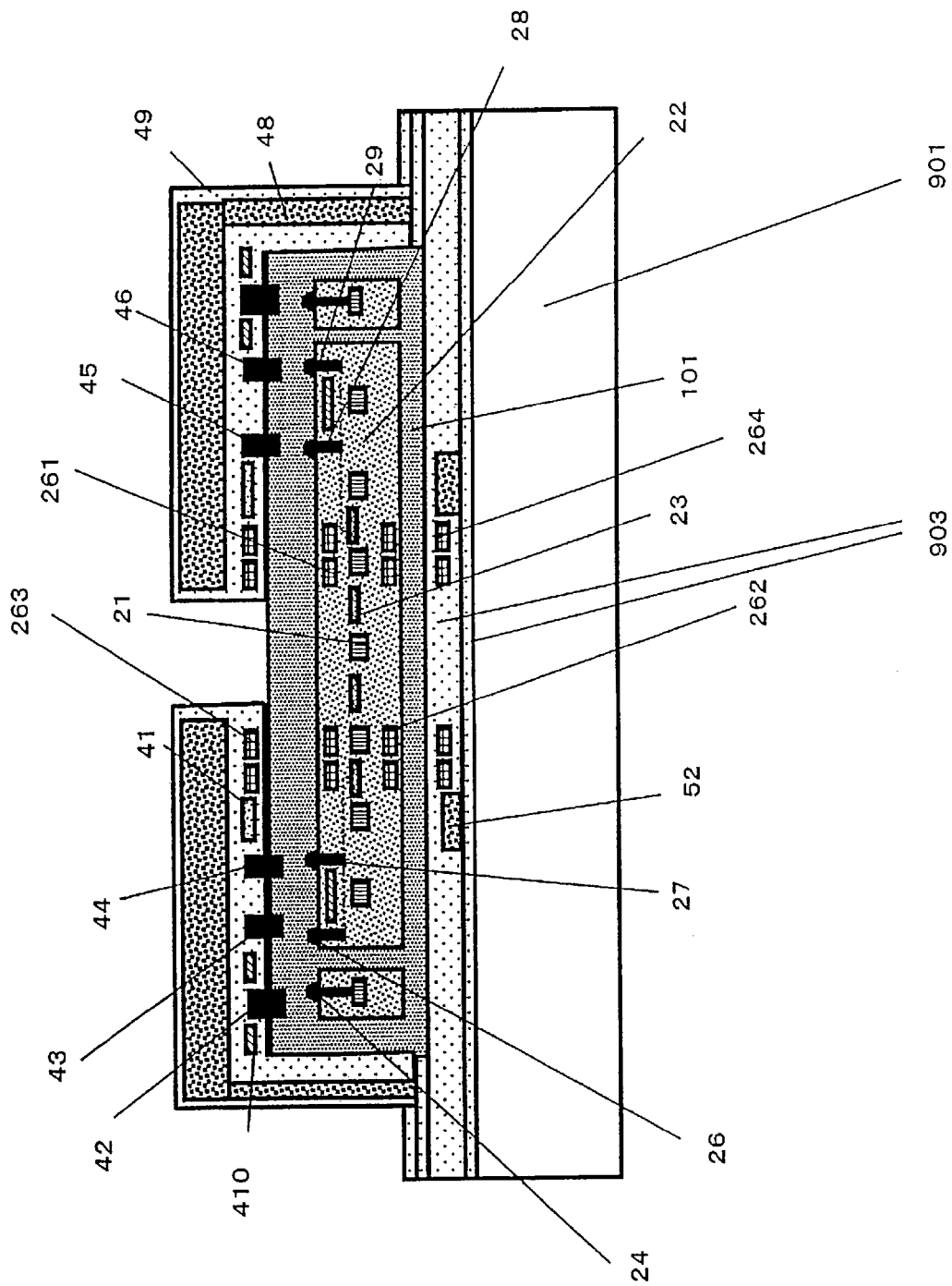
FIG. 12J is a cross-sectional view illustrating another manufacturing process step to make the electronic device of the present invention.

Then, this structure is covered with a silicon dioxide film as shown in FIG. 12H. A polysilicon film is deposited on the silicon dioxide film and then patterned, thereby forming a cavity wall silicon portion 48 as shown in FIG. 12I. Subsequently, another silicon dioxide film is deposited on the cavity wall silicon portion 48 and then patterned to obtain the structure shown in FIG. 12J. In any of the process steps described above, a CMP process for planarizing the surface of a film deposited may be performed as needed.

Figure 12K:
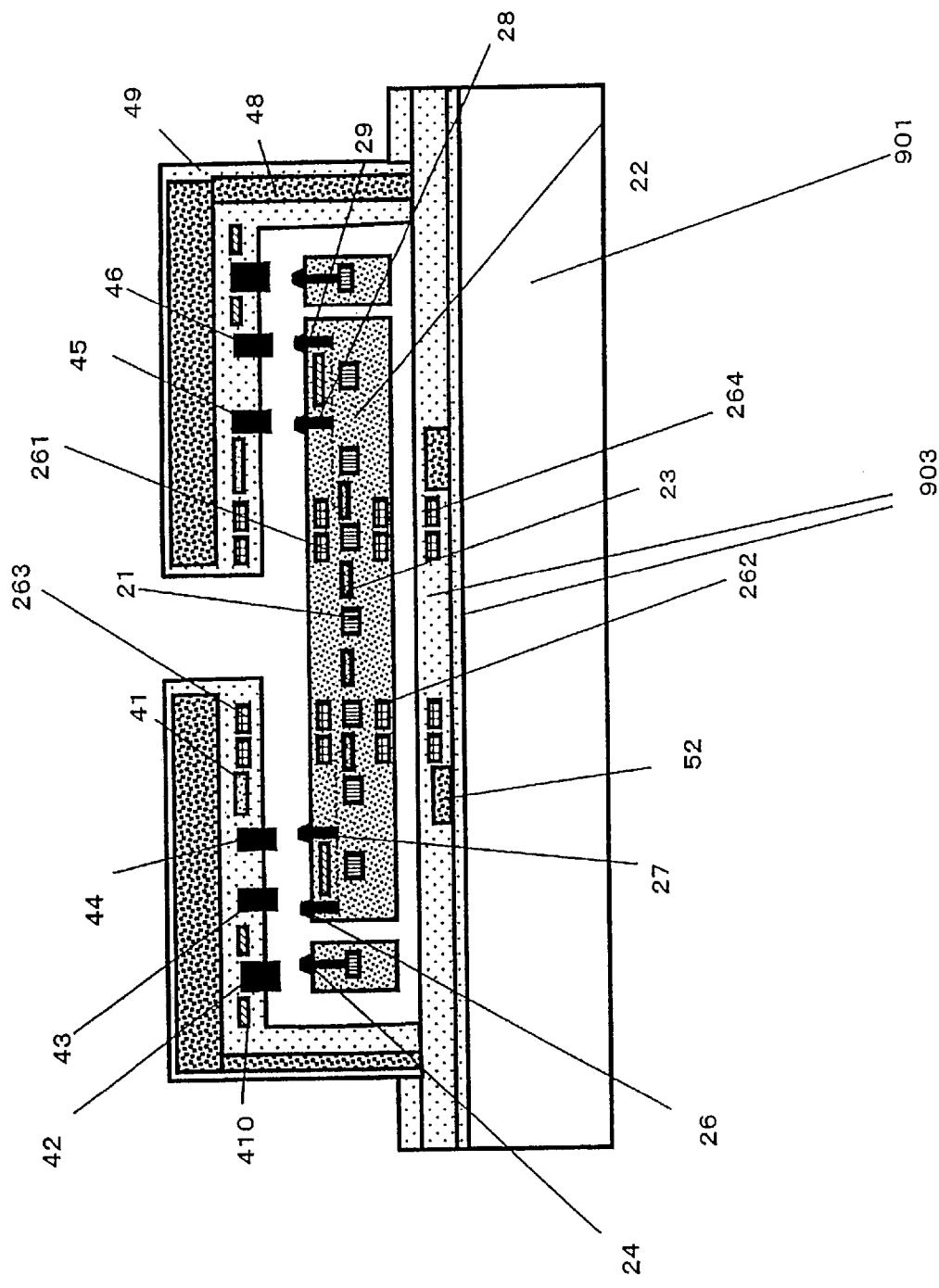
FIG. 12K is a cross-sectional view illustrating another manufacturing process step to make the electronic device of the present invention.

Finally, the sacrificial layer 101 is removed as shown in FIG. 12K. The sacrificial layer 101 could be removed by an isotropic etching process using XeFe gas, for example. When the sacrificial layer 101 is etched away, the heat sensing section 13 is separated from the substrate portion 11 and the cavity wall portion 12.

The manufacturing process described above may be carried out by techniques and equipment that are normally adopted in semiconductor device processing.

A method for fabricating an electronic device with only one heat sensing section 13 has been described. However, this method is easily applicable for use to make a line sensor or an image sensor with an array of cells.

Either the entire sensor described above, or only the cavity thereof, could be packed airtight in a vacuum package. In that case, the quantity of the heat escaping from the heat sensing section 13 through the gas can be reduced and the sensitivity can be further increased.

As viewed perpendicularly to the substrate portion 11, each charge storage element 31 is arranged so as not to overlap with the electrostatic induction electrode portion 25 or the bolometer portion 21. If the charge storage element 31 overlapped with the electrostatic induction electrode portion 25 or the bolometer portion 21, the negative charge stored in the charge storage element 31 would cause electrostatic induction and would produce positive charge on either the surface of the electrostatic induction electrode portion 25 or that of the bolometer portion 21. In that case, most of the electric lines of force emitted from this positive charge would enter the negative charge of the charge storage element 31. Then, the electrostatic force between the charge storage element 31 and the upper uplifting electrode portion 41 or the lower uplifting electrode portion 52 would decrease too much to control the position of the heat sensing section 13 as intended. To avoid such a situation, according to this preferred embodiment, the charge storage element 31 is arranged so as not to overlap with the electrostatic induction electrode portion 25 or the bolometer portion 21 as viewed perpendicularly to the substrate.

The respective electric lines and contact portions are preferably made of a metal. But as these lines and portions are arranged on the periphery of the heat sensing section 13 and the cavity wall portion 12, the metal does not cut off the infrared ray so much, and the infrared responsivity can be kept high.

Optionally, to prevent the heat sensing section 13 from changing its positions due to a variation in external voltage when the heat sensing section 13 is moved by applying voltages to the upper and lower uplifting electrode portions 41 and 52, electrodes may be arranged around the upper and lower uplifting electrode portions 41 and 52 and the voltages at these surrounding electrodes may always kept equal to zero such that the influence of the variation in the external voltage is reduced.

In the preferred embodiment described above, an electrode for detecting the position of the heat sensing section 13 and an electrode for changing the positions of the heat sensing section 13 are provided separately. However, a configuration in which a single electrode performs both of these functions may also be adopted. In that case, a single electrode is connected to an RF voltage source to detect the position of the heat sensing section 13 and to a DC power supply to change the positions of the heat sensing section 13.

The electrostatic force for raising the heat sensing section 13 may have a magnitude of about $1 \times 10^{-8}$ N. Supposing the heat sensing section 13 has a mass of $1 \times 10^{-12}$ kg, for example, when an acceleration of 100 G, which is 100 times as large as the acceleration of gravity, is produced in the device, inertial force of about $1 \times 10^{-9}$ N will be produced in the heat sensing section 13. Under the inertial force of such magnitude, the heat sensing section 13 can be held with stability.

In the preferred embodiment described above, the repulsive force of the electrostatic force is used to raise the heat sensing section 13. However, the shorter the distance, the greater this repulsive force. That is why if the heat sensing section 13 has moved from an equilibrium position due to the application of acceleration to the device, for example, then restitution force will be produced to cause the heat sensing section 13 to go back to its position of equilibrium. For that reason, the heat sensing section 13 can be kept raised with stability by a relatively simple control method.

Embodiment 2

Hereinafter, a second preferred embodiment of an electronic device according to the present invention will be described as an infrared sensor. In this preferred embodiment, the position of the heat sensing section 13 is controlled using the electrostatic force of electric charge that has been produced in the heat sensing section 13 as a result of electrostatic induction.

The overall configuration of the infrared sensor of this preferred embodiment is as shown in FIG. 1.

First of all, the configuration of the heat sensing section 13 of this preferred embodiment will be described with reference to FIG. 13. Specifically, FIG. 13(a) is a cross-sectional view as viewed on the plane 1b-1b shown in FIG. 1A, illustrating the configuration of the heat sensing section 13 in detail. FIG. 13(b) is a cross-sectional view as viewed on the plane 13b-13b shown in FIG. 13(a) and FIG. 13(c) is a cross-sectional view as viewed on the plane 13c-13c shown in FIG. 13(a).

Figure 13:
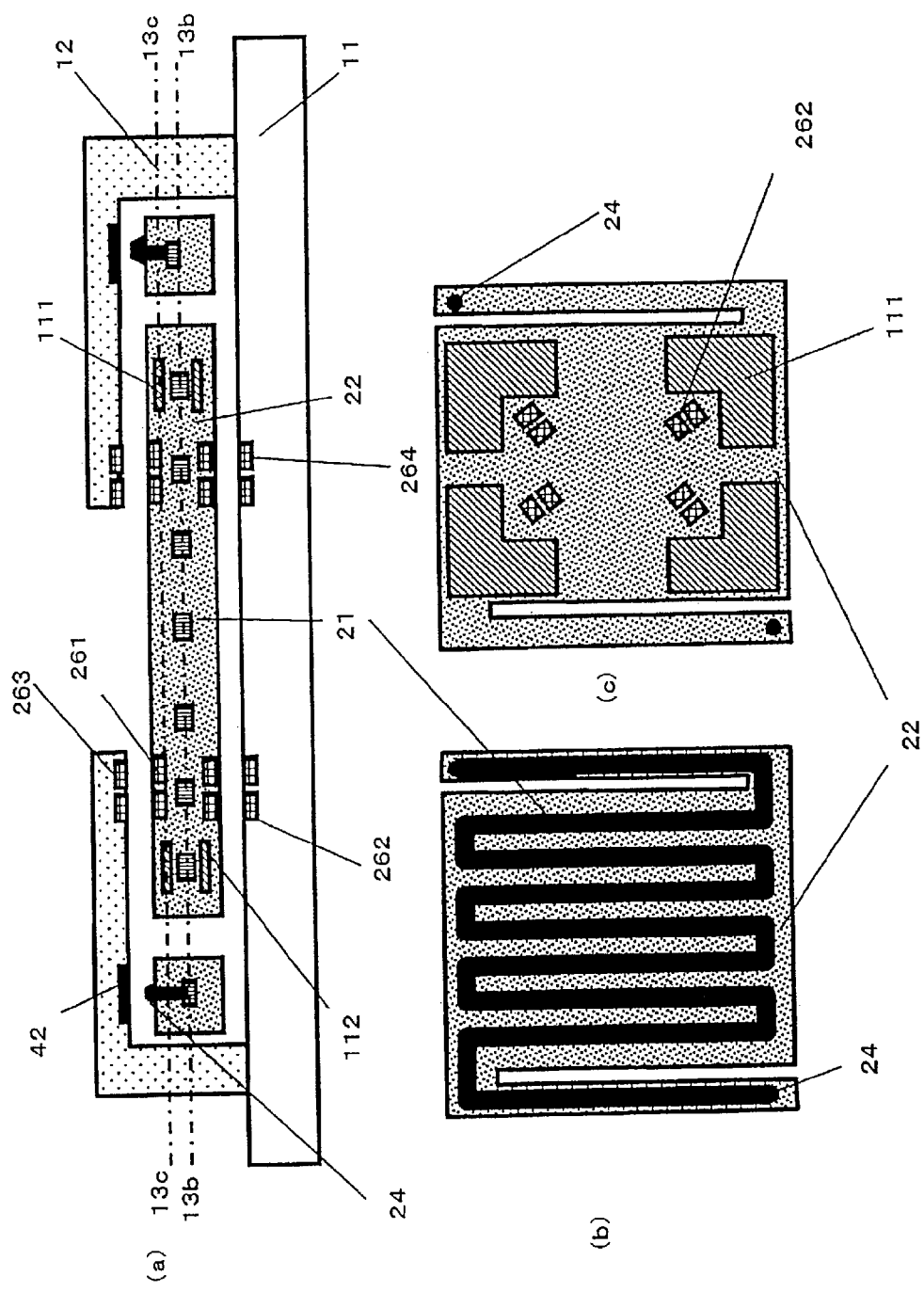
FIG. 13 illustrates a configuration for a heat sensing section according to a second preferred embodiment of the present invention.

As shown in FIG. 13, the heat sensing section 13 of this preferred embodiment includes a bolometer portion 21, a bolometer protective coating 22, a bolometer contact portion 24, an upper electrostatic induction electrode portion 111, a lower electrostatic induction electrode portion 112, an upper position detecting electrode portion 261 and a lower position detecting electrode portion 262. The bolometer portion 21, the bolometer protective coating 22 and the bolometer contact portion 24 have the same configurations and functions as their counterparts of the first preferred embodiment described above.

Figure 14:
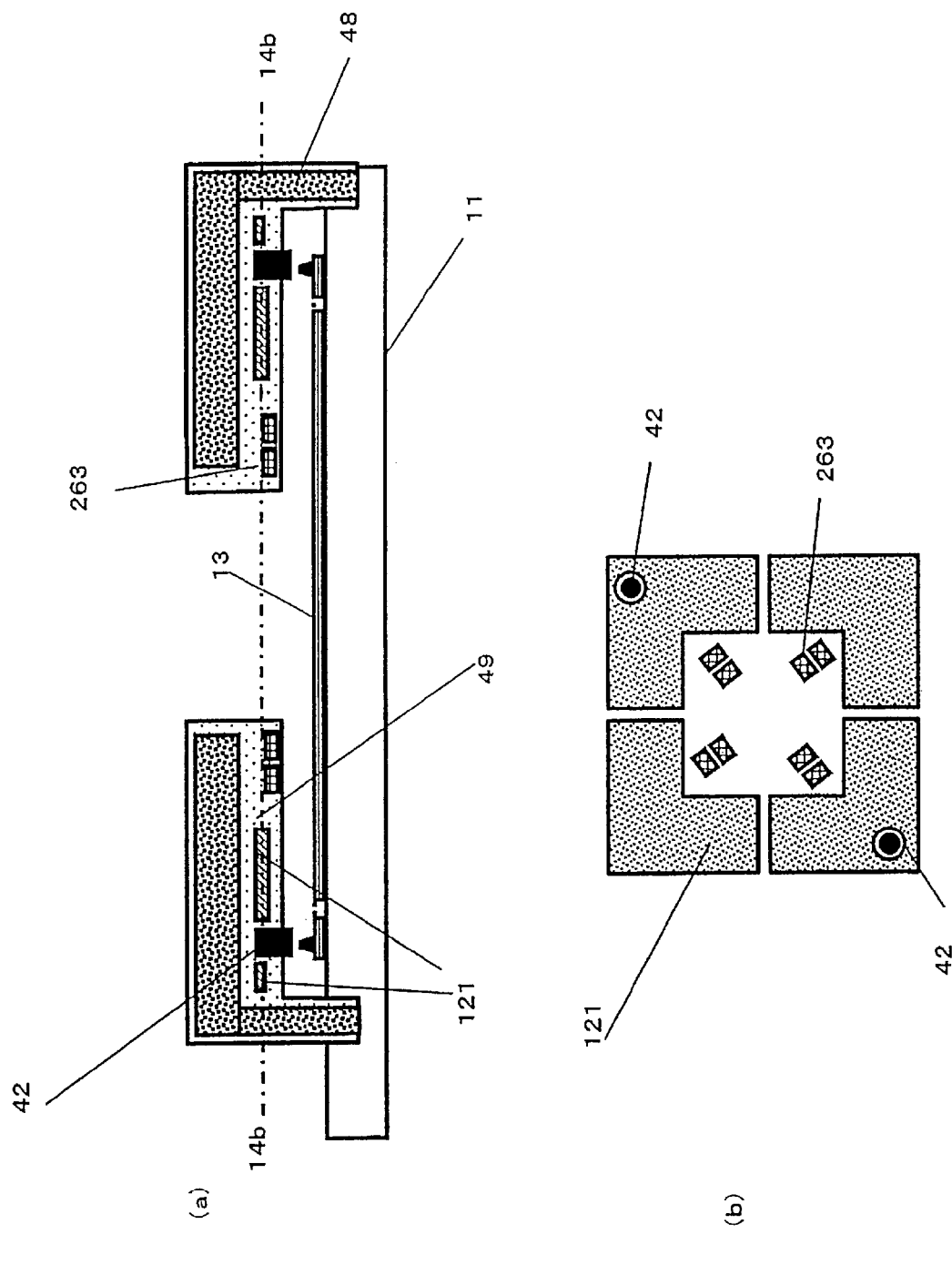
FIG. 14 illustrates a configuration for a cavity wall portion according to the second preferred embodiment of the present invention.

Next, the configuration of the cavity wall portion 12 will be described with reference to FIG. 14. Specifically, FIG. 14(a) is a cross-sectional view as viewed on the plane 1b-1b shown in FIG. 1A, and FIG. 14(b) is a cross-sectional view as viewed on the plane 14b-14b shown in FIG. 14(a).

The cavity wall portion 12 includes an upper uplifting electrode portion 41, bolometer line contact portions 42, electric lines (not shown), a cavity wall silicon portion 48, a cavity wall protective coating 49, an upper electrostatic induction counter electrode portion 121 and an upper position detecting counter electrode portion 263. The bolometer line contact portions 42, the electric lines, the cavity wall silicon portion 48, and the cavity wall protective coating 49 are the same as their counterparts of the first preferred embodiment described above.

Figure 15:
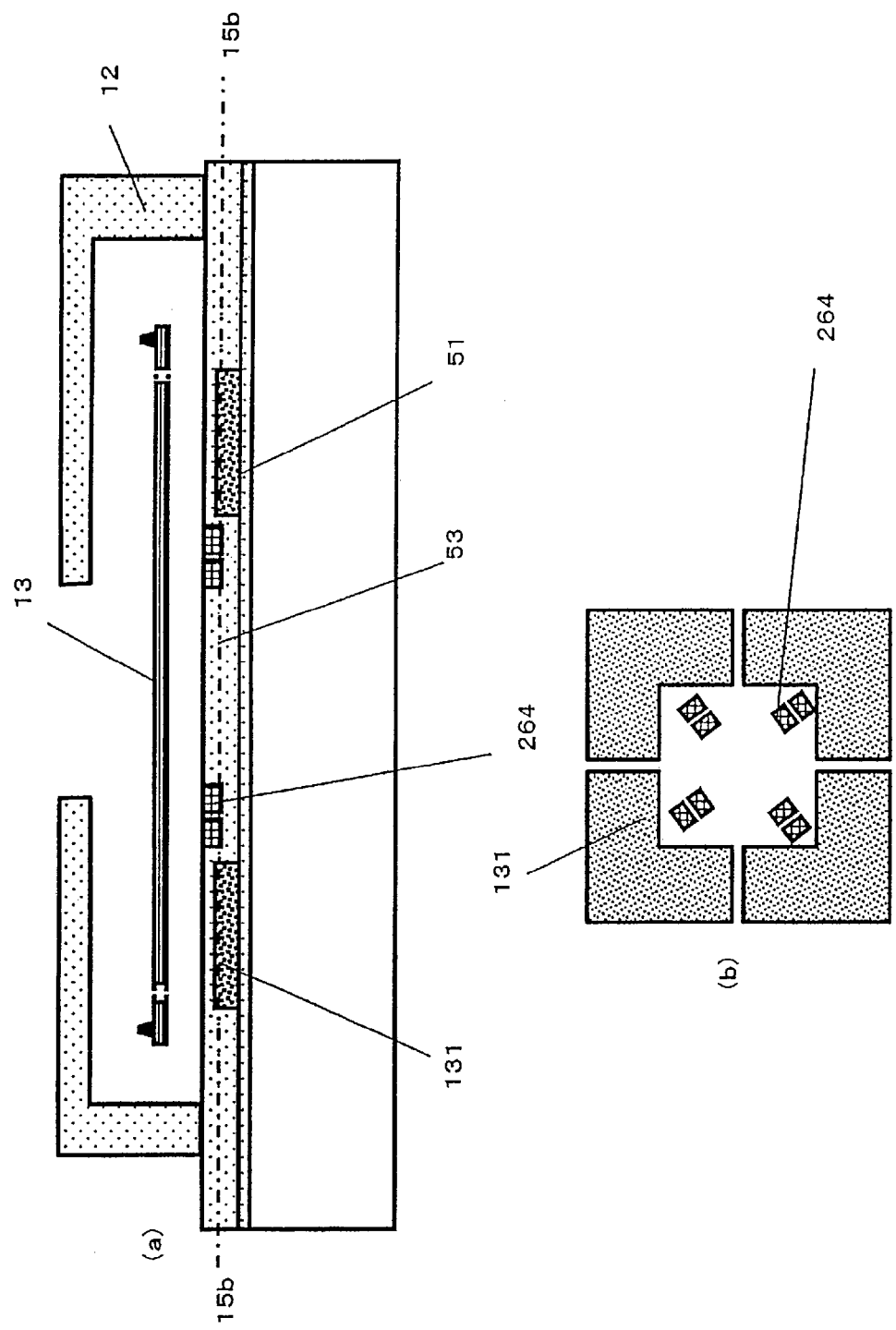
FIG. 15 illustrates a configuration for a substrate portion according to the second preferred embodiment of the present invention.

Next, the configuration of the substrate portion 11 will be described with reference to FIG. 15. Specifically, FIG. 15(a) is a cross-sectional view as viewed on the plane 1b-1b shown in FIG. 1A, illustrating the configuration of the substrate portion 11 in detail. FIG. 15(b) is a cross-sectional view as viewed on the plane 15b-15b shown in FIG. 15(a).

The substrate portion 11 includes a silicon substrate portion 51, a lower electrostatic induction counter electrode portion 131, a substrate protective coating 53 and a lower position detecting counter electrode portion 264. The silicon substrate portion 51 and the substrate protective coating 53 are the same as their counterparts of the first preferred embodiment described above.

When a positive voltage and a negative voltage are applied to the upper and lower electrostatic induction counter electrode portions 121 and 264, respectively, electrostatic induction is caused to produce negative charge in the upper electrostatic induction electrode portion 111 and positive charge in the lower electrostatic induction electrode portion 112, respectively. Then, attractive force is produced between the upper electrostatic induction electrode portion 111 and the upper electrostatic induction counter electrode portion 121 and between the lower electrostatic induction electrode portion 112 and the lower electrostatic induction counter electrode portion 246. By adjusting the magnitudes of these attractive forces, the position of the heat sensing section 13 can be controlled.

By raising the heat sensing section 13, bringing it into contact with the cavity wall portion 12 and supplying current to the bolometer repeatedly as in the first preferred embodiment described above, the intensity of the incoming infrared ray can be detected at each point in time.

To control the position of the heat sensing section 13, the position of the heat sensing section 13 needs to be detected first. The position of the heat sensing section 13 may be detected by the same method as that described for the first preferred embodiment using the upper position detecting electrode portion 261, the lower position detecting electrode portion 262, the upper position detecting counter electrode portion 263 and the lower position detecting counter electrode portion 264.

Embodiment 3

Hereinafter, a third preferred embodiment of an electronic device according to the present invention will be described.

In this preferred embodiment, the position of the heat sensing section 13 is controlled using a magnetic field that has been generated by a coil arranged on the cavity wall portion 12 and an electromagnetic force that has been produced with respect to a magnetic body included in the heat sensing section.

The electronic device of this preferred embodiment also has the same overall configuration as that shown in FIG. 1 and also includes a heat sensing section 13, a cavity wall portion 12 and a substrate portion 11.

First of all, the configuration of the heat sensing section 13 of this preferred embodiment will be described with reference to FIG. 16. Specifically, FIG. 16(a) is a cross-sectional view as viewed on the plane 1b-1b shown in FIG. 1A, illustrating the configuration of the heat sensing section 13 in detail. FIG. 16(b) is a cross-sectional view as viewed on the plane 16b-16b shown in FIG. 16(a) and FIG. 16(c) is a cross-sectional view as viewed on the plane 16c-16c shown in FIG. 16(a).

Figure 16:
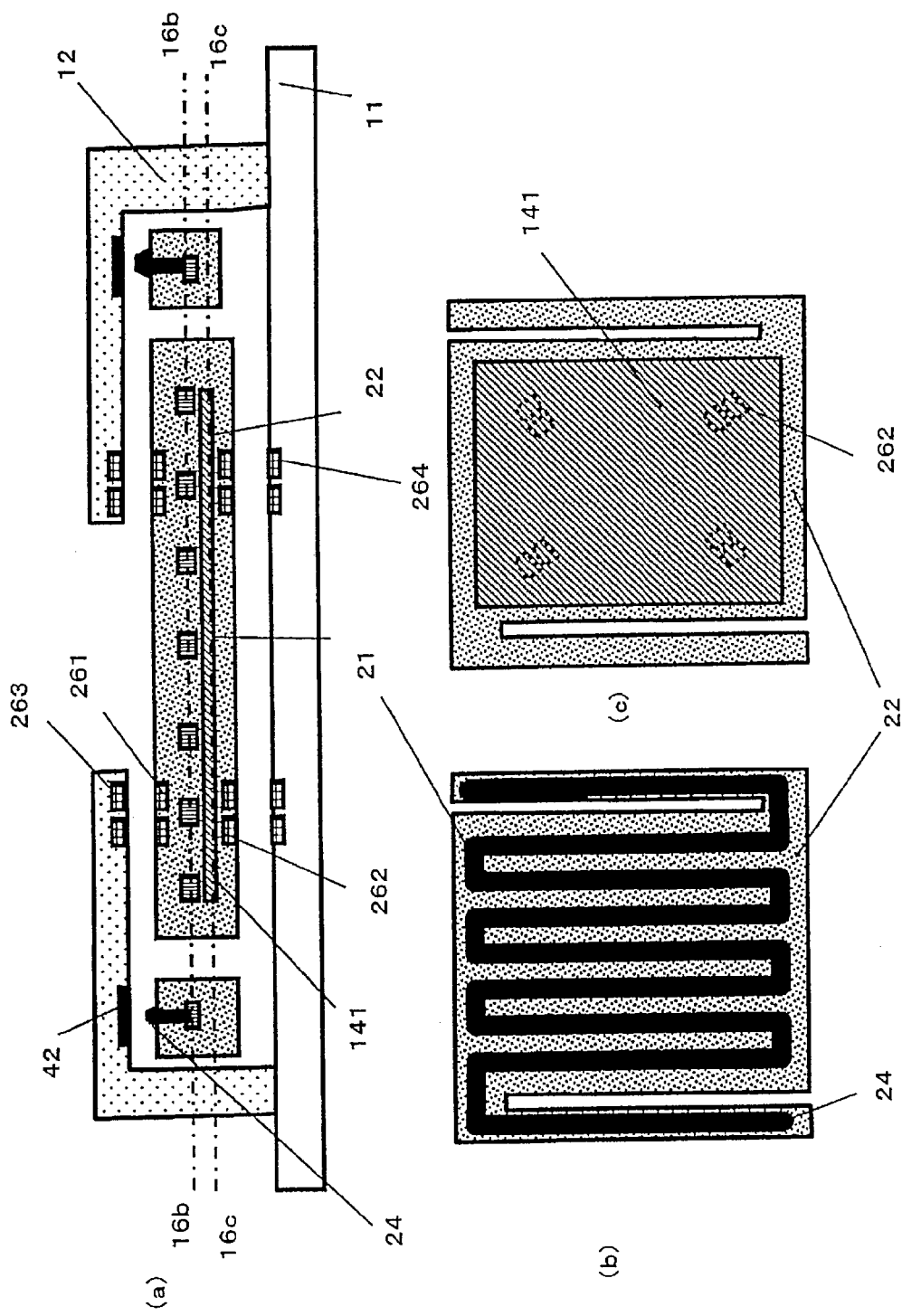
FIG. 16 illustrates a configuration for a heat sensing section according to a third preferred embodiment of the present invention.

As shown in FIG. 16, the heat sensing section 13 of this preferred embodiment includes a bolometer portion 21, a bolometer protective coating 22, bolometer contact portions 24, a magnetic body portion 141, an upper position detecting electrode portion 261 and a lower position detecting electrode portion 262. The bolometer portion 21, the bolometer protective coating 22 and the bolometer contact portions 24 are the same as their counterparts of the first preferred embodiment described above. The magnetic body portion 141 is made of a ferromagnetic material and has been magnetized in a predetermined direction.

Next, the configuration of the cavity wall portion 12 will be described with reference to FIG. 17. Specifically, FIG. 17(a)

is a cross-sectional view as viewed on the plane 1b-1b shown in FIG. 1A, illustrating the configuration of the cavity wall portion 12 in detail, and FIG. 17(b) is a cross-sectional view as viewed on the plane 17b-17b shown in FIG. 17(a).

The cavity wall portion 12 includes an upper uplifting electrode portion 41, bolometer line contact portions 42, electric lines, a cavity wall silicon portion 48, a cavity wall protective coating 49, an upper coil portion 151 and an upper position detecting counter electrode portion 263. The bolometer line contact portions 42, the electric lines, the cavity wall silicon portion 48, and the cavity wall protective coating 49 are the same as their counterparts of the first preferred embodiment described above.

Next, the configuration of the substrate portion 11 will be described with reference to FIG. 18. Specifically, FIG. 18(a) is a cross-sectional view as viewed on the plane 1b-1b shown in FIG. 1A, illustrating the configuration of the substrate portion 11 in detail. FIG. 18(b) is a cross-sectional view as viewed on the plane 18b-18b shown in FIG. 18(a).

The substrate portion 11 includes a silicon substrate portion 51, a lower coil portion 161, a substrate protective coating 53 and a lower position detecting counter electrode portion 264. The silicon substrate portion 51 and the substrate protective coating 53 are the same as their counterparts of the first preferred embodiment described above.

Figure 17:
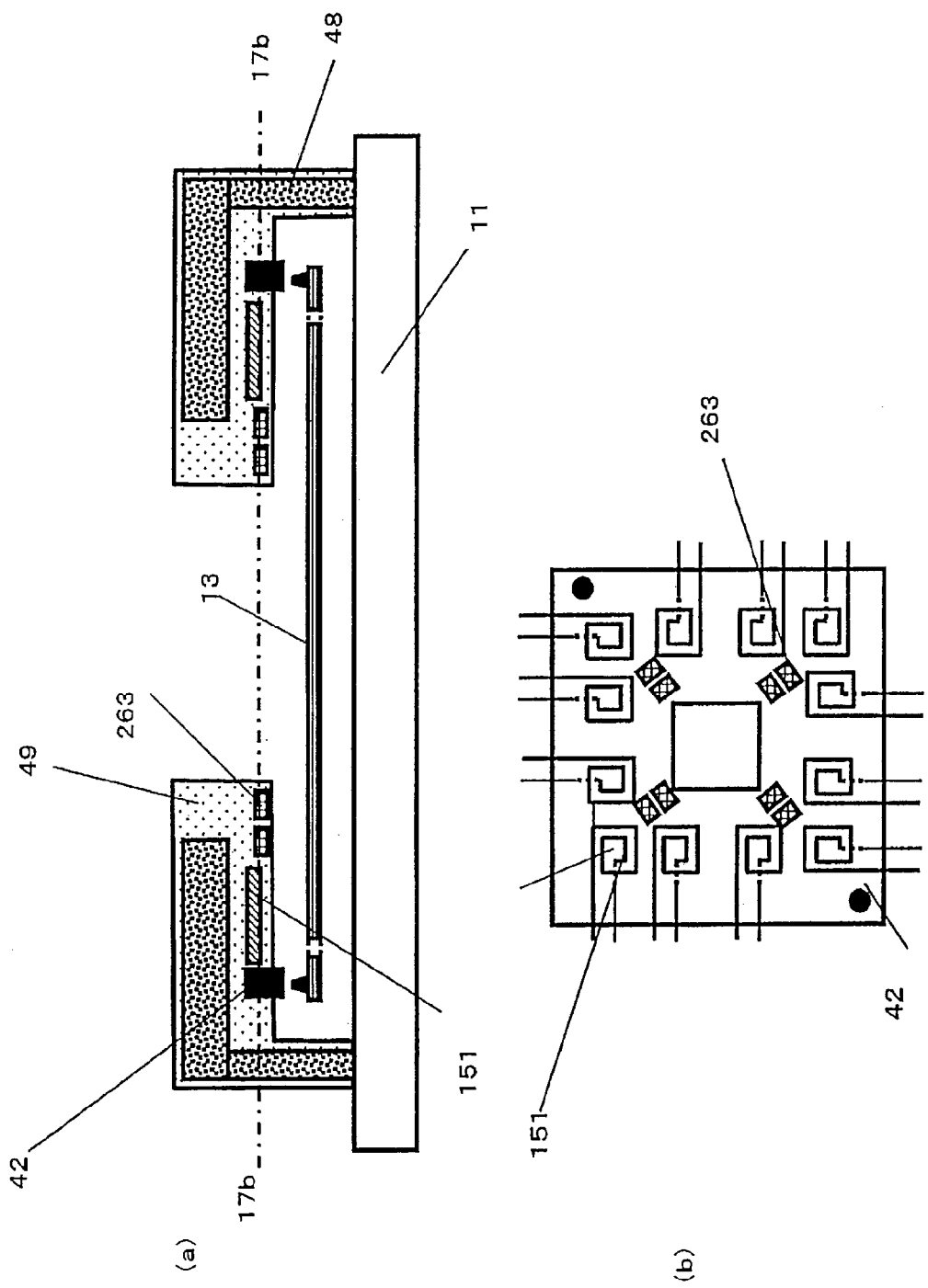
FIG. 17 illustrates a configuration for a cavity portion according to the third preferred embodiment of the present invention.
Figure 18:
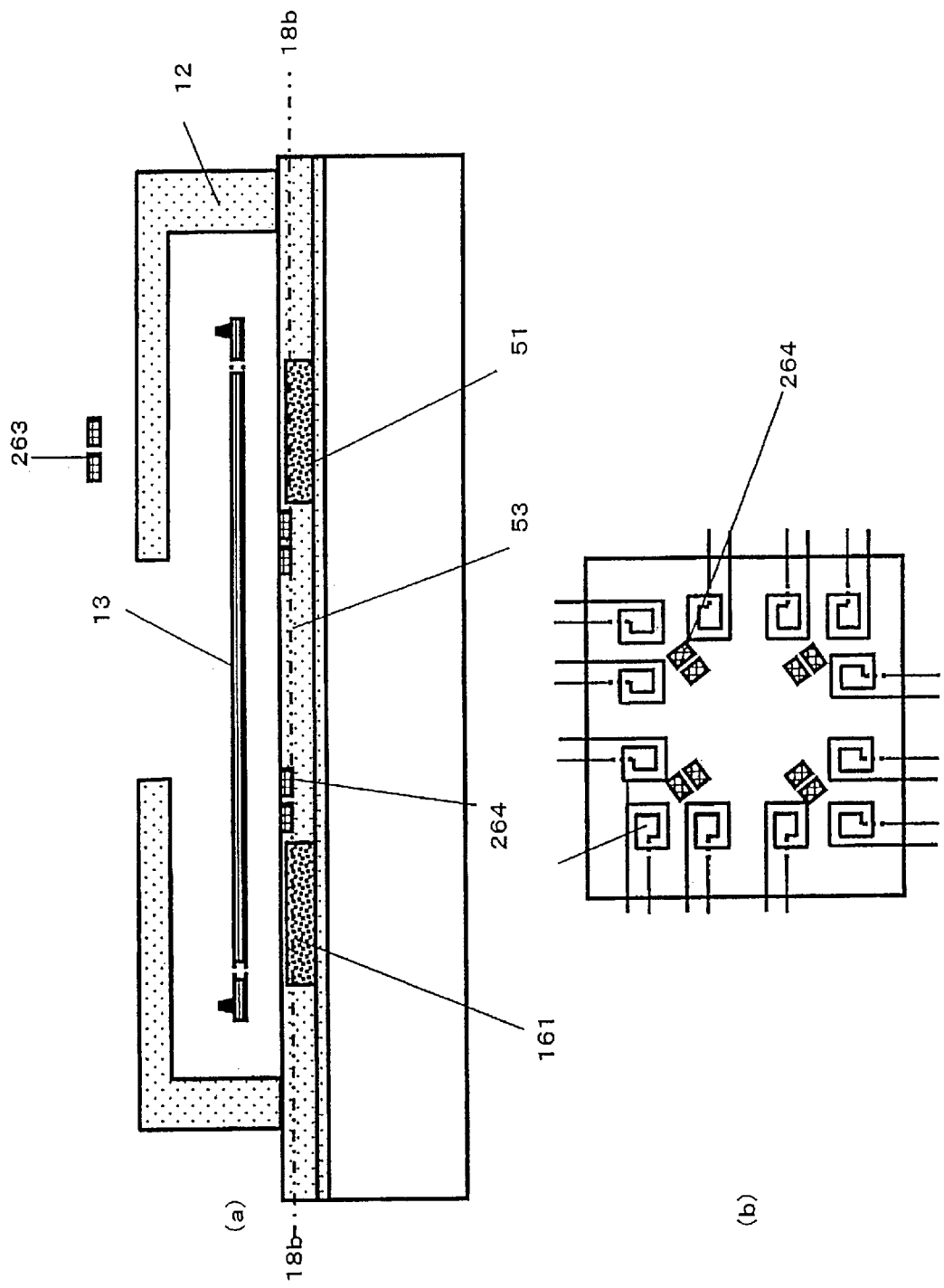
FIG. 18 illustrates a configuration for a substrate portion according to the third preferred embodiment of the present invention.

By supplying current to the upper and lower coil portions 151 and 161 shown in FIGS. 17 and 18, electromagnetic force can be produced as repulsive force between the upper coil portion 151 and the magnetic body portion 141 included in the heat sensing section 13. In the same way, electromagnetic force is also produced as repulsive force between the lower coil portion 161 and the magnetic body portion 141. By changing the magnitudes of the electromagnetic forces with the amounts of currents flowing through the coil portions 151 and 161 adjusted, the position of the heat sensing section 13 can be controlled.

By raising the heat sensing section 13, bringing it into contact with the cavity wall portion 12 and supplying current to the bolometer repeatedly as in the first preferred embodiment described above, the intensity of the incoming infrared ray can be detected at each point in time.

To control the position of the heat sensing section 13, the position of the heat sensing section 13 needs to be detected first. The position of the heat sensing section 13 may be detected by the same method as that described for the first preferred embodiment using the upper position detecting electrode portion 261, the lower position detecting electrode portion 262, the upper position detecting counter electrode portion 263 and the lower position detecting counter electrode portion 264.

Embodiment 4

Hereinafter, a fourth preferred embodiment of an electronic device according to the present invention will be described.

Figure 19:
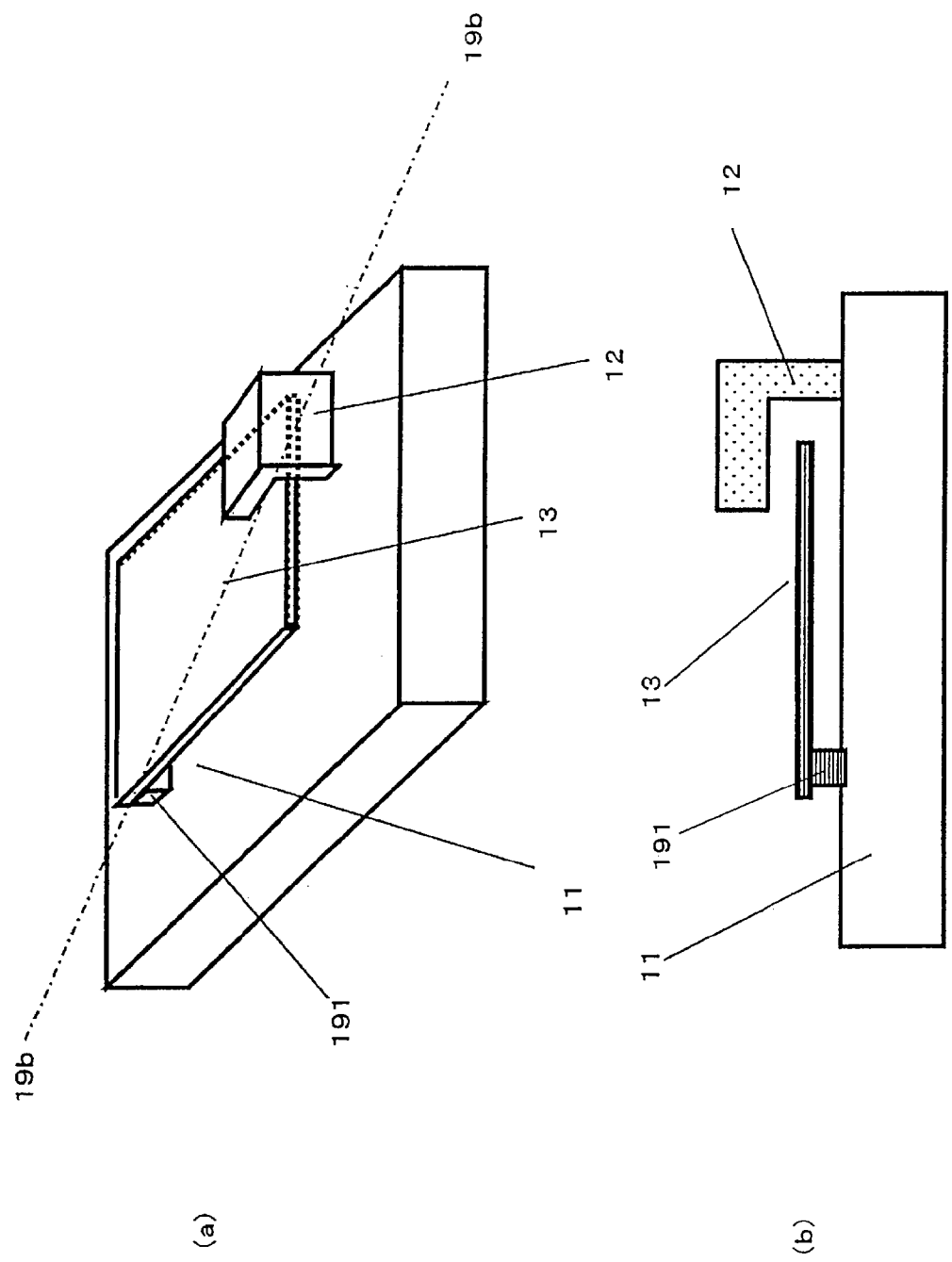
FIG. 19 illustrates a schematic configuration for an electronic device according to a fourth preferred embodiment of the present invention.

As shown in FIG. 19, the electronic device of this preferred embodiment includes a substrate portion 11, and a cavity wall portion 12 and a heat sensing section 13 that are arranged on the surface of the substrate portion 11. FIG. 19(a) is a perspective view of the electronic device, and FIG. 19(b) is a cross-sectional view as viewed on the plane 19b-19b shown in FIG. 19(a). In this preferred embodiment, a heat sensor supporting portion 191, which is a part of the heat sensing section 13, is always in contact with, and fixed on, the substrate portion 11. The heat sensing section 13 has elasticity that is high enough to deform itself. And one free end of the heat sensing section 13 alternately comes into contact with, and out of contact with, the cavity wall portion 12. That is to say, that end of the heat sensing section 13 repeatedly changes its states between the "in contact" and "out of contact" states with respect to the cavity wall portion 12. Specifically, electric charge is produced in the heat sensing section 13 by electrostatic induction, and the heat sensing section 13 is deformed by electrostatic force on this electric charge, thereby making the heat sensing section 13 come into, and out of, contact with the cavity wall portion 12 as described above.

It should be noted that even if the heat sensing section 13 is deformed just partially, the heat sensing section 13 may also be regarded as having changed its positions.

Figure 20:
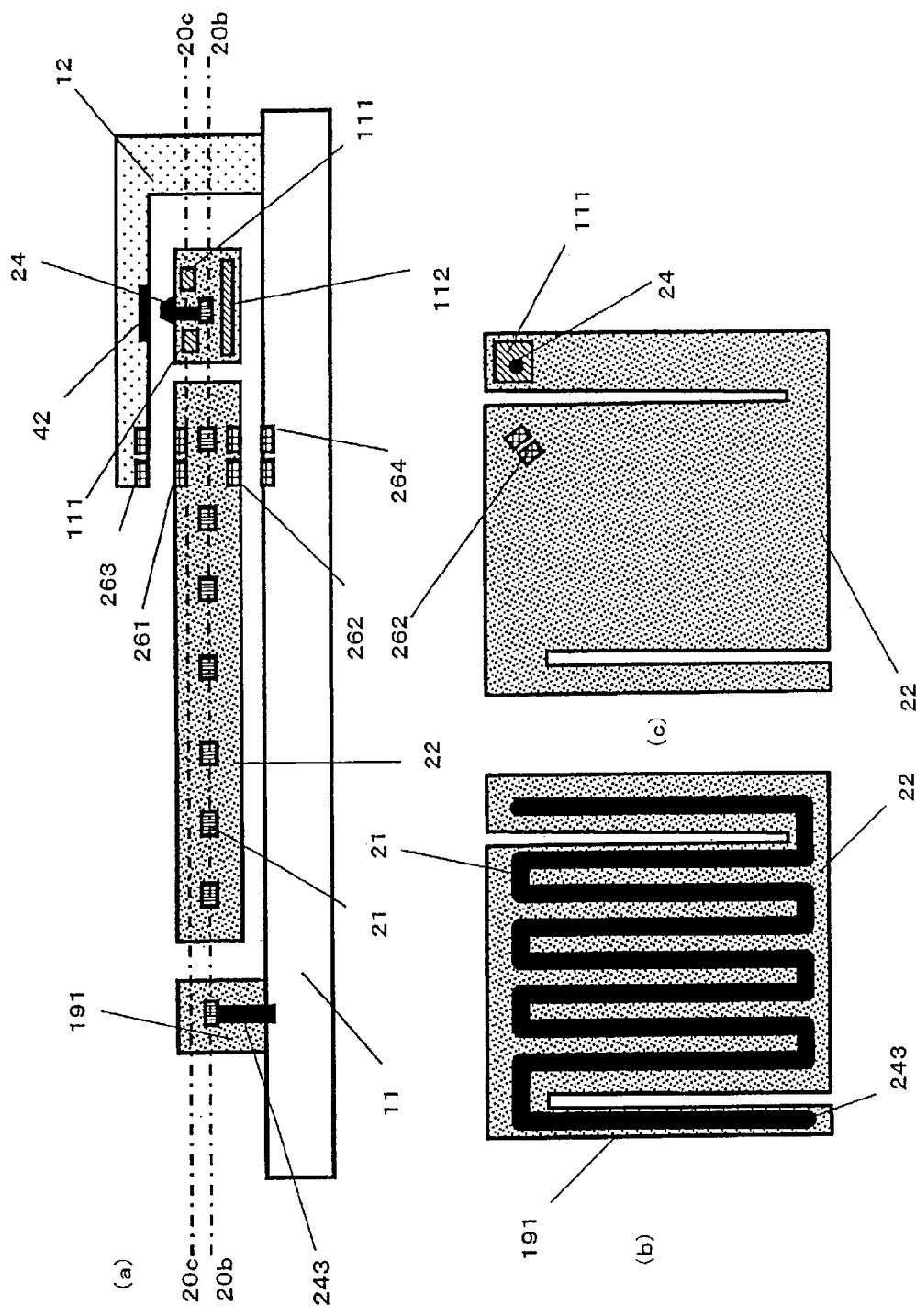
FIG. 20 illustrates a configuration for a heat sensing section according to the fourth preferred embodiment of the present invention.

Hereinafter, the configurations of the heat sensing section 13, the substrate portion 11 and the cavity wall portion 12 of this preferred embodiment will be described. Look at FIG. 20 first. FIG. 20(a) is a cross-sectional view as viewed on the plane 19b-19b shown in FIG. 19(a), illustrating the configuration of the heat sensing section 13 in detail. FIG. 20(b) is a cross-sectional view as viewed on the plane 20b-20b shown in FIG. 20(a) and FIG. 20(c) is a cross-sectional view as viewed on the plane 20c-20c shown in FIG. 20(a).

As in the second preferred embodiment described above, the heat sensing section 13 also includes a bolometer portion 21, a bolometer protective coating 22, charge storage portions 23, a bolometer contact portion 24, an upper electrostatic induction electrode portion 111, a lower electrostatic induction electrode portion 112, an upper position detecting electrode portion 261 and a lower position detecting electrode portion 262. A significant difference from the second preferred embodiment described above is that the heat sensor supporting portion 191, which is a part of the heat sensing section 13, is fixed on the substrate portion 11 such that the heat sensing section 13 functions just like a cantilever. The free end of the heat sensing section 13 tilts on its fixed end as an axis. That is why the bolometer contact portion 24, the upper electrostatic induction electrode portion 111, the lower electrostatic induction electrode portion 112, the upper position detecting electrode portion 261 and the lower position detecting electrode portion 262 are all located on the free end of the heat sensing section 13 as shown in FIG. 20(c). Also, the heat sensor supporting portion 191, which is a part of the heat sensing section 13 and located on the fixed end of the heat sensing section 13, includes a part of the wiring 243, which electrically connects the detector circuit section in the substrate portion 11 and the bolometer portion 21 together.

Figure 21:
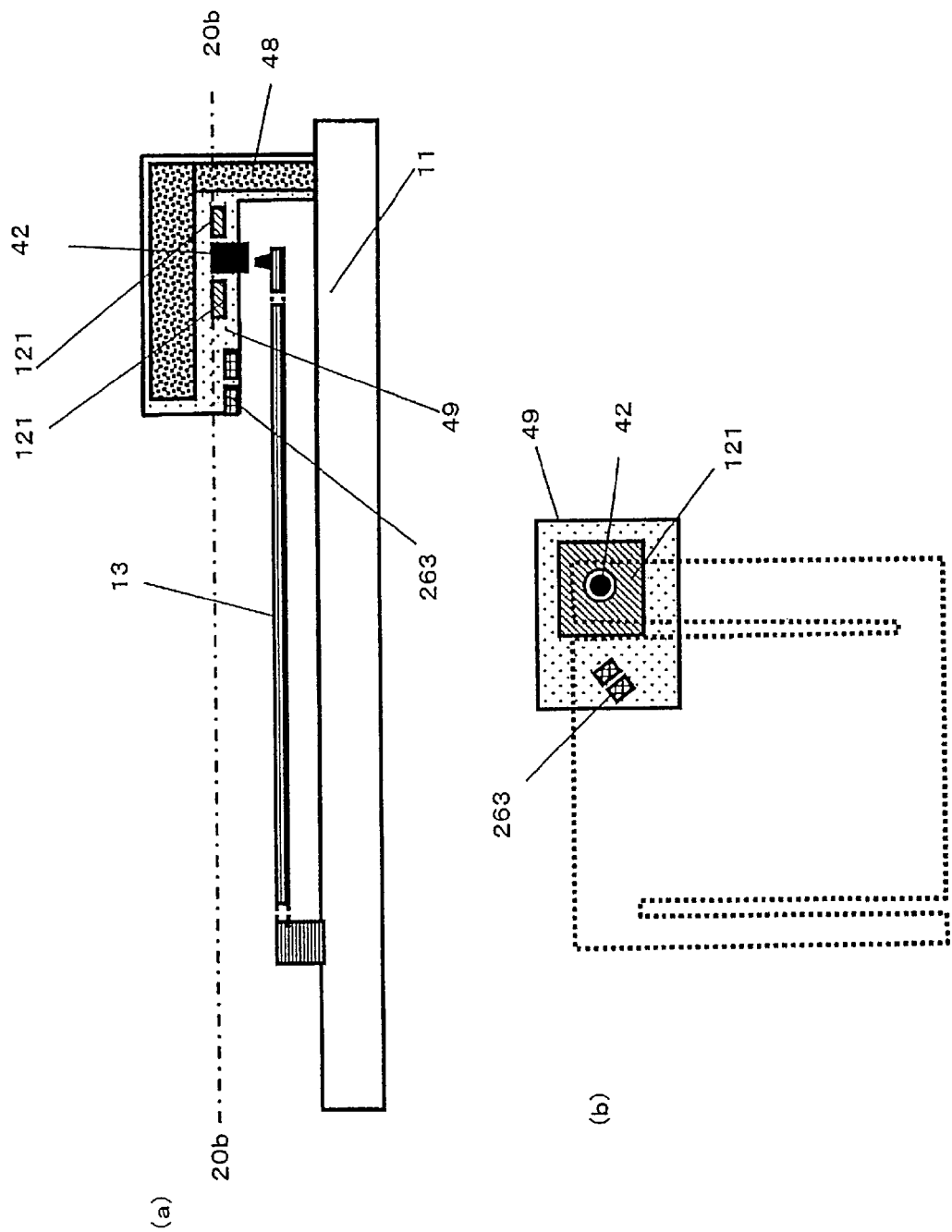
FIG. 21 illustrates a configuration for a cavity wall portion according to the fourth preferred embodiment of the present invention.

Next, the configuration of the cavity wall portion 12 will be described with reference to FIG. 21. Specifically, FIG. 21(a) is a cross-sectional view as viewed on the plane 19b-19b shown in FIG. 19(a), illustrating the configuration of the cavity wall portion 12 in detail, and FIG. 21(b) is a cross-sectional view as viewed on the plane 21b-21b shown in FIG. 21(a).

The cavity wall portion 12 is arranged so as to overlap with the free end of the heat sensing section 13, and includes an upper electrostatic induction counter electrode portion 121, a bolometer line contact portion 42, electric lines, a cavity wall silicon portion 48, a cavity wall protective coating 49, and an upper position detecting counter electrode portion 263.

Figure 22:
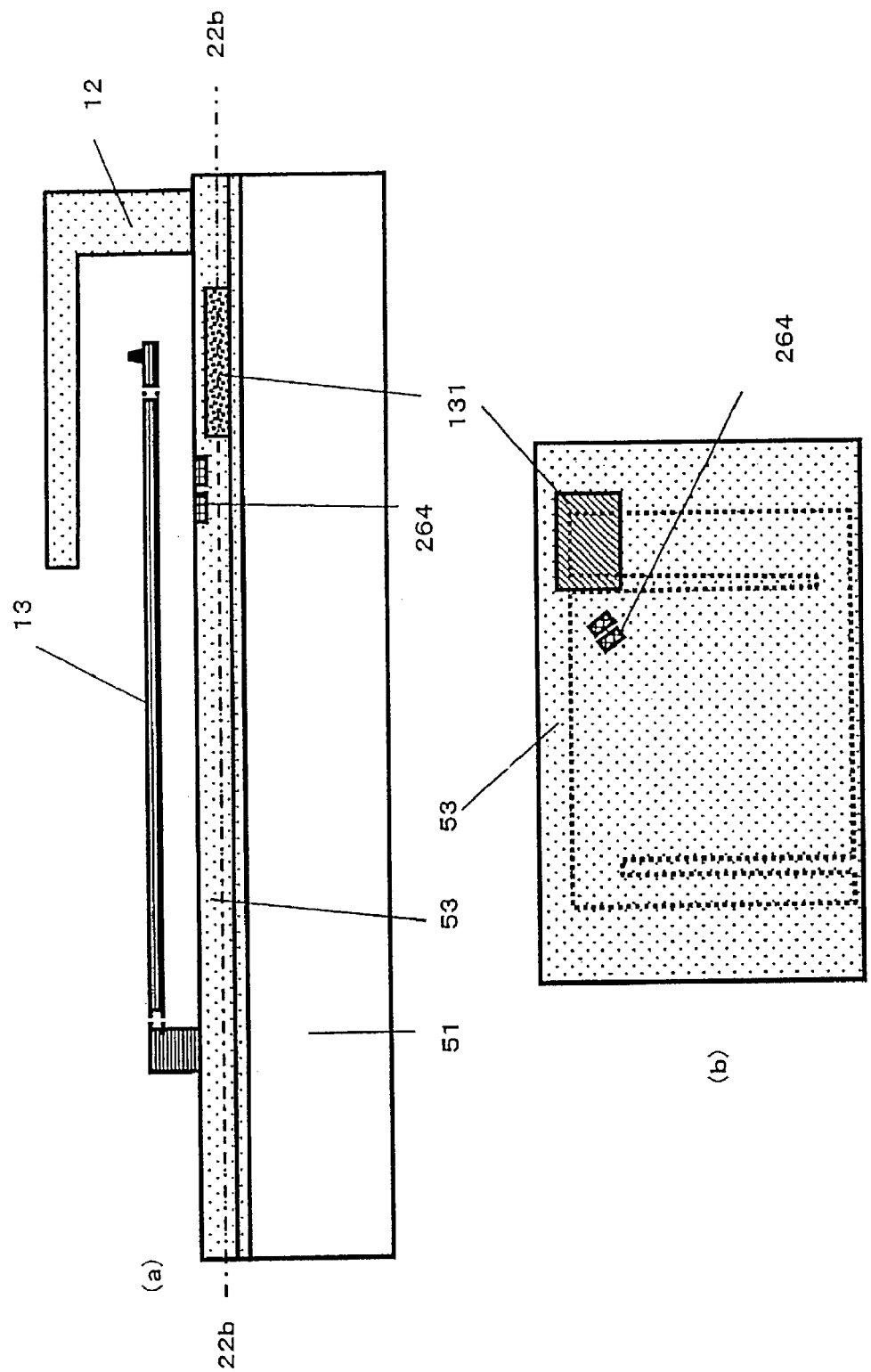
FIG. 22 illustrates a configuration for a substrate portion according to the fourth preferred embodiment of the present invention.

Next, the configuration of the substrate portion 11 will be described with reference to FIG. 22. Specifically, FIG. 22(a) is a cross-sectional view as viewed on the plane 19b-19b shown in FIG. 19(a), illustrating the configuration of the substrate portion 11 in detail. FIG. 22(b) is a cross-sectional view as viewed on the plane 22b-22b shown in FIG. 22(a).

The substrate portion 11 includes a silicon substrate portion 51, a lower electrostatic induction counter electrode portion 131, a substrate protective coating 53 and a lower position detecting counter electrode portion 264. Unlike the second preferred embodiment described above, the lower electrostatic induction counter electrode portion 131 and the lower position detecting counter electrode portion 264 are located right under the free end of the heat sensing section 13.

Figure 23:
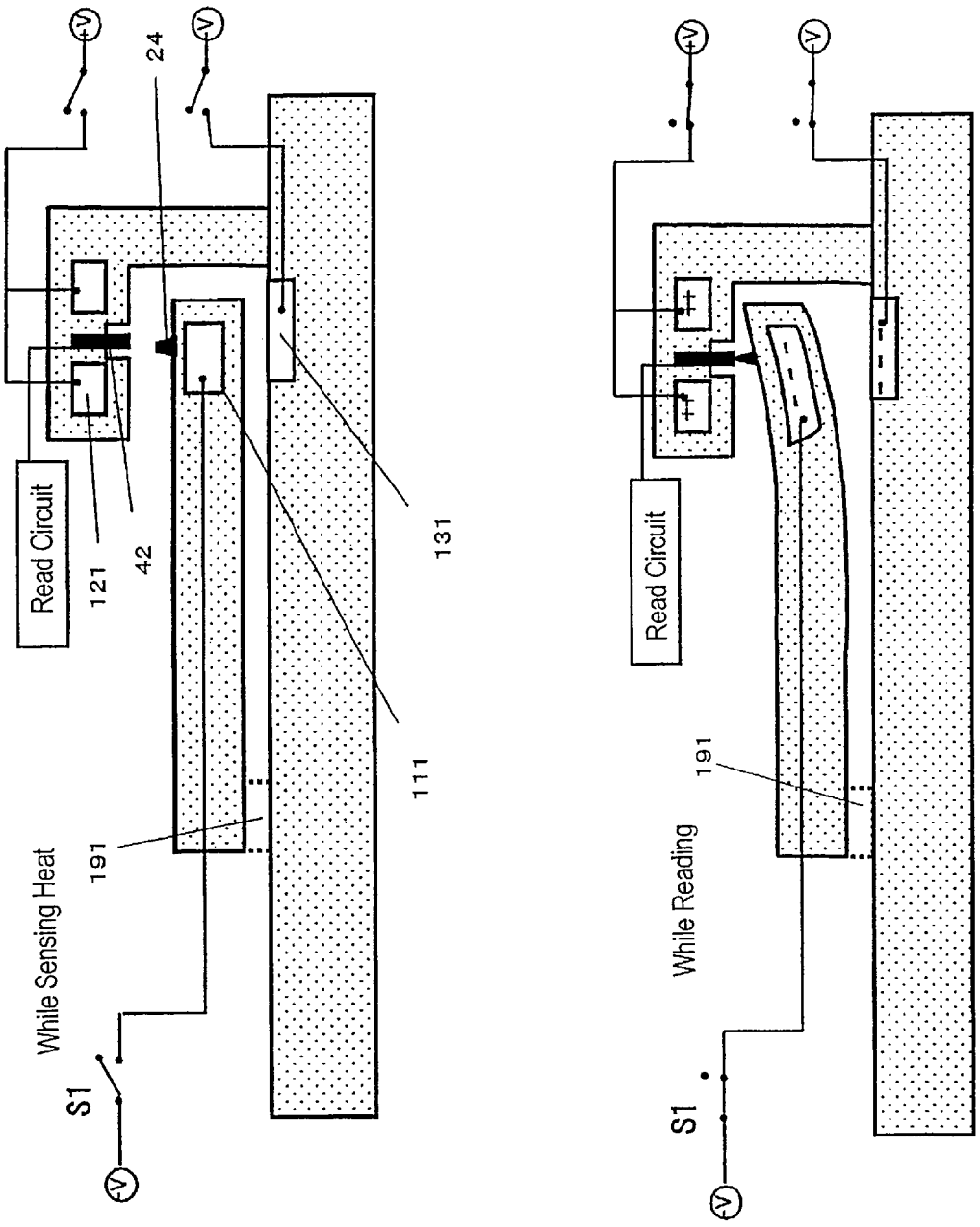
FIG. 23 shows a modified operation of the heat sensing section according to the fourth preferred embodiment of the present invention.

Hereinafter, it will be described with reference to FIG. 23 how the electronic device of this preferred embodiment operates.

The electronic device of this preferred embodiment operates in substantially the same way as the counterpart of the second preferred embodiment described above. According to this preferred embodiment, however, the heat sensor supporting portion 191, which is a part of the heat sensing section 13, is fixed on the substrate portion 11, and therefore, the heat sensing section 13 does not change its positions entirely but is elastically deformed just partially. By deforming the heat sensing section 13 just like a cantilever, switching is done between the states shown in FIGS. 23($a$) and 23($b$), thereby making the bolometer contact portion 24, located near one end of the heat sensing section 13, come into, and out of, contact with the bolometer line contact portion 42.

To control the position of the heat sensing section 13, the position of the heat sensing section 13 needs to be detected first. The position of the heat sensing section 13 may be detected by the same method as that described for the first preferred embodiment using the upper position detecting electrode portion 261, the lower position detecting electrode portion 262, the upper position detecting counter electrode portion 263 and the lower position detecting counter electrode portion 264.

Embodiment 5

Hereinafter, a fifth preferred embodiment of an electronic device according to the present invention will be described.

In this preferred embodiment, the position of the heat sensing section 13 is controlled using the electrostatic force on electric charge that has been produced as a result of the polarization of a ferroelectric material. The overall configuration of the electronic device of this preferred embodiment is the same as that shown in FIG. 1, and also includes a heat sensing section 13, a cavity wall portion 12 and a substrate portion 11.

Figure 24:
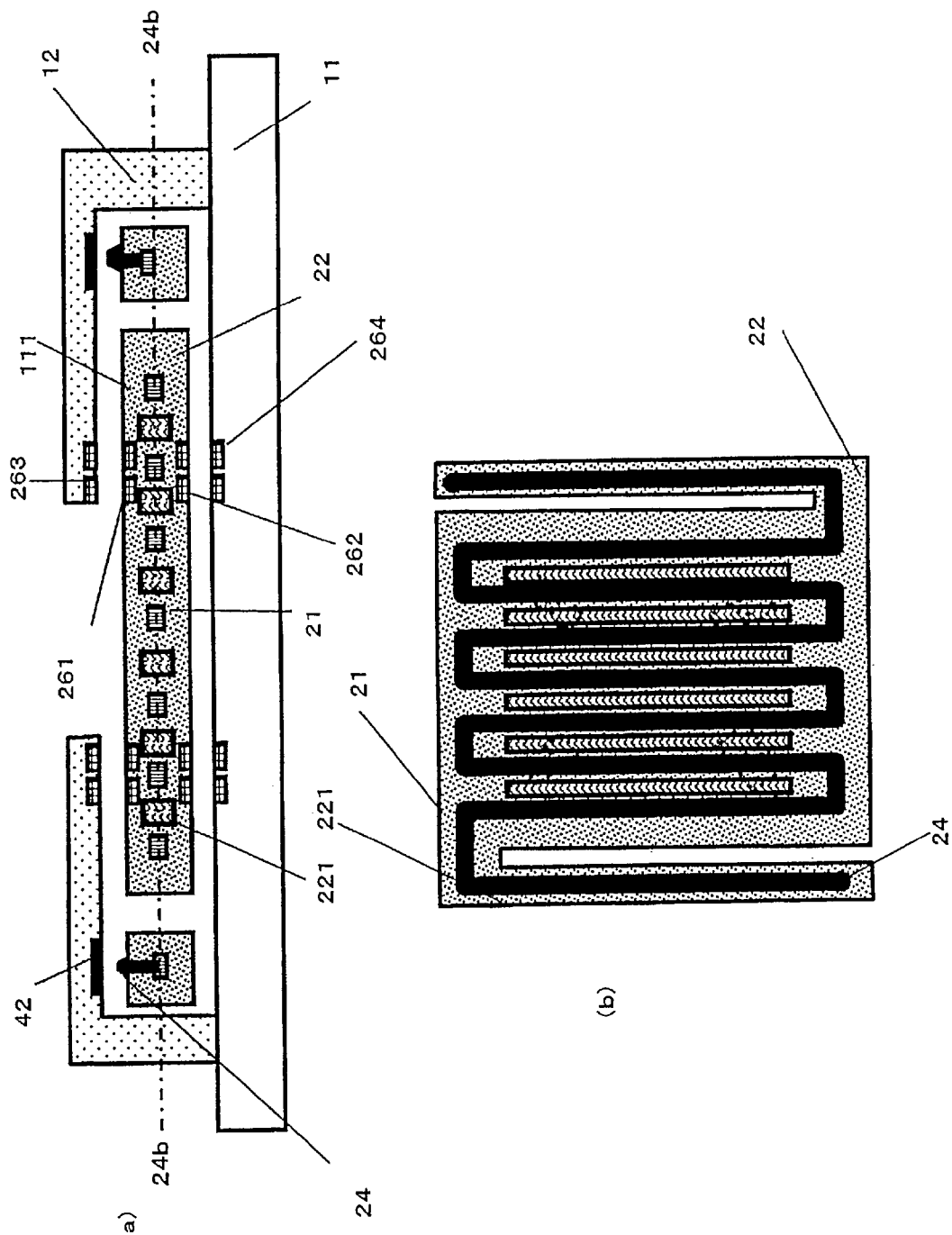
FIG. 24 illustrates a configuration for a heat sensing section according to a fifth preferred embodiment of the present invention.

FIG. 24($a$) is a cross-sectional view as viewed on the plane 1$b$-1$b$ shown in FIG. 1A, illustrating the configuration of the heat sensing section 13 in detail. FIG. 24($b$) is a cross-sectional view as viewed on the plane 24$b$-24$b$ shown in FIG. 24($a$) and FIG. 26($c$) is a cross-sectional view as viewed on the plane 24$c$-24$c$ shown in FIG. 26($a$).

As shown in FIG. 24, the heat sensing section 13 includes a bolometer portion 21, a bolometer protective coating 22, a bolometer contact portions 24, a ferroelectric portion 221, an upper position detecting electrode portion 261 and a lower position detecting electrode portion 262. The bolometer portion 21, the bolometer protective coating 22 and the bolometer contact portions 24 are the same as their counterparts of the first preferred embodiment described above. The difference from the other preferred embodiments is that the heat sensing section 13 includes the ferroelectric portion 221 instead of the charge storage portions 23.

Figure 25:
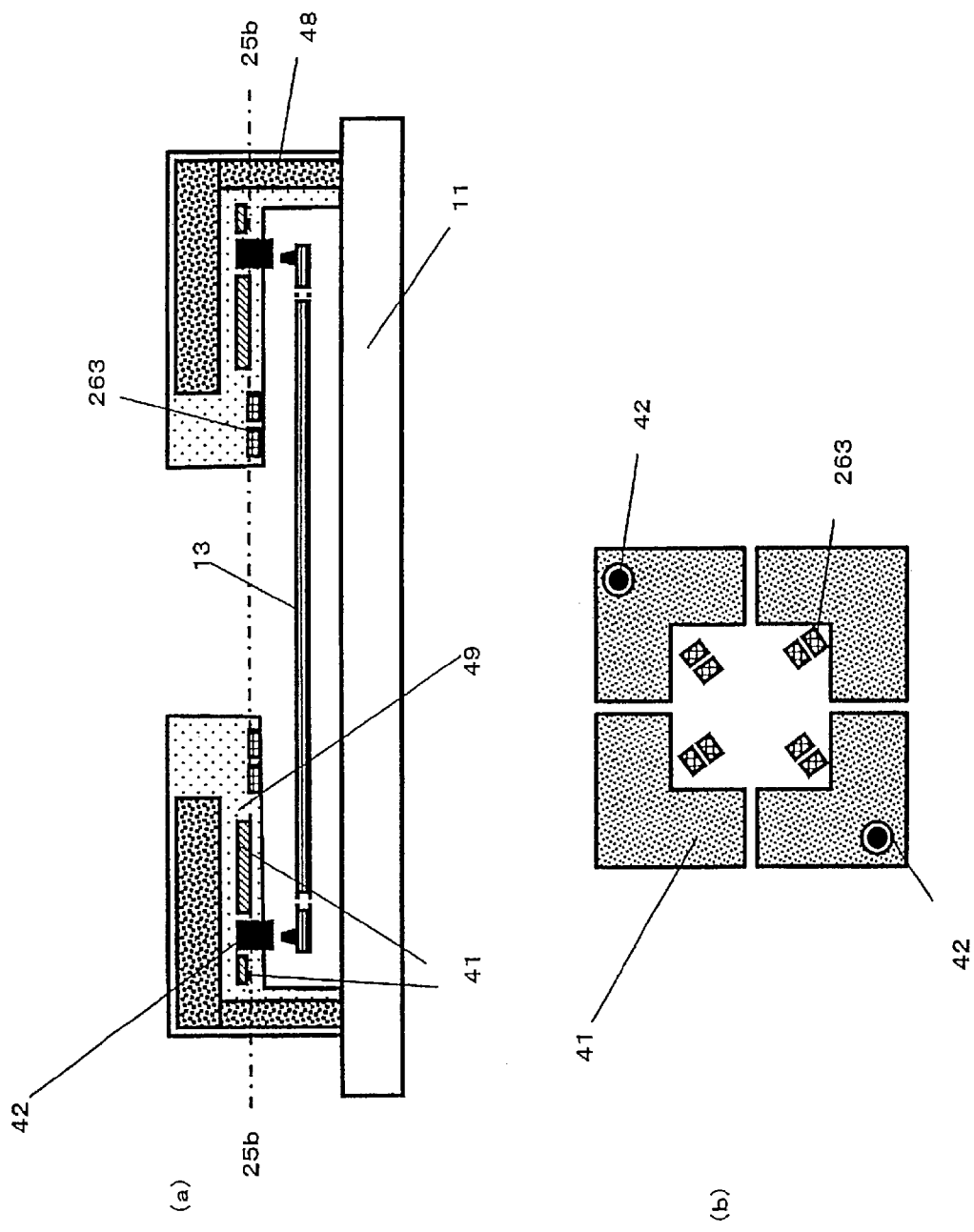
FIG. 25 illustrates a configuration for a cavity wall portion according to the fifth preferred embodiment of the present invention.

Next, the configuration of the cavity wall portion 12 will be described with reference to FIG. 25. Specifically, FIG. 25($a$) is a cross-sectional view as viewed on the plane 1$b$-1$b$ shown in FIG. 1A, illustrating the configuration of the cavity wall portion 12 in detail, and FIG. 25($b$) is a cross-sectional view as viewed on the plane 25$b$-25$b$ shown in FIG. 25($a$).

The cavity wall portion 12 includes an upper uplifting electrode portion 41, bolometer line contact portions 42, electric lines (not shown), a cavity wall silicon portion 48, a cavity wall protective coating 49, and an upper position detecting counter electrode portion 263. The bolometer line contact portions 42, the electric lines, the cavity wall silicon portion 48, and the cavity wall protective coating 49 are the same as their counterparts of the first preferred embodiment described above.

Figure 26:
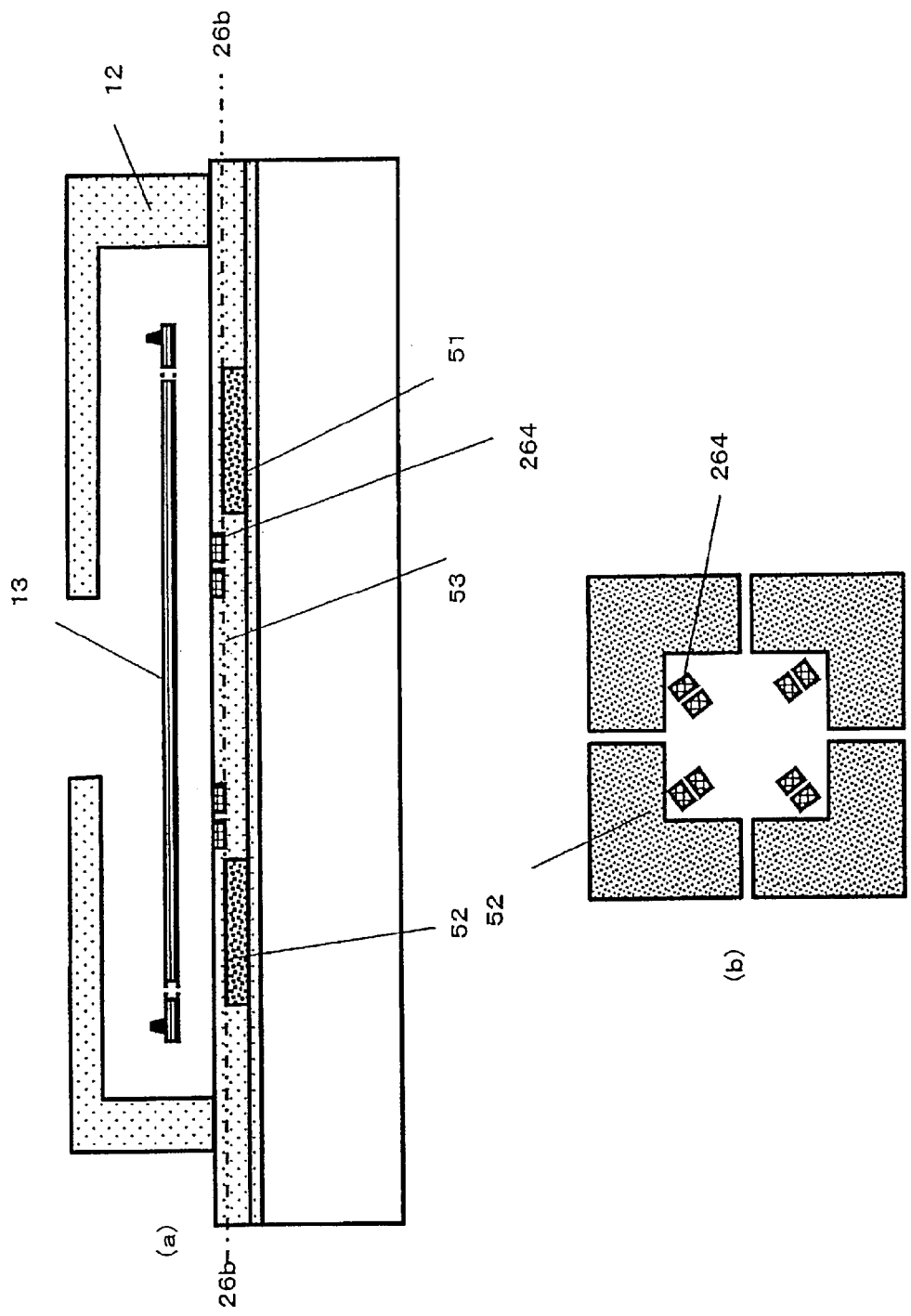
FIG. 26 illustrates a configuration for a substrate portion according to the fifth preferred embodiment of the present invention.
Figure 27:
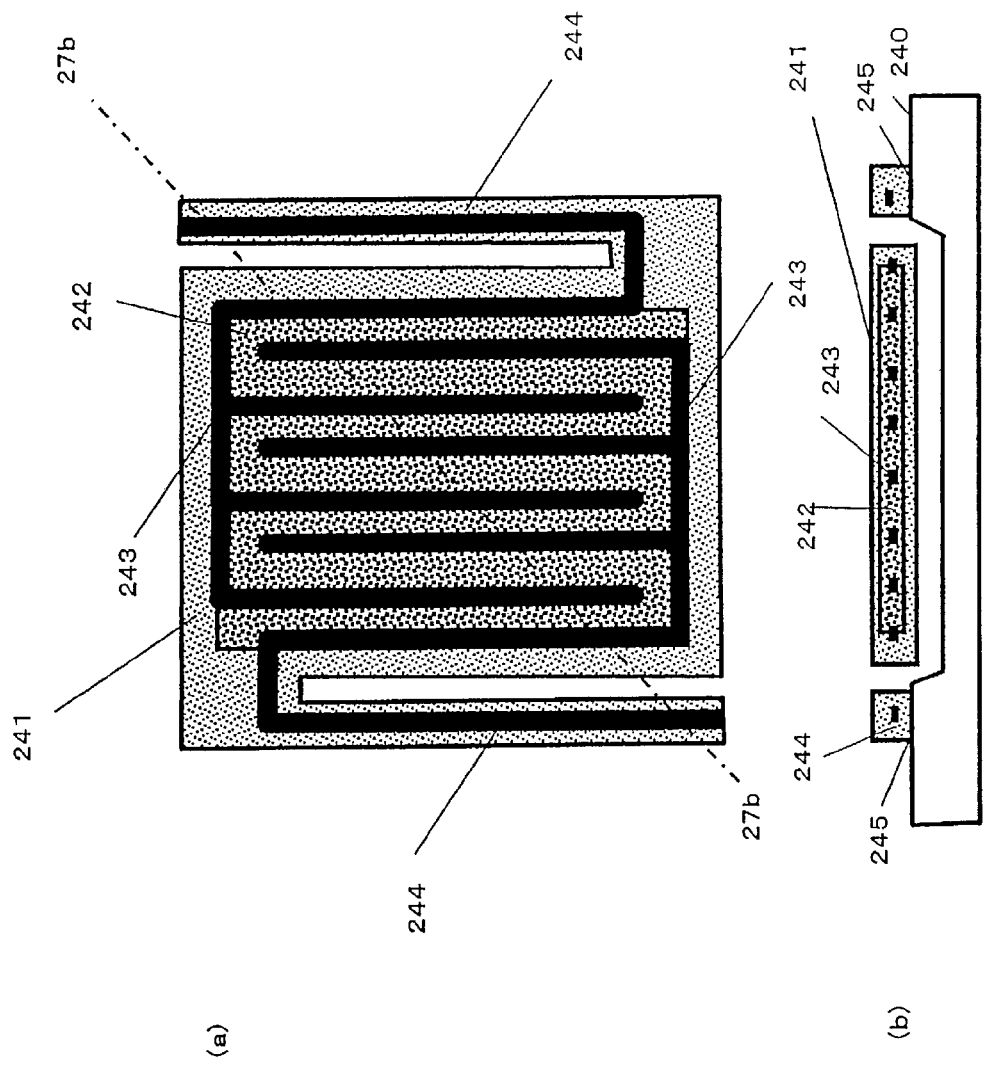
FIG. 27 illustrates a conventional infrared sensor.

Next, the configuration of the substrate portion 11 will be described with reference to FIG. 26. Specifically, FIG. 26($a$) is a cross-sectional view as viewed on the plane 1$b$-1$b$ shown in FIG. 1A, illustrating the configuration of the substrate portion 11 in detail. FIG. 26($b$) is a cross-sectional view as viewed on the plane 26$b$-26$b$ shown in FIG. 26($a$).

The substrate portion 11 includes a silicon substrate portion 51, a lower uplifting electrode portion 52, a substrate protective coating 53 and a lower position detecting counter electrode portion 264. The silicon substrate portion 51 and the substrate protective coating 53 are the same as their counterparts of the first preferred embodiment described above.

The ferroelectric portion 221 is made of a ferroelectric material and has been polarized in advance. For example, suppose the ferroelectric portion 221 has been polarized from the lower surface of the substrate toward the upper surface thereof. In that case, when a positive voltage and a negative voltage are applied to the upper and lower uplifting electrode portions 41 and 52, respectively, electrostatic force can be produced as repulsive force between the upper uplifting electrode portion 41 and the ferroelectric portion 221 and between the lower uplifting electrode portion 52 and the ferroelectric portion 221. By adjusting the magnitudes of these electrostatic forces with the voltages at the upper and lower uplifting electrode portions 41 and 52 regulated, the position of the heat sensing section 13 can be controlled.

By raising the heat sensing section 13, bringing it into contact with the cavity wall portion 12 and supplying current to the bolometer repeatedly as in the first preferred embodiment described above, the intensity of the incoming infrared ray can be detected at each point in time.

To control the position of the heat sensing section 13, the position of the heat sensing section 13 needs to be detected first. The position of the heat sensing section 13 may be detected by the same method as that described for the first preferred embodiment using the upper position detecting electrode portion 261, the lower position detecting electrode portion 262, the upper position detecting counter electrode portion 263 and the lower position detecting counter electrode portion 264.

Embodiment 6

Hereinafter, a sixth preferred embodiment of an electronic device according to the present invention will be described.

Figure 28:
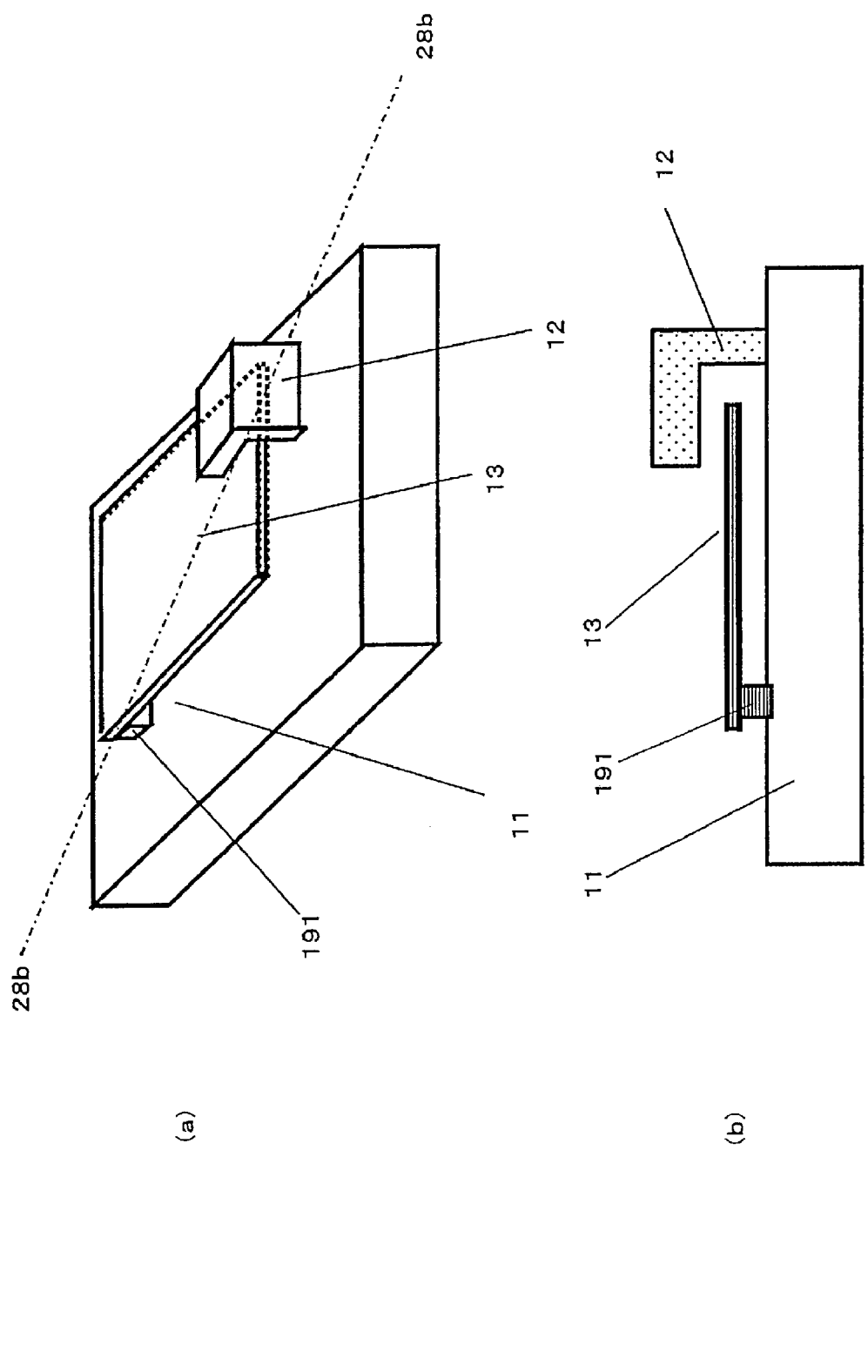
FIG. 28 illustrates a schematic configuration for an electronic device according to a sixth preferred embodiment of the present invention.

As shown in FIG. 28, the electronic device of this preferred embodiment includes a substrate portion 11, and a cavity wall portion 12 and a heat sensing section 13 that are arranged on the surface of the substrate portion 11. FIG. 28($a$) is a perspective view of the electronic device, and FIG. 28($b$) is a cross-sectional view as viewed on the plane 28$b$-28$b$ shown in FIG. 28($a$). In this preferred embodiment, a heat sensor supporting portion 191, which is a part of the heat sensing section 13, is always in contact with, and fixed on, the substrate portion 11. The heat sensing section 13 has elasticity that is high enough to deform itself. And one free end of the heat sensing section 13 alternately comes into contact with, and out of contact with, the cavity wall portion 12. That is to say, that end of the heat sensing section 13 repeatedly changes its states between the "in contact" and "out of contact" states with respect to the cavity wall portion 12. Specifically, electric charge is produced in the heat sensing section 13 by electrostatic induction, and the heat sensing section 13 is deformed by electrostatic force on this electric charge, thereby making the heat sensing section 13 come into, and out of, contact with the cavity wall portion 12 as described above.

Figure 29:
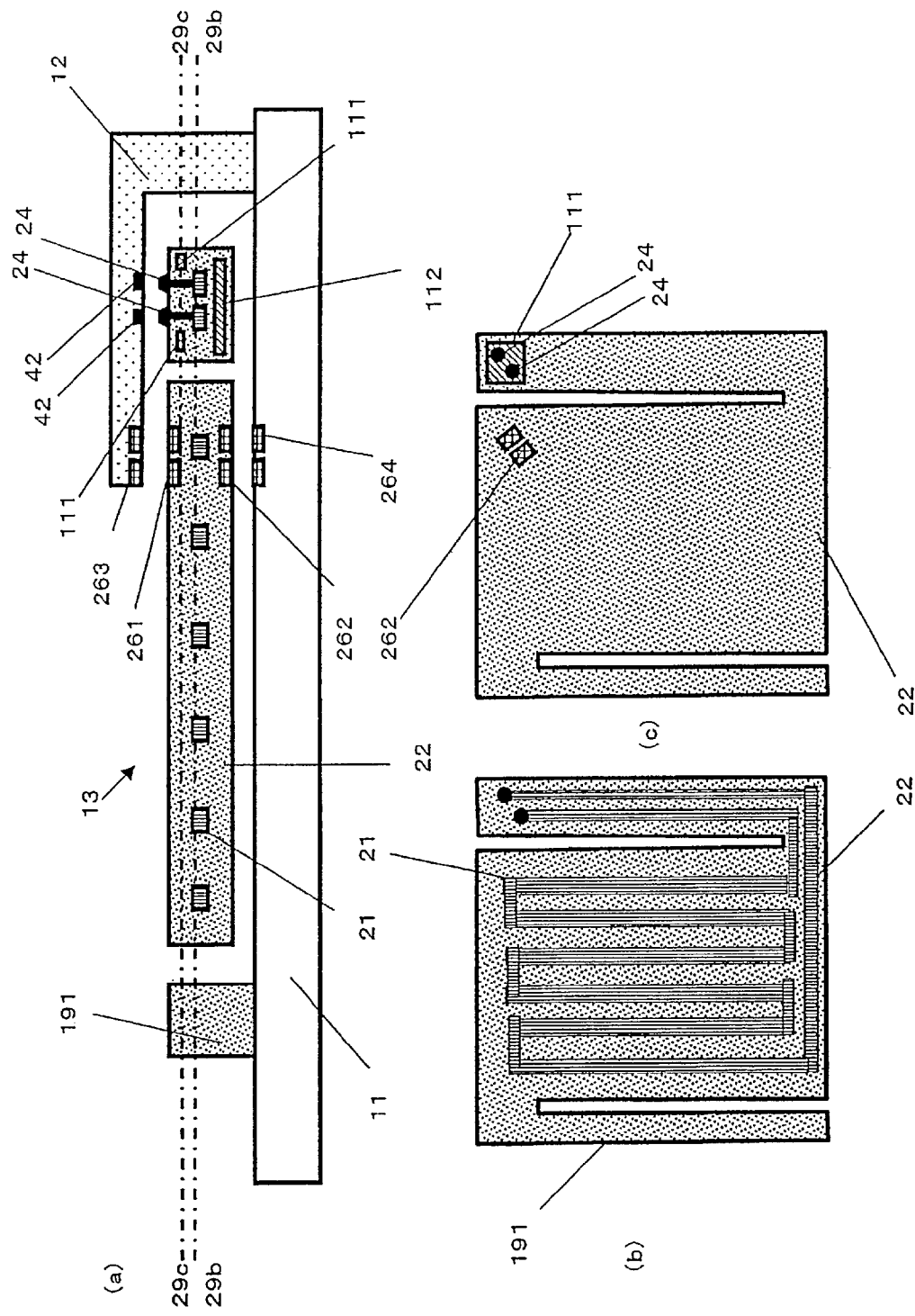
FIG. 29 illustrates a configuration for a heat sensing section according to a sixth preferred embodiment of the present invention.

Hereinafter, the configurations of the heat sensing section 13, the substrate portion 11 and the cavity wall portion 12 of this preferred embodiment will be described. Look at FIG. 29 first. FIG. 29(a) is a cross-sectional view as viewed on the plane 28b-28b shown in FIG. 28(a), illustrating the configuration of the heat sensing section 13 in detail. FIG. 29(b) is a cross-sectional view as viewed on the plane 29b-29b shown in FIG. 29(a) and FIG. 29(c) is a cross-sectional view as viewed on the plane 29c-29c shown in FIG. 29(a).

As in the second preferred embodiment described above, the heat sensing section 13 also includes a bolometer portion 21, a bolometer protective coating 22, charge storage portions 23, bolometer contact portions 24, an upper electrostatic induction electrode portion 111, a lower electrostatic induction electrode portion 112, an upper position detecting electrode portion 261 and a lower position detecting electrode portion 262. As in the fourth preferred embodiment described above, the heat sensor supporting portion 191, which is a part of the heat sensing section 13, is fixed on the substrate portion 11 such that the heat sensing section 13 functions just like a cantilever. That is to say, the free end of the heat sensing section 13 tilts on its fixed end as an axis. That is why the bolometer contact portions 24, the upper electrostatic induction electrode portion 111, the lower electrostatic induction electrode portion 112, the upper position detecting electrode portion 261 and the lower position detecting electrode portion 262 are all located on the free end of the heat sensing section 13 as shown in FIG. 29(c).

Major differences from the fourth preferred embodiment described above are that two bolometer contact portions 24 are arranged at the free end and that the heat sensor supporting portion 191 includes no wiring.

Figure 30:
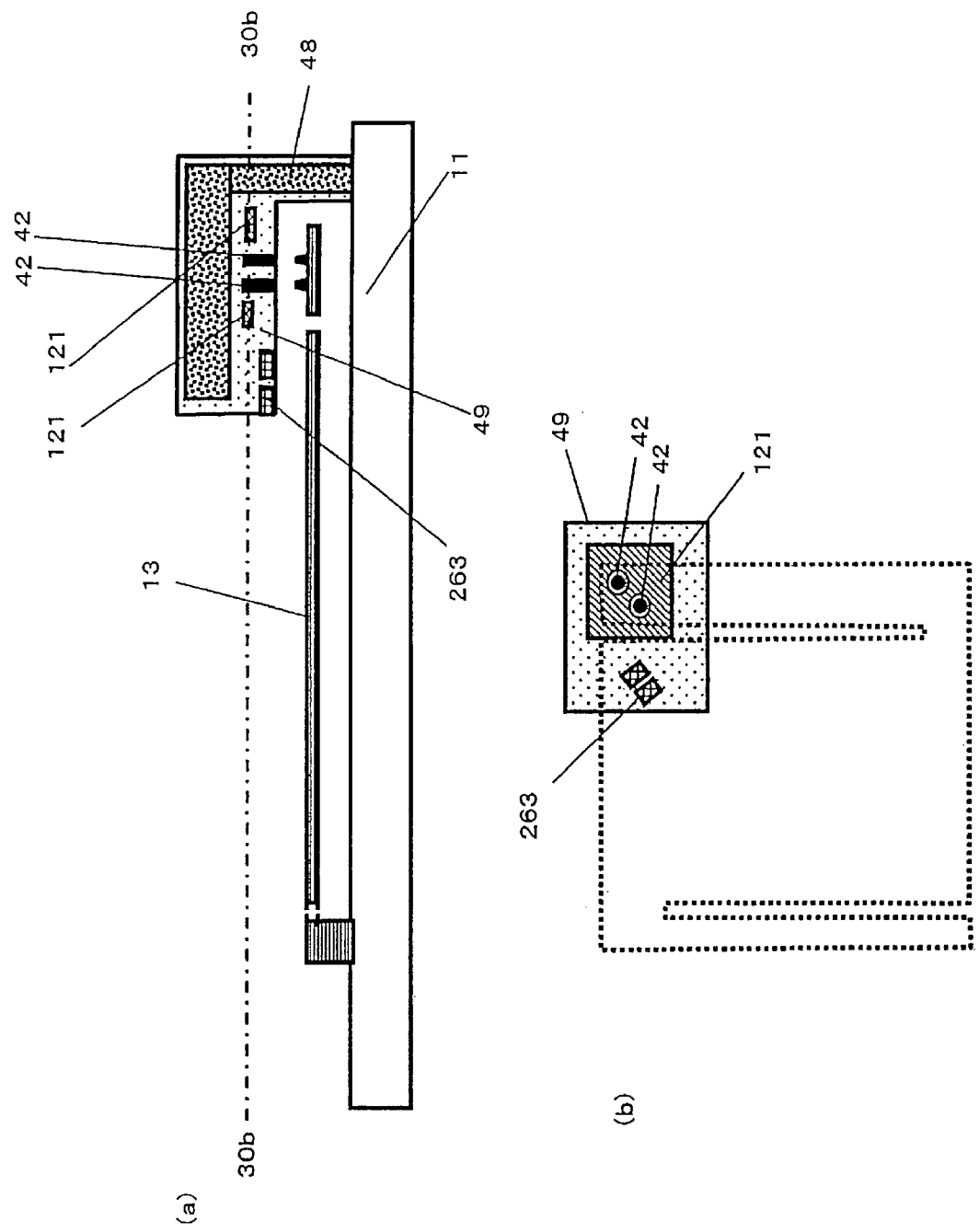
FIG. 30 illustrates a configuration for a cavity wall portion according to the sixth preferred embodiment of the present invention.

Next, the configuration of the cavity wall portion 12 will be described with reference to FIG. 30. Specifically, FIG. 30(a) is a cross-sectional view as viewed on the plane 28b-28b shown in FIG. 28(a), illustrating the configuration of the cavity wall portion 12 in detail, and FIG. 30(b) is a cross-sectional view as viewed on the plane 30b-30b shown in FIG. 30(a).

The cavity wall portion 12 is arranged so as to overlap with the free end of the heat sensing section 13, and includes an upper electrostatic induction counter electrode portion 121, bolometer line contact portions 42, electric lines, a cavity wall silicon portion 48, a cavity wall protective coating 49, and an upper position detecting counter electrode portion 263. Unlike the fourth preferred embodiment described above, two bolometer line contact portions 42 are arranged on the cavity wall portion 12.

Figure 31:
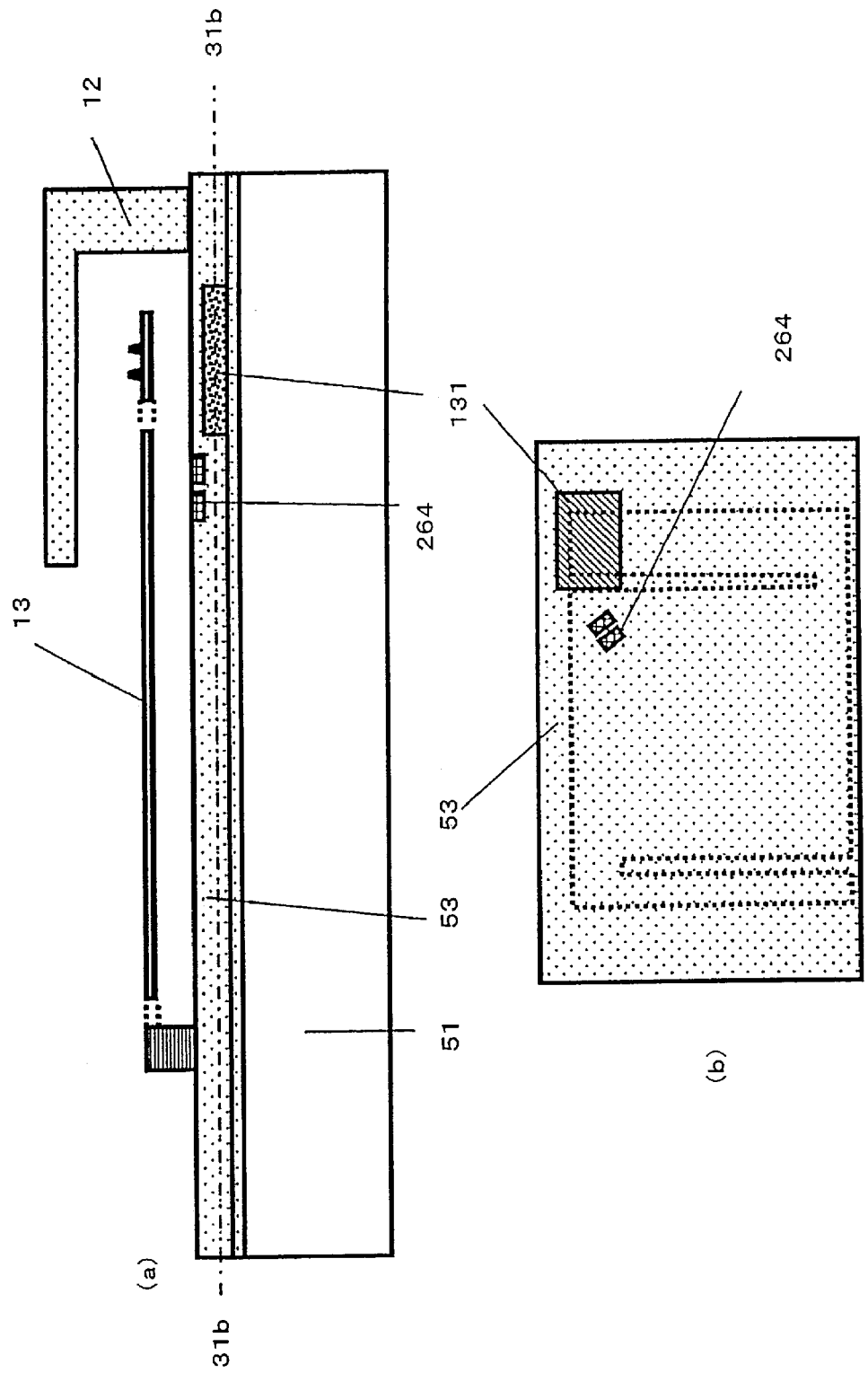
FIG. 31 illustrates a configuration for a substrate portion according to the sixth preferred embodiment of the present invention.

Next, the configuration of the substrate portion 11 will be described with reference to FIG. 31. The substrate portion 11 has the same configuration as the counterpart of the fourth preferred embodiment described above. Specifically, FIG. 31(a) is a cross-sectional view as viewed on the plane 28b-28b shown in FIG. 28(a), illustrating the configuration of the substrate portion 11 in detail. FIG. 31(b) is a cross-sectional view as viewed on the plane 31b-31b shown in FIG. 31(a).

The substrate portion 11 includes a silicon substrate portion 51, a lower electrostatic induction counter electrode portion 131, a substrate protective coating 53 and a lower position detecting counter electrode portion 264. As in the fourth preferred embodiment described above, the lower electrostatic induction counter electrode portion 131 and the lower position detecting counter electrode portion 264 are located right under the free end of the heat sensing section 13.

Hereinafter, it will be described how the electronic device of this preferred embodiment operates.

The electronic device of this preferred embodiment operates in substantially the same way as the counterpart of the fourth preferred embodiment described above. Specifically, according to this preferred embodiment, a part of the heat sensing section 13 is fixed on the substrate portion 11, and therefore, the heat sensing section 13 does not change its positions entirely but is elastically deformed just partially. By deforming the heat sensing section 13 just like a cantilever, switching is done between the states shown in FIGS. 23(a) and 23(b), thereby making the bolometer contact portions 24, located near one end of the heat sensing section 13, come into, and out of, contact with the bolometer line contact portions 42.

To control the position of the heat sensing section 13, the position of the heat sensing section 13 needs to be detected first. The position of the heat sensing section 13 may be detected by the same method as that described for the fourth preferred embodiment using the upper position detecting electrode portion 261, the lower position detecting electrode portion 262, the upper position detecting counter electrode portion 263 and the lower position detecting counter electrode portion 264.

In this preferred embodiment, the heat sensing section 13 can be deformed just like a cantilever with one end thereof fixed as in the fourth preferred embodiment described above. Consequently, the heat sensing section 13 can operate with good stability and can have its position controlled easily.

Hereinafter, it will be described how the heat will escape from the heat sensing section 13 toward the substrate portion 11 in a situation where the bolometer contact portions 24 are disconnected from the bolometer line contact portions 42. The heat may escape as a radiation from the heat sensing section 13, due to the convection of a gas surrounding the heat sensing section 13, or by being conducted through the heat sensor supporting portion 191.

In a normal infrared sensor, the environment surrounding the heat sensing section 13 is shut off from the air to create either a vacuum or a reduced pressure atmosphere there, thereby decreasing the quantity of heat escaping due to the convection of the gas surrounding the heat sensing section 13. Also, the infrared sensor is designed such that the temperature of the heat sensing section 13 does not exceed a certain value. That is why the quantity of heat escaping as a radiation from the heat sensing section 13 is not greater than that of the heat escaping by being conducted through the heat sensor supporting portion 191. Consequently, to increase the sensitivity of the infrared sensor by reducing the quantity of heat escaping from the heat sensing section 13 to the substrate portion 11 in a situation where the bolometer contact portions 24 are disconnected from the bolometer line contact portions 42, the quantity of the heat escaping by being conducted through the heat sensor supporting portion 191 needs to be reduced.

Suppose the wiring is made of aluminum, for example. Aluminum has a thermal conductivity of approximately 1.32 W/cm·K, whereas $SiO_2$ (silicon dioxide), which is a typical material for the portions other than the wiring, has a thermal conductivity of approximately 0.014 W/cm·K. Thus, it is clear that the heat can be conducted through the wiring much more easily than the other portions. That is why if a portion of the wiring that electrically connects the heat sensing section 13 to the detector circuit section were embedded in the heat sensor supporting portion 191, the quantity of heat escaping from the heat sensing section 13 toward the substrate portion 11 by way of the portion of the wiring would increase while the bolometer contact portions 24 are disconnected from the bolometer line contact portions 42.

On the other hand, according to this preferred embodiment, the bolometer contact portions 24 and the bolometer line contact portions 42 are located on the free end of the heat sensing section 13 and there is no wiring on the fixed end of the heat sensing section 13, i.e., in the heat sensor supporting portion 191. As a result, the quantity of heat escaping from the heat sensing section 13 toward the substrate portion 11 can be reduced while the bolometer contact portions 24 are disconnected from the bolometer line contact portions 42. Consequently, the infrared responsivity can be increased.

Next, it will be described how the heat will escape from the heat sensing section 13 toward the substrate portion 11 in a situation where the bolometer contact portions 24 are connected to the bolometer line contact portions 42. The heat may escape as a radiation from the heat sensing section 13, due to the convection of a gas surrounding the heat sensing section 13, or by being conducted through the heat sensor supporting portion 191. For the same reason as that mentioned above, to increase the sensitivity of the infrared sensor by reducing the quantity of heat escaping from the heat sensing section 13 to the substrate portion 11 in a situation where the bolometer contact portions 24 are connected to the bolometer line contact portions 42, the quantity of the heat escaping by being conducted through the portion of contact between the heat sensing section 13 and the cavity wall portion 12 needs to be reduced.

As described above, the heat can be conducted through the wiring much more easily than the other portions. That is why the smaller the portion of wiring located in the region of contact between the heat sensing section 13 and the cavity wall portion 12, the better. In a resistance changing type or pyroelectric infrared sensor or in a thermopile type infrared sensor, however, the infrared sensing section and the detector circuit section need to be electrically connected together to detect a variation in a physical property of the infrared sensing section caused by a variation in the temperature of the heat sensing section. The infrared sensing section and the detector circuit section may be electrically connected together in either an AC pattern or a DC pattern. To detect the variation easily and consistently, however, a DC pattern is preferably adopted. In that case, the infrared sensing section and the detector circuit section need to be electrically connected together through wiring. To form an electric circuit between the heat sensing section 13 and the detector circuit section, at least two electric lines need to be present between the heat sensing section 13 and the detector circuit section.

As discussed above, to reduce the quantity of heat escaping from the heat sensing section 13 toward the substrate portion 11 in a situation where the bolometer contact portions 24 are connected to the bolometer line contact portions 42, the heat sensing section 13 and the detector circuit section are preferably electrically connected together with a plurality of (preferably, two) electric lines.

According to this preferred embodiment, two bolometer contact portions 24 are arranged on the free end of the heat sensing section 13 and two bolometer line contact portions 42 are arranged on the cavity wall portion 12 as described above. Since the heat sensing section 13 and the detector circuit section are connected together with two lines in a situation where the bolometer contact portions 24 are connected to the bolometer line contact portions 42, the quantity of heat escaping from the heat sensing section 13 toward the substrate portion 11 in such a state can be minimized and the infrared responsivity can be increased as a result.

As described above, according to this preferred embodiment, the heat sensing section can be deformed just like a cantilever with one end fixed as in the fourth preferred embodiment described above. As a result, the position of the heat sensing section can be controlled easily and with good stability. Also, in this preferred embodiment, the bolometer contact portions 24 and the bolometer line contact portions 42 are located on the free end of the heat sensing section, and the heat sensing section 13 has no wiring on its fixed end (i.e., in the heat sensor supporting portion 191). That is why when the bolometer contact portions 24 and the bolometer line contact portions 42 are disconnected from each other, a smaller quantity of heat would escape from the heat sensing section 13 toward the substrate portion 11 and the infrared responsivity can be increased. In addition, according to this preferred embodiment, when the bolometer contact portions 24 and the bolometer line contact portions 42 are connected to each other, the heat sensing section 13 and the detector circuit section are connected together through two lines. For that reason, the quantity of heat escaping from the heat sensing section 13 into the substrate portion 11 in such a state can be minimized and the infrared responsivity can be further increased.

Embodiment 7

Hereinafter, a seventh preferred embodiment of an electronic device according to the present invention will be described.

Figure 32:
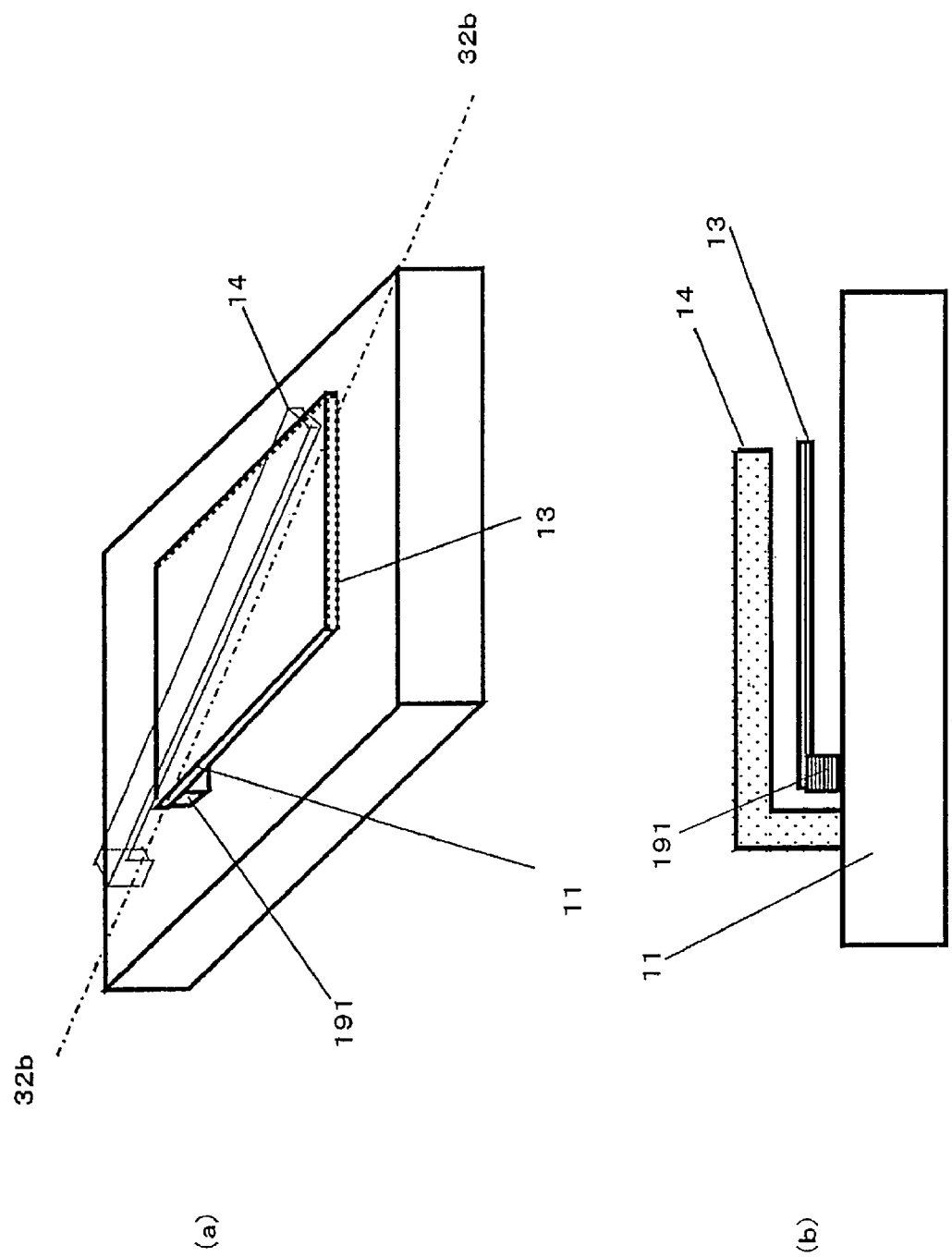
FIG. 32 illustrates a schematic configuration for an electronic device according to a seventh preferred embodiment of the present invention.

As shown in FIG. 32, the electronic device of this preferred embodiment includes a substrate portion 11, a heat sensing section 13, and a contact supporting member 14, which is arranged on the surface of the substrate portion 11 so as to overlap with the heat sensing section 13. FIG. 32(a) is a perspective view of the electronic device, and FIG. 32(b) is a cross-sectional view as viewed on the plane 32b-32b shown in FIG. 32(a). In this preferred embodiment, a heat sensor supporting portion 191, which is a part of the heat sensing section 13, is always in contact with, and fixed on, the substrate portion 11, and a part of the contact supporting member 14 is also always in contact with, and fixed on, the substrate portion 11. The contact supporting member 14 has elasticity that is high enough to deform itself. And one free end of the contact supporting member 14 alternately comes into contact with, and out of contact with, the heat sensing section 13. That is to say, that end of the contact supporting member 14 repeatedly changes its states between the "in contact" and "out of contact" states with respect to the heat sensing section 13. Specifically, electric charge is produced in the contact supporting member 14 by electrostatic induction, and the contact supporting member 14 is deformed by electrostatic force on this electric charge, thereby making the contact supporting member 14 come into, and out of, contact with the heat sensing section 13 as described above.

It should be noted that even if the contact supporting member 14 is deformed just partially, the contact supporting member 14 may also be regarded as having changed its positions.

Figure 33:
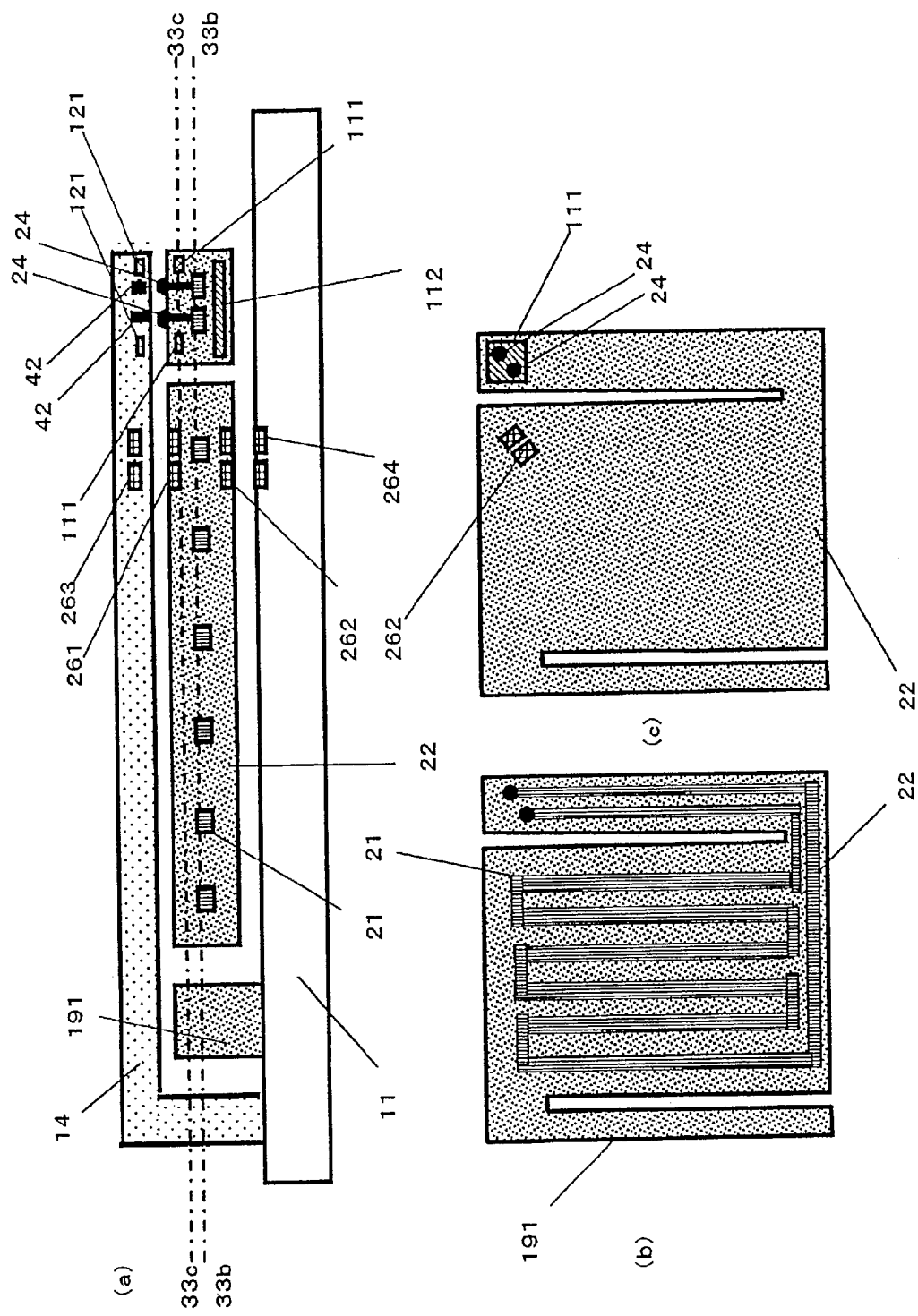
FIG. 33 illustrates a configuration for a heat sensing section and a contact supporting member according to the seventh preferred embodiment of the present invention.

Hereinafter, the configurations of the heat sensing section 13, the substrate portion 11 and the contact supporting member 14 of this preferred embodiment will be described. Look at FIG. 33 first. FIG. 33(a) is a cross-sectional view as viewed on the plane 32b-32b shown in FIG. 32(a), illustrating the configurations of the heat sensing section 13 and the contact supporting member 14 in detail. FIG. 33(b) is a cross-sectional view as viewed on the plane 33b-33b shown in FIG. 33(a) and FIG. 33(c) is a cross-sectional view as viewed on the plane 33c-33c shown in FIG. 33(a).

As in the sixth preferred embodiment described above, the heat sensing section 13 also includes a bolometer portion 21, a bolometer protective coating 22, charge storage portions 23, bolometer contact portions 24, an upper electrostatic induction electrode portion 111, a lower electrostatic induction electrode portion 112, an upper position detecting electrode portion 261 and a lower position detecting electrode portion 262. A part of the contact supporting member 14 is fixed on the substrate portion 11 such that the contact supporting member 14 functions just like a cantilever. The free end of the contact supporting member 14 tilts on its fixed end as an axis. The heat sensor supporting portion 191, which is a part of the heat sensing section 13, is fixed on the substrate portion 11. If the heat sensing section 13 is made of a material with elasticity, the heat sensing section 13 operates just like a cantilever and its free end tilts on its fixed end as an axis. On the other hand, if the heat sensing section 13 is made of a material with high rigidity, the heat sensing section 13 keeps substantially the same shape.

The bolometer contact portions 24, the upper electrostatic induction electrode portion 111, the lower electrostatic induction electrode portion 112, the upper position detecting electrode portion 261 and the lower position detecting electrode portion 262 are all located on the free end of the heat sensing section 13 as shown in FIG. 33(c). As in the sixth preferred embodiment described above, two bolometer contact portions 24 are arranged at the free end and the heat sensor supporting portion 191, which is a part of the heat sensing section 13 and which is located on its fixed end, includes no wiring.

In this preferred embodiment, since the heat sensing section 13 is deformable just like a cantilever with one end thereof fixed as in the fourth and sixth preferred embodiments, its position can be controlled easily and with good stability.

Also, in this preferred embodiment, the bolometer contact portions 24 are arranged on the free end of the heat sensing section 13, the bolometer line contact portions 42 are arranged on the free end of the contact supporting member 14, and the heat sensing section has no wiring on its fixed end as in the sixth preferred embodiment described above. That is why when the bolometer contact portions 24 and the bolometer line contact portions 42 are disconnected from each other, a smaller quantity of heat would escape from the heat sensing section toward the substrate and the infrared responsivity can be increased. In addition, according to this preferred embodiment, when the bolometer contact portions 24 and the bolometer line contact portions 42 are connected to each other, the heat sensing section 13 and the detector circuit section are connected together through two lines. For that reason, the quantity of heat escaping from the heat sensing section 13 into the substrate portion 11 in such a state can be minimized and the infrared responsivity can be further increased.

According to this preferred embodiment, as the free end of the contact supporting member 14 repeatedly changes its states between the "in contact" and "out of contact" states with respect to the heat sensing section 13, the contact supporting member 14 is deformed, and the heat sensing section 13 does not have to be deformed so much. As a result, detection errors, which could occur due to a variation in the electrical resistance of the bolometer portion 21 when the heat sensing section 13 is deformed, can be minimized. Furthermore, according to this preferred embodiment, the contact supporting member 14, which has a smaller mass than the heat sensing section 13, is deformed, and therefore, its states can be changed more quickly. As a result, if a one- or two-dimensional array of cells (which will be simply referred to herein as a "cell array") arranged on the same substrate is used, the operation of reading data sequentially from the cell array can be done quickly.

Figure 36:
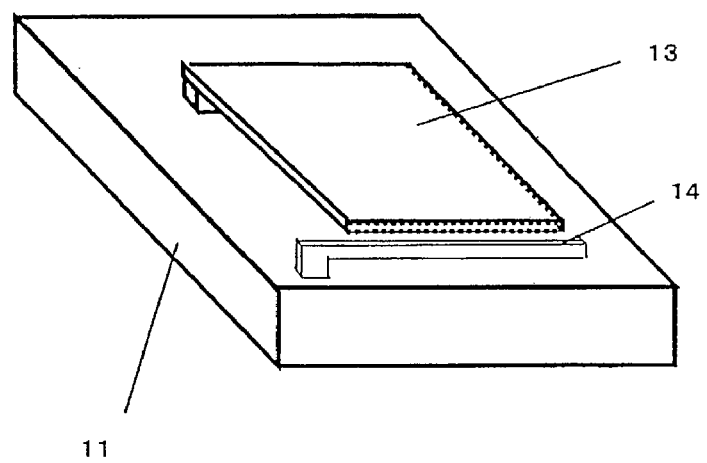
FIG. 36 illustrates an exemplary configuration according to another preferred embodiment of the present invention.

In the preferred embodiment described above, the contact supporting member 14 is located over the heat sensing section 13. However, the heat sensing section 13 and the contact supporting member 14 may be arranged differently. In the arrangement shown in FIG. 36, for example, the heat sensing section 13 and the contact supporting member 14 are arranged side by side. In that case, by moving its free end horizontally, the contact supporting member 14 alternately comes into, and out of, contact with the heat sensing section 13.

Embodiment 8

Hereinafter, an eighth preferred embodiment of an electronic device according to the present invention will be described.

Figure 34:
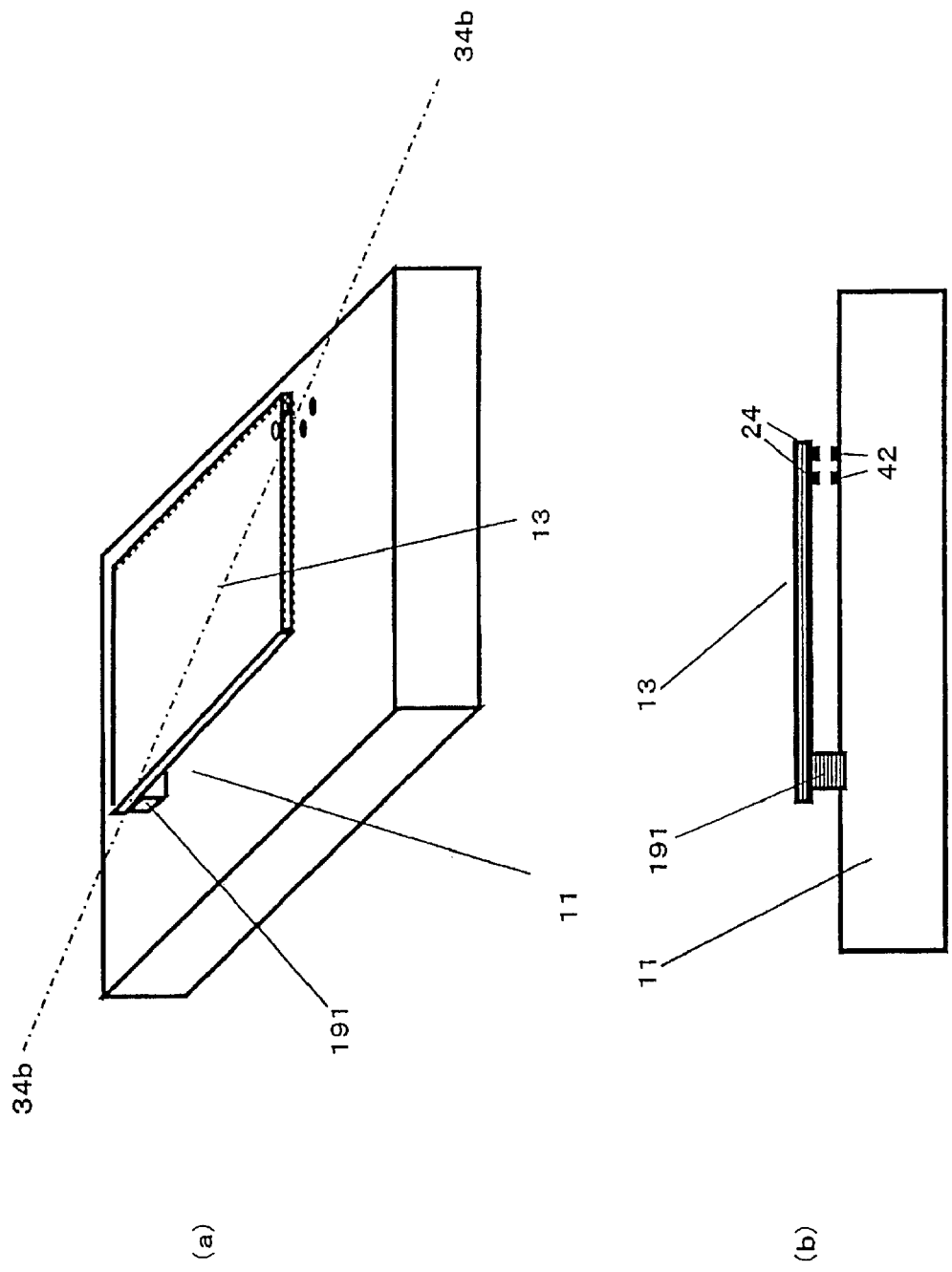
FIG. 34 illustrates a schematic configuration for an electronic device according to an eighth preferred embodiment of the present invention.

As shown in FIG. 34, the electronic device of this preferred embodiment includes a substrate portion 11, a heat sensing section 13, bolometer line contact portions 42 arranged on the surface of the substrate portion 11, and bolometer contact portions 24 arranged on the lower surface of the heat sensing section 13. FIG. 34(a) is a perspective view of the electronic device, and FIG. 34(b) is a cross-sectional view as viewed on the plane 34b-34b shown in FIG. 34(a). In this preferred embodiment, a heat sensor supporting portion 191, which is a part of the heat sensing section 13, is always in contact with, and fixed on, the substrate portion 11. The heat sensing section 13 has elasticity that is high enough to deform itself. And the bolometer contact portions 24 arranged on the lower surface of the free end of the heat sensing section 13 alternately come into contact with, and out of contact with, the bolometer line contact portions 42 arranged on the surface of the substrate portion 11. That is to say, the bolometer contact portions 24 repeatedly change their states between the "in contact" and "out of contact" states with respect to the bolometer line contact portions 42. Specifically, electric charge is produced in the heat sensing section 13 by electrostatic induction, and the heat sensing section 13 is deformed by electrostatic force on this electric charge, thereby making the bolometer contact portions 24 come into, and out of, contact with the bolometer line contact portions 42 as described above.

In this preferred embodiment, since the heat sensing section 13 is deformable just like a cantilever with one end thereof fixed as in the fourth, sixth and seventh preferred embodiments described above, its position can be controlled easily and with good stability.

Also, in this preferred embodiment, the bolometer contact portions 24 are arranged on the free end of the heat sensing section 13, the bolometer line contact portions 42 are arranged on the substrate portion 11, and the heat sensing section has no wiring on its fixed end as in the sixth and seventh preferred embodiments described above. That is why when the bolometer contact portions 24 and the bolometer line contact portions 42 are disconnected from each other, a smaller quantity of heat would escape from the heat sensing section toward the substrate portion 11 and the infrared responsivity can be increased. In addition, according to this preferred embodiment, when the bolometer contact portions 24 and the bolometer line contact portions 42 are connected to each other, the heat sensing section 13 and the detector circuit section are connected together through two lines. For that reason, the quantity of heat escaping from the heat sensing section 13 into the substrate portion 11 in such a state can be minimized and the infrared responsivity can be further increased.

As the bolometer line contact portions 42 are arranged on the substrate portion 11 according to this preferred embodiment, the sensor of this preferred embodiment has a simple structure and can be fabricated easily. Besides, since there is no cavity wall portion or contact supporting member over the heat sensing section 13, the incoming infrared rays are not cut off, and can be detected with high sensitivity.

Figure 35:
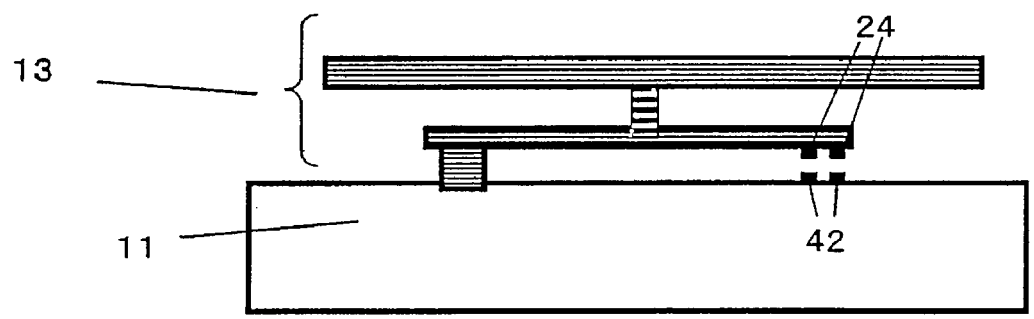
FIG. 35 illustrates a configuration for a heat sensing section with a multilayer structure.

In any of the preferred embodiments of the present invention described above, the heat sensing section 13 has a single layer structure. However, as shown in FIG. 35, the heat sensing section 13 may also have a multilayer structure (e.g., a two-layer structure in FIG. 35). In the example shown in FIG. 35, the upper layer of the heat sensing section 13 absorbs an incoming infrared ray, while the lower layer of the heat sensing section 13 senses a variation in temperature caused by the absorption of the infrared ray.

As described above, the heat sensing section 13 has a roughly rectangular shape on a plan view. But the bolometer contact portions 24 are arranged on the elongated branch portions extending from the body of the heat sensing section 13. Such a branch structure is adopted in order to minimize the outflow of the heat from the heat sensing section 13 to the cavity wall portion 12, the contact supporting member 14 or the substrate portion 13 by decreasing the thermal conductivity. Also, if the two-layer structure just mentioned is adopted for the heat sensing section, an infrared ray that has been incident on the heat sensing section 13 through the gap between the branch portions and the body thereof can also be absorbed. As a result, the infrared responsivity can be increased.

As already described with respect to various preferred embodiments, the electronic device of the present invention can increase the heat insulation of the heat sensing section and can also make the temperature of the heat sensing section vary more significantly responsive to an incoming infrared ray, thus increasing the infrared responsivity. In addition, by moving the heat sensing section entirely and separating the heat sensing section perfectly from the other portions of electronic device before a signal is read from the heat sensing section, the heat insulation and the sensitivity can be increased by leaps and bounds compared to conventional infrared sensors. As a result, the sensor portion may have a reduced size and the number of pixels of an infrared image sensor can be increased, too.

An electronic device according to the present invention can be used effectively as an infrared image sensor with high sensitivity.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. An electronic device comprising:
   at least one heat sensing section, which includes a first contact portion and of which a physical property varies responsive to an incoming infrared ray;
   a detector circuit section, which includes a second contact portion and which senses the variation in the physical property of the heat sensing section; and
   a driving section, which is able to change a first state, in which the first and second contact portions are in contact with each other and electrically connected to each other, into a second state, in which the first and second contact portions are out of contact with each other and electrically disconnected from each other, and vice versa.

2. The electronic device of claim 1, comprising:
   a cavity wall portion that defines a cavity housing the heat sensing section inside; and
   a substrate portion for supporting the cavity wall portion thereon,
   wherein the driving section changes the positions of the heat sensing section inside the cavity.

3. The electronic device of claim 1, comprising a substrate portion including at least a part of the detector circuit section,
   wherein the detector circuit section includes a contact supporting member that is fixed on the substrate portion, and
   wherein the second contact portion is arranged on the surface of the contact supporting member, and
   wherein in the first state, the second contact portion on the contact supporting member is in contact with the first contact portion of the heat sensing section, and
   wherein in the second state, the second contact portion on the contact supporting member is out of contact with the first contact portion of the heat sensing section.

4. The electronic device of claim 3, wherein at least a part of the contact supporting member changes its positions between the first and second states.

5. The electronic device of claim 3, wherein the driving section includes an electrode or a coil, which is arranged on the substrate portion, the cavity wall portion or the contact supporting member, and is able to exert non-contact force on the heat sensing section.

6. The electronic device of claim 5, wherein the non-contact force is electrostatic force.

7. The electronic device of claim 6, comprising means for producing electric charge in the heat sensing section by electrostatic induction.

8. The electronic device of claim 6, wherein the heat sensing section includes a charge storage portion to store the electric charge.

9. The electronic device of claim 8, wherein the driving section drives the heat sensing section, which is negatively charged, by repulsive force.

10. The electronic device of claim 6, wherein the heat sensing section includes a ferroelectric material, and
    wherein the electrostatic force between the electric charge that has been produced in the substrate, the cavity wall portion or the contact supporting member and polarized charge produced in the ferroelectric material is the non-contact force.

11. The electronic device of claim 5, wherein the non-contact force is electromagnetic force.

12. The electronic device of claim 1, wherein the second contact portion is arranged on an inner wall of the cavity wall portion, and
    wherein in the first state, the second contact portion on the cavity wall portion is in contact with the first contact portion of the heat sensing section, and
    wherein in the second state, the second contact portion on the cavity wall portion is out of contact with the first contact portion of the heat sensing section.

13. The electronic device of claim 1, comprising a substrate portion including at least a part of the detector circuit section,
    wherein the second contact portion is arranged on the surface of the substrate portion, and wherein in the first state, the second contact portion on the substrate portion is in contact with the first contact portion of the heat sensing section, and wherein in the second state, the second contact portion on the substrate portion is out of contact with the first contact portion of the heat sensing section.

14. The electronic device of claim 1, wherein at least a part of the heat sensing section changes its positions between the first and second states.

15. The electronic device of claim 1, wherein in the second state, the driving section moves the heat sensing section to a region where the heat sensing section makes no contact with any other portion of the electronic device.

16. The electronic device of claim 1, wherein in the second state, the heat sensing section is floating in the cavity.

17. The electronic device of claim 1, comprising a substrate portion,
wherein the heat sensing section includes a heat sensor supporting portion, and
wherein in both of the first and second states, the heat sensing section is connected to the substrate portion with the heat sensor supporting portion.

18. The electronic device of claim 17, wherein the heat sensor supporting portion has no wiring portion for electrically connecting the heat sensing section to the detector circuit section, and
wherein the first contact portion includes a plurality of contacts that are arranged on the surface of the heat sensing section.

19. The electronic device of claim 18, wherein the second contact portion includes a plurality of contacts that are arranged on the surface of the substrate portion, and
wherein in the first state, the contacts on the substrate portion are in contact with the contacts on the heat sensing section, and
wherein in the second state, the contacts on the substrate portion are out of contact with the contacts on the heat sensing section.

20. The electronic device of claim 18, comprising a contact supporting member on the substrate portion,
wherein the second contact portion includes a plurality of contacts that are arranged on the surface of the contact supporting member, and
wherein in the first state, the contacts of the contact supporting member are in contact with the contacts on the heat sensing section, and
wherein in the second state, the contacts of the contact supporting member are out of contact with the contacts on the heat sensing section.

21. The electronic device of claim 18, comprising a cavity wall portion, which is supported on the substrate portion and which defines a cavity housing the heat sensing section inside,
wherein the second contact portion includes a plurality of contacts that are arranged on an inner wall of the cavity wall portion, and
wherein in the first state, the contacts on the cavity wall portion are in contact with the contacts on the heat sensing section, and wherein in the second state, the contacts on the cavity wall portion are out of contact with the contacts on the heat sensing section.

22. The electronic device of claim 1, wherein the heat sensing section includes an infrared sensing portion, of which the electrical resistance has temperature dependence.

23. The electronic device of claim 22, wherein when electrically connected to the infrared sensing portion of the heat sensing section, the detector circuit section detects the intensity of the incoming infrared ray based on the electrical resistance of the infrared sensing portion.

24. The electronic device of claim 1, wherein the heat sensing section includes an infrared sensing portion that is made of a material with a thermoelectric effect.

25. The electronic device of claim 1, wherein the heat sensing section includes an infrared sensing portion that is made of a material with a pyroelectric effect.

26. The electronic device of claim 1, wherein the heat sensing section includes an infrared sensing portion, of which the dielectric constant changes with temperatures.

27. The electronic device of claim 1, wherein there is a gap between the heat sensing section and the substrate even in the first state.

28. The electronic device of claim 1, wherein environment surrounding the heat sensing section is shut off from the air and is either a vacuum or a reduced-pressure atmosphere.

29. A method for driving an electronic device, the electronic device including:
at least one heat sensing section, which includes a first contact portion and of which a physical property varies responsive to an incoming infrared ray;
a detector circuit section, which includes a second contact portion and which senses the variation in the physical property of the heat sensing section; and
a driving section, which is able to change a first state, in which the first and second contact portions are in contact with each other and electrically connected to each other, into a second state, in which the first and second contact portions are out of contact with each other and electrically disconnected from each other, and vice versa, and
the method comprising the steps of:
(A) irradiating the heat sensing section with an infrared ray;
(B) connecting the heat sensing section to the detector circuit section in the first state to detect a variation in a physical property of the heat sensing section; and
(C) changing the positions of the heat sensing section to switch its states from the first state into the second state.

30. The method of claim 29, comprising the step of repeatedly performing the steps (A), (B) and (C) periodically.

31. The method of claim 29, wherein the at least one heat sensing section includes a plurality of heat sensing sections that are arranged in columns and rows, and
wherein the steps (A), (B) and (C) are performed at different timings on either a row-by-row basis or a column-by-column basis.

32. The method of claim 29, wherein the heat sensing section is connected in the first state to the detector circuit section for a duration of 1 μsec to 10 msec.

* * * * *